US012777565B2

(12) United States Patent
Watabe et al.

(10) Patent No.: US 12,777,565 B2
(45) Date of Patent: Oct. 27, 2026

(54) LIGHT-EMITTING APPARATUS, ELECTRONIC DEVICE, AND LIGHTING DEVICE

(71) Applicant: SEMICONDUCTOR ENERGY LABORATORY CO., LTD., Atsugi (JP)

(72) Inventors: Takeyoshi Watabe, Atsugi (JP); Airi Ueda, Zama (JP); Yuta Kawano, Yokohama (JP); Tomohiro Kubota, Atsugi (JP); Nobuharu Ohsawa, Zama (JP); Satoshi Seo, Sagamihara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 842 days.

(21) Appl. No.: 18/247,672

(22) PCT Filed: Sep. 27, 2021

(86) PCT No.: PCT/IB2021/058766

§ 371 (c)(1),
(2) Date: Apr. 3, 2023

(87) PCT Pub. No.: WO2022/074499

PCT Pub. Date: Apr. 14, 2022

(65) Prior Publication Data

US 2024/0049578 A1 Feb. 8, 2024

(30) Foreign Application Priority Data

Oct. 9, 2020 (JP) ................................ 2020-171450

(51) Int. Cl.

| | |
|---|---|
| ***H01L 51/54*** | (2006.01) |
| ***H05B 33/02*** | (2006.01) |
| ***H05B 33/10*** | (2006.01) |
| ***H05B 33/12*** | (2006.01) |
| ***H05B 33/22*** | (2006.01) |
| ***H10K 59/38*** | (2023.01) |
| ***H10K 59/80*** | (2023.01) |
| *G02B 5/20* | (2006.01) |
| *H10K 50/15* | (2023.01) |
| *H10K 50/16* | (2023.01) |
| *H10K 59/90* | (2023.01) |
| *H10K 85/60* | (2023.01) |

(52) U.S. Cl.
CPC ............ *H05B 33/12* (2013.01); *H05B 33/02* (2013.01); *H05B 33/10* (2013.01); *H05B 33/22* (2013.01); *H10K 59/38* (2023.02); *H10K 59/879* (2023.02); *G02B 5/201* (2013.01); *H10K 50/15* (2023.02); *H10K 50/16* (2023.02); *H10K 59/876* (2023.02); *H10K 59/90* (2023.02); *H10K 85/615* (2023.02); *H10K 85/633* (2023.02); *H10K 85/654* (2023.02); *H10K 85/6572* (2023.02)

(58) Field of Classification Search
None
See application file for complete search history.

(56) References Cited

U.S. PATENT DOCUMENTS

| | | | |
|---|---|---|---|
| 7,030,555 | B2 | 4/2006 | Nakamura et al. |
| 8,963,143 | B2 | 2/2015 | Loebl et al. |
| 9,818,984 | B2 | 11/2017 | Mizuno |
| 10,950,805 | B2 | 3/2021 | Watabe et al. |
| 11,355,734 | B2 | 6/2022 | Abe et al. |
| 11,482,687 | B2 | 10/2022 | Yamazaki et al. |
| 2004/0212296 | A1 | 10/2004 | Nakamura et al. |
| 2012/0162573 | A1 | 6/2012 | Takahashi et al. |
| 2013/0285027 | A1 | 10/2013 | Loebl et al. |
| 2018/0337352 | A1 | 11/2018 | Furno et al. |
| 2020/0119101 | A1 | 4/2020 | Lee |
| 2020/0176715 | A1 | 6/2020 | Abe et al. |
| 2021/0005814 | A1 | 1/2021 | Watabe et al. |
| 2021/0336176 | A1 | 10/2021 | Kawano et al. |

(Continued)

FOREIGN PATENT DOCUMENTS

| | | | |
|---|---|---|---|
| CN | 102483543 | A | 5/2012 |
| CN | 103180993 | A | 6/2013 |

(Continued)

OTHER PUBLICATIONS

Machine translation of JP2016-143658. (Year: 2016).*
Lee.J et al., "Synergetic electrode architecture for efficient graphene-based flexible organic light-emitting diodes", Nature Communications, Jun. 2, 2016, vol. 7, pp. 11791-1-11791-9.
International Search Report (Application No. PCT/IB2021/058766) Dated Nov. 22, 2021.
Written Opinion (Application No. PCT/IB2021/058766) Dated Nov. 22, 2021.

*Primary Examiner* — Andrew K Bohaty
(74) *Attorney, Agent, or Firm* — Fish & Richardson P.C.

(57) ABSTRACT

A light-emitting device with low power consumption is provided. The light-emitting apparatus including a first light-emitting device and a first color conversion layer. The first light-emitting device includes an anode, a cathode, and an EL layer between the anode and the cathode. The EL layer includes a layer including a material with an ordinary refractive index higher than or equal to 1.50 and lower than 1.75 with respect to light with a wavelength longer than or equal to 455 nm and shorter than or equal to 465 nm. The first color conversion layer includes a first substance that absorbs light and emits light. An ordinary refractive index of the first color conversion layer with respect to light with a wavelength longer than or equal to 455 nm and shorter than or equal to 465 nm is higher than or equal to 1.40 and lower than or equal to 2.10. The first color conversion layer is on an optical path of the light emitted from the first light-emitting device to an outside of the light-emitting apparatus.

38 Claims, 20 Drawing Sheets

(56) References Cited

U.S. PATENT DOCUMENTS

| | | | |
|---|---|---|---|
| 2022/0029121 | A1 | 1/2022 | Yamazaki et al. |
| 2023/0180501 | A1 | 6/2023 | Kawano et al. |

FOREIGN PATENT DOCUMENTS

| | | | |
|---|---|---|---|
| CN | 108933197 | A | 12/2018 |
| CN | 111033785 | A | 4/2020 |
| CN | 111048556 | A | 4/2020 |
| CN | 113227728 | A | 8/2021 |
| DE | 102017111137 | | 11/2018 |
| DE | 112019006355 | | 9/2021 |
| EP | 2474856 | A | 7/2012 |
| EP | 2638579 | B | 1/2018 |
| EP | 3637177 | A | 4/2020 |
| JP | 2004-311153 | A | 11/2004 |
| JP | 2008-034701 | A | 2/2008 |
| JP | 2008-108514 | A | 5/2008 |
| JP | 2011-054659 | A | 3/2011 |
| JP | 2014-502041 | | 1/2014 |
| JP | 2014-207356 | A | 10/2014 |
| JP | 2016-143658 | A | 8/2016 |
| KR | 2013-0132843 | A | 12/2013 |
| KR | 2018-0127936 | A | 11/2018 |
| KR | 2020-0039666 | A | 4/2020 |
| KR | 2020-0041044 | A | 4/2020 |
| KR | 2021-0106475 | A | 8/2021 |
| TW | 201207504 | | 2/2012 |
| TW | 202033054 | | 9/2020 |
| WO | WO-2011/024882 | | 3/2011 |
| WO | WO-2012/063171 | | 5/2012 |
| WO | WO-2019/039564 | | 2/2019 |
| WO | WO-2020/076044 | | 4/2020 |
| WO | WO-2020/128735 | | 6/2020 |

* cited by examiner

LIGHT-EMITTING APPARATUS, ELECTRONIC DEVICE, AND LIGHTING DEVICE

CROSS REFERENCE TO RELATED APPLICATIONS

This application is a U.S. National Phase Application under 35 U.S.C. § 371 of International Application PCT/IB2021/058766, filed on Sep. 27, 2021, which is incorporated by reference and claims the benefit of a foreign priority application filed in Japan on Oct. 9, 2020, as Application No. 2020-171450.

TECHNICAL FIELD

One embodiment of the present invention relates to an organic compound, a light-emitting element, a light-emitting device, a display module, a lighting module, a display device, a light-emitting apparatus, an electronic device, a lighting device, and an electronic device. Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting apparatus, a lighting device, a power storage device, a memory device, an imaging device, a driving method thereof, and a manufacturing method thereof.

BACKGROUND ART

Light-emitting devices (organic EL devices) including organic compounds and utilizing electroluminescence (EL) have been put to more practical use. In the basic structure of such light-emitting devices, an organic compound layer containing a light-emitting material (an EL layer) is sandwiched between a pair of electrodes. Carriers are injected by application of a voltage to the device, and recombination energy of the carriers is used, whereby light emission can be obtained from the light-emitting material.

Such light-emitting devices are of self-light-emitting type and thus have advantages over displays using liquid crystal, such as high visibility and no need for backlight when used as pixels of a display, and are suitable as flat panel display devices. Moreover, such light-emitting devices also have a feature that the response speed is extremely fast.

Since light-emitting layers of such light-emitting devices can be successively formed two-dimensionally, planar light emission can be achieved. This feature is difficult to realize with point light sources typified by incandescent lamps and LEDs or linear light sources typified by fluorescent lamps; thus, the light-emitting devices also have great potential as planar light sources, which can be applied to lighting and the like.

Displays or lighting devices including light-emitting devices are suitable for a variety of electronic devices as described above, and research and development of light-emitting devices has progressed for more favorable characteristics.

Low outcoupling efficiency is often a problem in an organic EL device. In order to improve the outcoupling efficiency, a structure including a layer formed using a low refractive index material in an EL layer (see Patent Document 1 and Non-Patent Document 1, for example) has been proposed.

A light-emitting device having such a structure can have higher outcoupling efficiency and higher external quantum efficiency than a light-emitting device having a conventional structure, however, it is not easy to form a layer with a low refractive index in an EL layer without adversely affecting other critical characteristics of the light-emitting device. This is because a low refractive index is in a trade-off relationship with a high carrier-transport property, high reliability, and the like. This problem is caused because the carrier-transport property, high reliability, and the like of an organic compound largely depend on an unsaturated bond, and an organic compound having many unsaturated bonds tends to have a high refractive index.

A color conversion method has been employed for practical use of displays. A color conversion method is a method in which a photoluminescent substance is irradiated with light from light-emitting devices to convert the light into light of desired colors. The energy loss and the power consumption of displays using a color conversion method are likely to be lower than those of displays using a color filter method in which light from light-emitting devices is simply reduced.

REFERENCES

Patent Document

[Patent Document 1] Japanese Published Patent Application No. 2014-207356

Non-Patent Document

[Non-Patent Document 1] Jaeho Lee and 12 others, "Synergetic electrode architecture for efficient graphene-based flexible organic light-emitting diodes", nature COMMUNICATIONS, Jun. 2, 2016, DOI: 10. 1038/ncomms 11791.

SUMMARY OF THE INVENTION

Problems to be Solved by the Invention

Thus, an object of one embodiment of the present invention is to provide a novel light-emitting apparatus. Another object is to provide a light-emitting apparatus with favorable emission efficiency. Another object is to provide a light-emitting apparatus with along lifetime. Another object is to provide a light-emitting apparatus with a low driving voltage. Another object is to provide a light-emitting apparatus with low power consumption.

An object of another embodiment of the present invention is to provide an electronic device or a display device having high reliability. An object of another embodiment of the present invention is to provide an electronic device or a display device having low power consumption.

It is only necessary that any one of the above-described objects be achieved in the present invention.

Means for Solving the Problems

An object of one embodiment of the present invention is to provide a light-emitting apparatus including a light-emitting device including a layer with a low refractive index and a color conversion layer with a given refractive index. Thus, alight-emitting apparatus having low power consumption can be obtained easily.

One embodiment of the present invention is a light-emitting apparatus including a first light-emitting device and a first color conversion layer. The first light-emitting device includes an anode, a cathode, and an EL layer positioned between the anode and the cathode. The EL layer includes a layer including a material with an ordinary refractive index higher than or equal to 1.50 and lower than 1.75 with respect to light with a wavelength longer than or equal to 455 nm and shorter than or equal to 465 nm. The first color conversion layer includes a first substance that absorbs light and emits light. An ordinary refractive index of the first color conversion layer with respect to light with a wavelength longer than or equal to 455 nm and shorter than or equal to 465 nm is higher than or equal to 1.40 and lower than or equal to 2.10. The first color conversion layer is positioned on an optical path of the light emitted from the first light-emitting device to an outside of the light-emitting apparatus.

Another embodiment of the present invention is a light-emitting apparatus including a first light-emitting device and a first color conversion layer. The first light-emitting device includes an anode, a cathode, and an EL layer positioned between the anode and the cathode. The EL layer includes alight-emitting layer and a hole-transport region. The hole-transport region is positioned between the light-emitting layer and the anode. The hole-transport region includes a layer including a hole-transport organic compound with an ordinary refractive index higher than or equal to 1.50 and lower than or equal to 1.75 with respect to light with a wavelength longer than or equal to 455 nm and shorter than or equal to 465 nm. The first color conversion layer includes a first substance that absorbs light and emits light. An ordinary refractive index of the first color conversion layer with respect to light with a wavelength longer than or equal to 455 nm and shorter than or equal to 465 nm is higher than or equal to 1.40 and lower than or equal to 2.10. The first color conversion layer is positioned on an optical path of the light emitted from the first light-emitting device to an outside of the light-emitting apparatus.

Another embodiment of the present invention is a light-emitting apparatus including a first light-emitting device and a first color conversion layer. The first light-emitting device includes an anode, a cathode, and an EL layer positioned between the anode and the cathode. The EL layer includes a light-emitting layer and an electron-transport region. The electron-transport region is positioned between the light-emitting layer and the cathode. The electron-transport region includes a layer including an electron-transport organic compound with an ordinary refractive index higher than or equal to 1.50 and lower than or equal to 1.75 with respect to light with a wavelength longer than or equal to 455 nm and shorter than or equal to 465 nm. The first color conversion layer includes a first substance that absorbs light and emits light. An ordinary refractive index of the first color conversion layer with respect to light with a wavelength longer than or equal to 455 nm and shorter than or equal to 465 nm is higher than or equal to 1.40 and lower than or equal to 2.10. The first color conversion layer is positioned on an optical path of the light emitted from the first light-emitting device to an outside of the light-emitting apparatus.

Another embodiment of the present invention is a light-emitting apparatus including a first light-emitting device and a first color conversion layer. The first light-emitting device includes an anode, a cathode, and an EL layer positioned between the anode and the cathode. The EL layer includes a hole-transport region, a light-emitting layer, and an electron-transport region. The hole-transport region is positioned between the anode and the light-emitting layer. The electron-transport region is positioned between the light-emitting layer and the cathode. The hole-transport region includes a layer including a hole-transport organic compound with an ordinary refractive index higher than or equal to 1.50 and lower than or equal to 1.75 with respect to light with a wavelength longer than or equal to 455 nm and shorter than or equal to 465 nm. The electron-transport region includes a layer including an electron-transport organic compound with an ordinary refractive index higher than or equal to 1.50 and lower than or equal to 1.75 with respect to light with a wavelength longer than or equal to 455 nm and shorter than or equal to 465 nm. The first color conversion layer includes a first substance that absorbs light and emits light. An ordinary refractive index of the first color conversion layer with respect to light with a wavelength longer than or equal to 455 nm and shorter than or equal to 465 nm is higher than or equal to 1.4 and lower than or equal to 2.1. The first color conversion layer is positioned on an optical path of the light emitted from the first light-emitting device to an outside of the light-emitting apparatus.

Another embodiment of the present invention is the light-emitting apparatus where, in the above-described structure, the ordinary refractive index of the first color conversion layer with respect to light with a wavelength longer than or equal to 455 nm and shorter than or equal to 465 nm is higher than or equal to 1.80 and lower than or equal to 2.00.

Another embodiment of the present invention is a light-emitting apparatus including a first light-emitting device and a first color conversion layer. The first light-emitting device includes an anode, a cathode, and an EL layer positioned between the anode and the cathode. The EL layer includes a layer including a material with an ordinary refractive index higher than or equal to 1.50 and lower than 1.75 with respect to light with a wavelength longer than or equal to 455 nm and shorter than or equal to 465 nm. The first color conversion layer includes a first substance that absorbs light and emits light and a resin. An ordinary refractive index of the resin with respect to light with a wavelength longer than or equal to 455 nm and shorter than or equal to 465 nm is higher than or equal to 1.40 and lower than or equal to 2.10. The first color conversion layer is positioned on an optical path of the light emitted from the first light-emitting device to an outside of the light-emitting apparatus.

Another embodiment of the present invention is a light-emitting apparatus including a first light-emitting device and a first color conversion layer. The first light-emitting device includes an anode, a cathode, and an EL layer positioned between the anode and the cathode. The EL layer includes alight-emitting layer and a hole-transport region. The hole-transport region is positioned between the light-emitting layer and the anode. The hole-transport region includes a layer including a hole-transport organic compound with an ordinary refractive index higher than or equal to 1.50 and lower than or equal to 1.75 with respect to light with a wavelength longer than or equal to 455 nm and shorter than or equal to 465 nm. The first color conversion layer includes a first substance that absorbs light and emits light and a resin. An ordinary refractive index of the resin with respect to light with a wavelength longer than or equal to 455 nm and shorter than or equal to 465 nm is higher than or equal to 1.40 and lower than or equal to 2.10. The first color conversion layer is positioned on an optical path of the light emitted from the first light-emitting device to an outside of the light-emitting apparatus.

Another embodiment of the present invention is a light-emitting apparatus including a first light-emitting device and a first color conversion layer. The first light-emitting device includes an anode, a cathode, and an EL layer positioned between the anode and the cathode. The EL layer includes a light-emitting layer and an electron-transport region. The electron-transport region is positioned between the light-emitting layer and the cathode. The electron-transport region includes a layer including an electron-transport organic compound with an ordinary refractive index higher than or equal to 1.50 and lower than or equal to 1.75 with respect to light with a wavelength longer than or equal to 455 nm and shorter than or equal to 465 nm. The first color conversion layer includes a first substance that absorbs light and emits light and a resin. An ordinary refractive index of the resin with respect to light with a wavelength longer than or equal to 455 nm and shorter than or equal to 465 nm is higher than or equal to 1.40 and lower than or equal to 2.10. The first color conversion layer is positioned on an optical path of the light emitted from the first light-emitting device to an outside of the light-emitting apparatus.

Another embodiment of the present invention is a light-emitting apparatus including a first light-emitting device and a first color conversion layer. The first light-emitting device includes an anode, a cathode, and an EL layer positioned between the anode and the cathode. The EL layer includes a hole-transport region, a light-emitting layer, and an electron-transport region. The hole-transport region is positioned between the anode and the light-emitting layer. The electron-transport region is positioned between the light-emitting layer and the cathode. The hole-transport region includes a layer including a hole-transport organic compound with an ordinary refractive index higher than or equal to 1.50 and lower than or equal to 1.75 with respect to light with a wavelength longer than or equal to 455 nm and shorter than or equal to 465 nm. The electron-transport region includes a layer including an electron-transport organic compound with an ordinary refractive index higher than or equal to 1.50 and lower than or equal to 1.75 with respect to light with a wavelength longer than or equal to 455 nm and shorter than or equal to 465 nm. The first color conversion layer includes a first substance that absorbs light and emits light and a resin. An ordinary refractive index of the resin with respect to light with a wavelength longer than or equal to 455 nm and shorter than or equal to 465 nm is higher than or equal to 1.40 and lower than or equal to 2.10. The first color conversion layer is positioned on an optical path of the light emitted from the first light-emitting device to an outside of the light-emitting apparatus.

Another embodiment of the present invention is the light-emitting apparatus where, in the above-described structure, the ordinary refractive index of the resin with respect to light with a wavelength longer than or equal to 455 nm and shorter than or equal to 465 nm is higher than or equal to 1.80 and lower than or equal to 2.00.

Another embodiment of the present invention is a light-emitting apparatus including a first light-emitting device and a first color conversion layer. A first layer including an organic compound is included between the first light-emitting device and the first color conversion layer. The first light-emitting device includes an anode, a cathode, and an EL layer positioned between the anode and the cathode. The EL layer includes a layer including a material with an ordinary refractive index higher than or equal to 1.50 and lower than 1.75 with respect to light with a wavelength longer than or equal to 455 nm and shorter than or equal to 465 nm. The first color conversion layer includes a first substance that absorbs light and emits light. An ordinary refractive index of the first layer with respect to light with a wavelength longer than or equal to 455 nm and shorter than or equal to 465 nm is higher than or equal to 1.40 and lower than or equal to 2.10. The first layer and the first color conversion layer are positioned on an optical path of the light emitted from the first light-emitting device to an outside of the light-emitting apparatus.

Another embodiment of the present invention is light-emitting apparatus including a first light-emitting device and a first color conversion layer. A first layer including an organic compound is included between the first light-emitting device and the first color conversion layer. The first light-emitting device includes an anode, a cathode, and an EL layer positioned between the anode and the cathode. The EL layer includes a light-emitting layer and a hole-transport region. The hole-transport region is positioned between the light-emitting layer and the anode. The hole-transport region includes a layer including a hole-transport organic compound with an ordinary refractive index higher than or equal to 1.50 and lower than or equal to 1.75 with respect to light with a wavelength longer than or equal to 455 nm and shorter than or equal to 465 nm. The first color conversion layer includes a first substance that absorbs light and emits light. An ordinary refractive index of the first layer with respect to light with a wavelength longer than or equal to 455 nm and shorter than or equal to 465 nm is higher than or equal to 1.40 and lower than or equal to 2.10. The first layer and the first color conversion layer are positioned on an optical path of the light emitted from the first light-emitting device to an outside of the light-emitting apparatus.

Another embodiment of the present invention is a light-emitting apparatus including a first light-emitting device and a first color conversion layer. A first layer including an organic compound is included between the first light-emitting device and the first color conversion layer. The first light-emitting device includes an anode, a cathode, and an EL layer positioned between the anode and the cathode. The EL layer includes a light-emitting layer and an electron-transport region. The electron-transport region is positioned between the light-emitting layer and the cathode. The electron-transport region includes a layer including an electron-transport organic compound with an ordinary refractive index higher than or equal to 1.50 and lower than or equal to 1.75 with respect to light with a wavelength longer than or equal to 455 nm and shorter than or equal to 465 nm. The first color conversion layer includes a first substance that absorbs light and emits light. An ordinary refractive index of the first layer with respect to light with a wavelength longer than or equal to 455 nm and shorter than or equal to 465 nm is higher than or equal to 1.40 and lower than or equal to 2.10. The first layer and the first color conversion layer are positioned on an optical path of the light emitted from the first light-emitting device to an outside of the light-emitting apparatus.

Another embodiment of the present invention is a light-emitting apparatus including a first light-emitting device and a first color conversion layer. A first layer including an organic compound is included between the first light-emitting device and the first color conversion layer. The first light-emitting device includes an anode, a cathode, and an EL layer positioned between the anode and the cathode. The EL layer includes a hole-transport region, a light-emitting layer, and an electron-transport region. The hole-transport region is positioned between the anode and the light-emitting layer. The electron-transport region is positioned between the light-emitting layer and the cathode. The hole-transport region includes a layer including a hole-transport organic compound with an ordinary refractive index higher than or equal to 1.50 and lower than or equal to 1.75 with respect to light with a wavelength longer than or equal to 455 nm and shorter than or equal to 465 nm. The electron-transport region includes a layer including an electron-transport organic compound with an ordinary refractive index higher than or equal to 1.50 and lower than or equal to 1.75 with respect to light with a wavelength longer than or equal to 455 nm and shorter than or equal to 465 nm. The first color conversion layer includes a first substance that absorbs light and emits light. An ordinary refractive index of the first layer with respect to light with a wavelength longer than or equal to 455 nm and shorter than or equal to 465 nm is higher than or equal to 1.40 and lower than or equal to 2.10. The first layer and the first color conversion layer are positioned on an optical path of the light emitted from the first light-emitting device to an outside of the light-emitting apparatus.

Another embodiment of the present invention is the light-emitting apparatus where, in the above-described structure, the ordinary refractive index of the first layer with respect to light with a wavelength longer than or equal to 455 nm and shorter than or equal to 465 nm is higher than or equal to 1.80 and lower than or equal to 2.00.

Another embodiment of the present invention is the light-emitting apparatus where, in the above-described structure, the hole-transport organic compound with an ordinary refractive index higher than or equal to 1.50 and lower than or equal to 1.75 with respect to light with a wavelength longer than or equal to 455 nm and shorter than or equal to 465 nm is a monoamine compound including a first aromatic ring, a second aromatic ring, and a third aromatic ring, the first aromatic ring, the second aromatic ring, and the third aromatic ring are bonded to a nitrogen atom of the monoamine compound, and carbon atoms forming a bond by sp3 hybrid orbitals account for a proportion greater than or equal to 23% and less than or equal to 55% of total carbon atoms in a molecule.

Another embodiment of the present invention is the light-emitting apparatus where, in the above-described structure, the electron-transport organic compound includes at least one six-membered heteroaromatic ring with 1 to 3 nitrogen atoms, a plurality of aromatic hydrocarbon rings each of which has 6 to 14 carbon atoms forming a ring and at least two of which are benzene rings, and a plurality of hydrocarbon groups forming a bond by sp3 hybrid orbitals.

Another embodiment of the present invention is the light-emitting apparatus where, in the above-described structure, in the electron-transport region, the layer including an electron-transport organic compound with an ordinary refractive index higher than or equal to 1.50 and lower than or equal to 1.75 further includes a fluoride of an alkali metal or a fluoride of an alkaline earth metal.

Another embodiment of the present invention is the light-emitting apparatus where, in the above-described structure, the hole-transport organic compound with an ordinary refractive index higher than or equal to 1.50 and lower than or equal to 1.75 with respect to light with a wavelength longer than or equal to 455 nm and shorter than or equal to 465 nm is a monoamine compound including a first aromatic ring, a second aromatic ring, and a third aromatic ring, the first aromatic ring, the second aromatic ring, and the third aromatic ring are bonded to a nitrogen atom of the monoamine compound, and carbon atoms forming a bond by sp3 hybrid orbitals account for a proportion greater than or equal to 23% and less than or equal to 55% of total carbon atoms in a molecule. The electron-transport organic compound with an ordinary refractive index higher than or equal to 1.50 and lower than or equal to 1.75 with respect to light with a wavelength longer than or equal to 455 nm and shorter than or equal to 465 nm includes at least one six-membered heteroaromatic ring with 1 to 3 nitrogen atoms, a plurality of aromatic hydrocarbon rings each of which has 6 to 14 carbon atoms forming a ring and at least two of which are benzene rings, and a plurality of hydrocarbon groups forming a bond by sp3 hybrid orbitals.

Another embodiment of the present invention is the light-emitting apparatus where, in the above-described structure, carbon atoms forming the bond by the sp3 hybrid orbitals account for a proportion greater than or equal to 10% and lower than or equal to 60% of carbon atoms in a molecule of the electron-transport organic compound.

Another embodiment of the present invention is the light-emitting apparatus where, in the above-described structure, the first substance is a quantum dot.

Another embodiment of the present invention is a light-emitting apparatus where, in the above-described structure, the first light-emitting device includes a microcavity structure.

Another embodiment of the present invention is the light-emitting apparatus, in the above-described structure, further including a second light-emitting device, a third light-emitting device, and a second color conversion layer. The second light-emitting device and the third light-emitting device each include a structure that is the same as a structure of the first light-emitting device. The second color conversion layer includes a second substance that absorbs light and emits light. A peak wavelength of an emission spectrum of the first substance is different from a peak wavelength of an emission spectrum of the second substance. The second color conversion layer is positioned on an optical path of the light emitted from the second light-emitting device to the outside of the light-emitting apparatus.

Another embodiment of the present invention is the light-emitting apparatus where, in the above-described structure, the second substance is a quantum dot.

Another embodiment of the present invention is the light-emitting apparatus where, in the above-described structure, the peak wavelength of the emission spectrum of the first substance is higher than or equal to 500 nm and lower than or equal to 600 nm. The peak wavelength of the emission spectrum of the second substance is higher than or equal to 600 nm and lower than or equal to 750 nm.

Another embodiment of the present invention is the light-emitting apparatus, in the above-described structure, further including a fourth light-emitting device and a third color conversion layer. The fourth light-emitting device includes a structure that is the same as a structure of the first light-emitting device. The third color conversion layer includes a third substance that absorbs light and emits light. A peak wavelength of an emission spectrum of the third substance is higher than or equal to 560 nm and lower than or equal to 610 nm. The third color conversion layer is positioned on an optical path of the light emitted from the fourth light-emitting device to the outside of the light-emitting apparatus.

Another embodiment of the present invention is the light-emitting apparatus where, in the above-described structure, the third substance includes a rare earth element.

Another embodiment of the present invention is the light-emitting apparatus where, in the above-described structure, the rare earth element is at least one of europium, cerium, and yttrium.

Another embodiment of the present invention is the light-emitting apparatus where, in the above-described structure, the third substance is a quantum dot.

Another embodiment of the present invention is the light-emitting apparatus where, in the above-described structure, the emission spectrum obtained from the third color conversion layer includes two peaks.

Another embodiment of the present invention is the light-emitting apparatus where, in the above-described structure, light emission obtained from the third color conversion layer is white light emission.

Another embodiment of the present invention is the light-emitting apparatus where, in the above-described structure, the EL layer includes a plurality of light-emitting layers.

Another embodiment of the present invention is the light-emitting apparatus, in the above-described structure, further including a charge-generation layer between the plurality of light-emitting layers.

Another embodiment of the present invention is the light-emitting apparatus where, in the above-described structure, the first light-emitting device exhibits blue light emission.

Another embodiment of the present invention is the light-emitting apparatus, in the above-described structure, further including a color filter. The first color conversion layer is positioned between the first light-emitting device and the color filter.

Another embodiment of the present invention is an electronic device including the above light-emitting device, and a sensor, an operation button, a speaker, or a microphone.

Another embodiment of the present invention is a light-emitting apparatus including any of the above light-emitting device, and a transistor or a substrate.

Another embodiment of the present invention is a lighting device including the above light-emitting device and a housing.

Another embodiment of the present invention is an electronic device including any of the above-described light-emitting devices, a sensor, an operation button, and a speaker or a microphone.

Another embodiment of the present invention is a light-emitting apparatus including any of the above-described light-emitting devices, and a transistor or a substrate.

Another embodiment of the present invention is a lighting device including any of the above-described light-emitting devices and a housing.

Note that the light-emitting apparatus in this specification includes, in its category, an image display device that uses a light-emitting device. The light-emitting apparatus may also include a module in which a light-emitting device is provided with a connector such as an anisotropic conductive film or a TCP (Tape Carrier Package), a module in which a printed wiring board is provided at the end of a TCP, and a module in which an IC (integrated circuit) is directly mounted on a light-emitting device by a COG (Chip On Glass) method. Furthermore, a lighting device or the like may include the light-emitting apparatus.

Effect of the Invention

An object of another embodiment of the present invention is to provide an electronic device or a display device having high reliability. An object of another embodiment of the present invention is to provide an electronic device or a display device having low power consumption.

One embodiment of the present invention can provide a novel light-emitting device can be provided. Another embodiment can provide a light-emitting apparatus with favorable emission efficiency. Another embodiment can provide a light-emitting apparatus with a long lifetime. Another embodiment can provide a light-emitting apparatus with a low driving voltage.

One embodiment of the present invention can provide an electronic device or a display device having high reliability. One embodiment of the present invention can provide an electronic device or a display device having low power consumption.

Note that the description of these effects does not preclude the existence of other effects. One embodiment of the present invention does not need to have all these effects. Other effects will be apparent from and can be derived from the description of the specification, the drawings, the claims, and the like.

BRIEF DESCRIPTION OF THE DRAWINGS

FIG. 10A, FIG. 10B1, FIG. 10B2, and FIG. 10C are diagrams illustrating electronic devices.

FIG. 11A to FIG. 1C are diagrams illustrating electronic devices.

MODE FOR CARRYING OUT THE INVENTION

Embodiments of the present invention will be described in detail below with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be construed as being limited to the description in the following embodiments.

Embodiment 1

In recent years, color conversion technology using quantum dots (QDs) has been put into practical use in the field of displays. A QD is a semiconductor nanocrystal with a size of several nanometers and contains approximately $1\times10^3$ to $1\times10^6$ atoms. A QD confines an electron, a hole, or an exciton, which results in discrete energy states and an energy shift depending on the size of a QD. This means that quantum dots made of the same substance emit light with different emission wavelengths depending on their sizes; thus, emission wavelengths can be easily adjusted by changing the sizes of QDs to be used.

A QD has an emission spectrum with a narrow peak width because its discreteness limits the phase relaxation, leading to light emission with high color purity. Thus, use of QDs in a color conversion layer can provide light emission with high color purity and also can provide light emission that covers Rec.2020, which is the color gamut defined by the BT.2020 standard or the BT.2100 standard.

The color conversion layer using a QD converts light emitted from a light-emitting device to light with a longer wavelength through photoluminescence in which light emitted from the light-emitting device is absorbed and then re-emitted, like the color conversion layer using an organic compound as a light-emitting substance. Therefore, when a color conversion layer is used for a display, a structure is employed in which blue light, the wavelength of which is the shortest among the three primary colors needed for a full-color display, is obtained from a light-emitting device first, and then green light and red light are obtained by color conversion.

Thus, in a display employing a color conversion method, the characteristics of the blue light-emitting devices are dominant in the display characteristics; as a result, blue light-emitting devices with better characteristics are required.

Figure 1A:
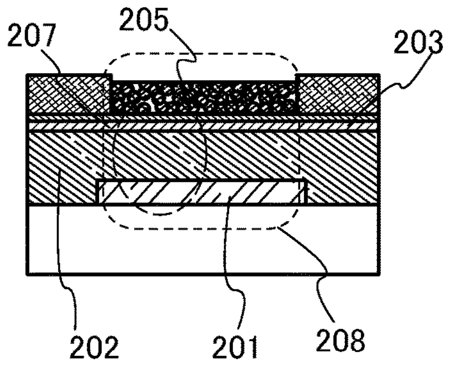
FIG. 1A to FIG. 1C are conceptual views of a light-emitting apparatus.

As illustrated in FIG. 1A, a light-emitting apparatus of one embodiment of the present invention includes a pixel 208 including a light-emitting device 207 and a color conversion layer 205, and light emitted from the light-emitting device 207 is incident on the color conversion layer 205. That is, the color conversion layer 205 is provided on an optical path of the light emitted from the light-emitting device 207 to the outside of the light-emitting apparatus. The light-emitting device 207 includes an EL layer 202 between an anode 201 and a cathode 203. The color conversion layer 205 preferably contains a quantum dot, and has functions of absorbing the incident light and emitting light with a predetermined wavelength. When the color conversion layer 205 contains a quantum dot, the peak width of the emission spectrum is narrow, so that light emission with high color purity can be obtained.

The color conversion layer 205 includes a substance having functions of absorbing incident light and emitting light with a desired wavelength. As the substance having a function of emitting light with a desired wavelength, various light-emitting substances, such as an inorganic or organic material which emits photoluminescence, can be used. In particular, a quantum dot (QD) which is an inorganic material can produce highly pure light emission having an emission spectrum with a narrow peak width, as described above. The use of a QD is preferred also because it is an inorganic substance and has high inherent stability and the theoretical internal quantum efficiency is approximately 100%, for example.

The color conversion layer 205 containing quantum dots can be formed in such a manner that a resin or solvent in which quantum dots are dispersed is applied and drying and baking are performed. In addition, a sheet in which quantum dots are dispersed in advance has also been developed. Separate coloring is performed by a droplet discharge method such as ink-jet, a printing method, or etching using photolithography or the like after application on a formation surface and solidification such as drying, baking, or fixation, for example.

Examples of the quantum dot include nano-sized particles of a Group 14 element, a Group 15 element, a Group 16 element, a compound of a plurality of Group 14 elements, a compound of an element belonging to any of Groups 4 to 14 and a Group 16 element, a compound of a Group 2 element and a Group 16 element, a compound of a Group 13 element and a Group 15 element, a compound of a Group 13 element and a Group 17 element, a compound of a Group 14 element and a Group 15 element, a compound of a Group 11 element and a Group 17 element, iron oxides, titanium oxides, spinel chalcogenides, semiconductor clusters, metal halide perovskites, and the like.

Specific examples include, but are not limited to, cadmium selenide (CdSe), cadmium sulfide (CdS), cadmium telluride (CdTe), zinc selenide (ZnSe), zinc oxide (ZnO), zinc sulfide (ZnS), zinc telluride (ZnTe), mercury sulfide (HgS), mercury selenide (HgSe), mercury telluride (HgTe), indium arsenide (InAs), indium phosphide (InP), gallium arsenide (GaAs), gallium phosphide (GaP), indium nitride (InN), gallium nitride (GaN), indium antimonide (InSb), gallium antimonide (GaSb), aluminum phosphide (AlP), aluminum arsenide (AlAs), aluminum antimonide (AlSb), lead(II) selenide (PbSe), lead(II) telluride (PbTe), lead(II) sulfide (PbS), indium selenide ($In_2Se_3$), indium telluride ($In_2Te_3$), indium sulfide ($In_2S_3$), gallium selenide ($Ga_2Se_3$), arsenic(III) sulfide ($As_2S_3$), arsenic(III) selenide ($As_2Se_3$), arsenic(III) telluride ($As_2Te_3$), antimony(III) sulfide ($Sb_2S_3$), antimony(III) selenide ($Sb_2Se_3$), antimony(III) telluride ($Sb_2Te_3$), bismuth(III) sulfide ($Bi_2S_3$), bismuth(III) selenide ($Bi_2Se_3$), bismuth(III) telluride ($Bi_2Te_3$), silicon (Si), silicon carbide (SiC), germanium (Ge), tin (Sn), selenium (Se), tellurium (Te), boron (B), carbon (C), phosphorus (P), boron nitride (BN), boron phosphide (BP), boron arsenide (BAs), aluminum nitride (AlN), aluminum sulfide ($Al_2S_3$), barium sulfide (BaS), barium selenide (BaSe), barium telluride (BaTe), calcium sulfide (CaS), calcium selenide (CaSe), calcium telluride (CaTe), beryllium sulfide (BeS), beryllium selenide (BeSe), beryllium telluride (BeTe), magnesium sulfide (MgS), magnesium selenide (MgSe), germanium sulfide (GeS), germanium selenide (GeSe), germanium telluride (GeTe), tin(IV) sulfide ($SnS_2$), tin(II) sulfide (SnS), tin(II) selenide (SnSe), tin(II) telluride (SnTe), lead(II) oxide (PbO), copper(I) fluoride (CuF), copper(I) chloride (CuCl), copper(I) bromide (CuBr), copper(I) iodide (CuI), copper(I) oxide ($Cu_2O$), copper(I) selenide ($Cu_2Se$), nickel(II) oxide (NiO), cobalt(II) oxide (CoO), cobalt(II) sulfide (CoS), triiron tetraoxide ($Fe_3O_4$), iron(II) sulfide (FeS), manganese(II) oxide (MnO), molybdenum (IV) sulfide ($MoS_2$), vanadium(II) oxide (VO), vanadium (IV) oxide ($VO_2$), tungsten(IV) oxide ($WO_2$), tantalum(V) oxide ($Ta_2O_5$), titanium oxide ($TiO_2$, $Ti_2O_5$, $Ti_2O_3$, $TisO_9$, or the like), zirconium oxide ($ZrO_2$), silicon nitride ($Si_3N_4$), germanium nitride ($Ge_3N_4$), aluminum oxide ($Al_2O_3$), barium titanate ($BaTiO_3$), a compound of selenium, zinc, and cadmium (CdZnSe), a compound of indium, arsenic, and phosphorus (InAsP), a compound of cadmium, selenium, and sulfur (CdSeS), a compound of cadmium, selenium, and tellurium (CdSeTe), a compound of indium, gallium, and arsenic (InGaAs), a compound of indium, gallium, and selenium (InGaSe), a compound of indium, selenium, and sulfur (InSeS), a compound of copper, indium, and sulfur (e.g., $CuInS_2$), and combinations thereof. What is called an alloyed quantum dot, whose composition is represented by a given ratio, may be used. For example, an alloyed quantum dot represented by $CdS_xSe_{(1-x)}$ (x is a given number between 0 and 1 inclusive) is an effective means for obtaining blue light emission because the emission wavelength can be changed by changing x.

As the structure of the quantum dot, any of a core type, a core-shell type, a core-multishell type, and the like may be used. When a core is covered with a shell formed of another inorganic material having a wider band gap, the influence of defects and dangling bonds existing at the surface of a nanocrystal can be reduced. Since this can significantly improve the quantum efficiency of light emission, it is preferable to use a core-shell or core-multishell quantum dot. Examples of the material of a shell include zinc sulfide (ZnS) and zinc oxide (ZnO).

Quantum dots have a high proportion of surface atoms and thus have high reactivity and easily aggregate together. For this reason, it is preferable that a protective agent be attached to, or a protective group be provided on the surfaces of quantum dots. The attachment of the protective agent or the provision of the protective group can prevent aggregation and increase solubility in a solvent. It can also reduce reactivity and improve electrical stability. Examples of the protective agent (or the protective group) include polyoxyethylene alkyl ethers such as polyoxyethylene lauryl ether, polyoxyethylene stearyl ether, and polyoxyethylene oleyl ether; trialkylphosphines such as tripropylphosphine, tributylphosphine, trihexylphosphine, and trioctylphoshine; polyoxyethylene alkylphenyl ethers such as polyoxyethylene n-octylphenyl ether and polyoxyethylene n-nonylphenyl ether; tertiary amines such as tri(n-hexyl)amine, tri(n-octyl) amine, and tri(n-decyl)amine; organophosphorus compounds such as tripropylphosphine oxide, tributylphosphine oxide, trihexylphosphine oxide, trioctylphosphine oxide, and tridecylphosphine oxide; polyethylene glycol diesters such as polyethylene glycol dilaurate and polyethylene glycol distearate; organic nitrogen compounds such as nitrogen-containing aromatic compounds, e.g., pyridine, lutidine, collidine, and quinolines; aminoalkanes such as hexylamine, octylamine, decylamine, dodecylamine, tetradecylamine, hexadecylamine, and octadecylamine; dialkylsulfides such as dibutylsulfide; dialkylsulfoxides such as dimethylsulfoxide and dibutylsulfoxide; organic sulfur compounds such as sulfur-containing aromatic compounds, e.g., thiophene; higher fatty acids such as a palmitin acid, a stearic acid, and an oleic acid; alcohols; sorbitan fatty acid esters; fatty acid modified polyesters; tertiary amine modified polyurethanes; and polyethyleneimines.

A QD has a continuous absorption spectrum, in which absorption intensity becomes higher as the wavelength of light becomes shorter, from the vicinity of the emission wavelength of the QD toward the shorter wavelength side. Therefore, even in a display that needs a plurality of light emission colors, light-emitting devices in pixels of the respective colors may contain the same substance as an emission center substance as long as the emission center substance emits light with the shortest required wavelength (typically, blue), and separate formation of light-emitting devices for the pixels of the respective colors is not necessary; thus, the light-emitting apparatus can be manufactured at relatively low cost.

Figure 1B:
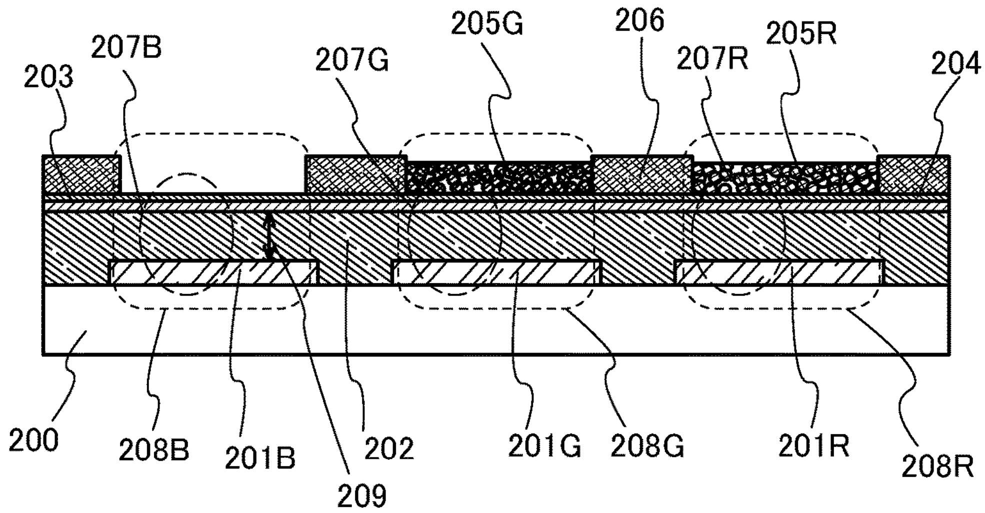

FIG. 1B illustrates, as an example, pixels exhibiting light of three colors, blue, green, and red. A reference numeral 208B denotes a first pixel that exhibits blue light emission. The first the pixel 208B includes the anode 201B and the cathode 203, and the one through which light is extracted is an electrode having a light-transmitting property. One of the anode 201B and the cathode 203 may be a reflective electrode while the other may be a semi-transmissive and semi-reflective electrode. Similarly, a second pixel 208G that exhibits green light emission and a third pixel 208R that exhibits red light emission are also illustrated, and include, respectively, an anode 201G and the cathode 203, and an anode 201R and the cathode 203. FIG. 1B illustrates, as an example, a structure in which the anodes 201B, 201G, and 201R are reflective electrodes and serve as anodes, and the cathode 203 is a semi-transmissive and semi-reflective electrode. The anode 201B to the anode 201R are formed over an insulator 200. A black matrix 206 is preferably provided between adjacent pixels to prevent mixing of light of the adjacent pixels. The black matrix 206 may also serve as a bank for forming a color conversion layer by an ink-jet method or the like.

Figure 1C:
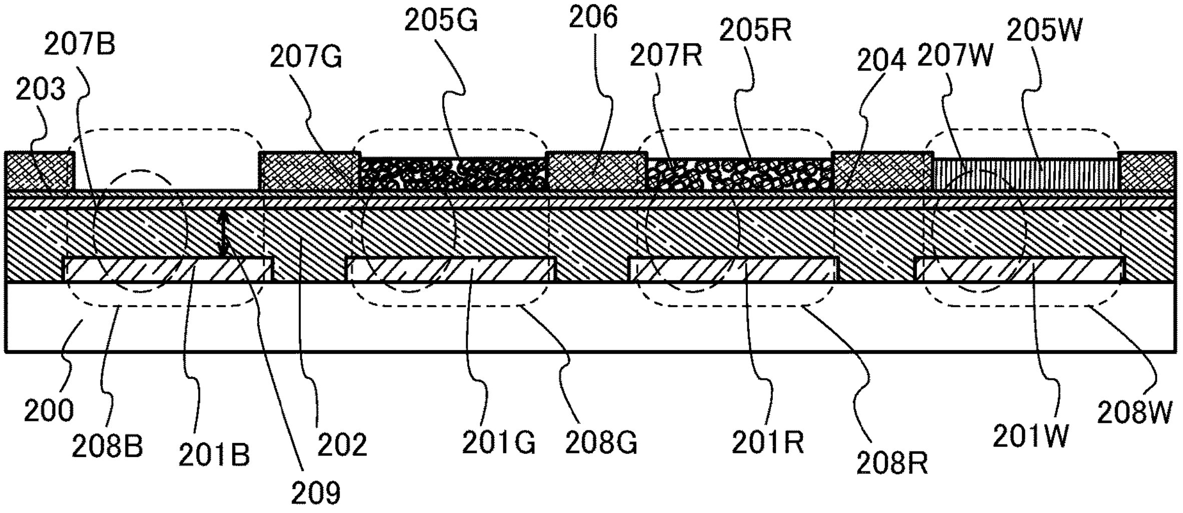

FIG. 1C illustrates pixels exhibiting light of four colors, blue, green, red, and white. A reference numeral 208W denotes a fourth pixel that exhibits white light emission. The fourth pixel 208W includes an anode 201W and the cathode 203, and one of them is an anode and the other is a cathode. Furthermore, one of them may be a reflective electrode and the other may be a transflective electrode. The anode 201W is formed over the insulator 200. A black matrix 206 is preferably provided between adjacent pixels to prevent mixing of light of the adjacent pixels. The black matrix 206 may also serve as a bank forming a color conversion layer by an ink-jet method or the like.

In the first pixel 208B to the fourth pixel 208W, the EL layer 202 is interposed between the cathode 203 and the anodes 201B, 201G, 201R, and 201W. The EL layer 202 may be either one or separated in the first pixel 208B to the fourth pixel 208W; however, a structure in which one EL layer 202 is used in common between a plurality of pixels can be manufactured more easily and is advantageous in cost. Although the EL layer 202 generally consists of a plurality of layers having different functions, some of them may be used in common and the others of them may be independent between a plurality of pixels.

The first pixel 208B to the fourth pixel 208W include a first light-emitting device 207B, a second light-emitting device 207G, a third light-emitting device 207R, and a fourth light-emitting device 207W, each including the anode, the cathode, and the EL layer. Note that FIG. 1B and FIG. 1C illustrate the structure in which the first pixel 208B to the fourth pixel 208W include the EL layer 202 in common.

The first light-emitting device 207B to the fourth light-emitting device 207W can have a microcavity structure in which one of the anode and the cathode is a reflective electrode and the other is a transflective electrode. A wavelength which can be resonated is determined by an optical distance 209 between a surface of the reflective electrode and a surface of the semi-transmissive and semi-reflective electrode in the light-emitting element. When the wavelength which is desired to be resonated is set to λ and the optical path length 209 is set to the integral multiple of λ/2, light with the wavelength λ can be amplified. The optical distance 209 can be adjusted by a hole-injection layer or a hole-transport layer which is included in the EL layer, a transparent electrode layer which is formed over a reflective electrode as part of the electrode, or the like. The light-emitting apparatus illustrated in FIG. 1B and FIG. 1C can be formed easily because the EL layer is used in common between the first light-emitting device 207B to the fourth light-emitting device 207W, and the emission center substance is also the same, so that the optical path length 209 of the light-emitting device in the first pixel 208B to the fourth pixel 208W is the same. Note that in the case where the EL layers 202 are separately formed for the respective pixels, the optical distance 209 is formed in accordance with light from the EL layer.

A protective layer 204 is provided over the cathode 203. The protective layer 204 may be provided so as to protect the first light-emitting device 207B to the fourth light-emitting device 207W from substances or environments which bring about adverse effects. For the protective layer 204, an oxide, a nitride, a fluoride, a sulfide, a ternary compound, a metal, a polymer, or the like can be used. For example, a material containing aluminum oxide, hafnium oxide, hafnium silicate, lanthanum oxide, silicon oxide, strontium titanate, tantalum oxide, titanium oxide, zinc oxide, niobium oxide, zirconium oxide, tin oxide, yttrium oxide, cerium oxide, scandium oxide, erbium oxide, vanadium oxide, indium oxide, or the like; a material containing aluminum nitride, hafnium nitride, silicon nitride, tantalum nitride, titanium nitride, niobium nitride, molybdenum nitride, zirconium nitride, gallium nitride, or the like; a material containing a nitride containing titanium and aluminum, an oxide containing titanium and aluminum, an oxide containing aluminum and zinc, a sulfide containing manganese and zinc, a sulfide containing cerium and strontium, an oxide containing erbium and aluminum, an oxide containing yttrium and zirconium, or the like can be used.

Note that the first pixel 208B emits light without through a color conversion layer, and thus is preferably a pixel that emits blue light, which has the highest energy among three primary colors of light. For the same reason, in the case where the first light-emitting device 207B to the fourth light-emitting device 207W emit light of the same color, the emission color is preferably blue. In that case, use of the same substance as the emission center substances included in the light-emitting devices is advantageous in cost; however, different emission center substances may be used.

In the case where the light-emitting devices are not separately formed for the respective colors of pixels, light emission of the emission center substance included in the light-emitting devices is preferably blue light emission (with a peak wavelength of the emission spectrum of approximately 440 nm to 520 nm, more preferably approximately 440 nm to 480 nm). The peak wavelength of light emitted from the emission center substance is calculated from a PL spectrum in a solution state. Since the dielectric constant of the organic compound included in the EL layer of the light-emitting device is approximately 3, in order to prevent inconsistency with the emission spectrum of the light-emitting device, the dielectric constant of the solvent for bringing the emission center substance into a solution state is preferably greater than or equal to 1 and less than or equal to 10, further preferably greater than or equal to 2 and less than or equal to 5 at room temperature. Specific examples include hexane, benzene, toluene, diethyl ether, ethyl acetate, chloroform, chlorobenzene, and dichloromethane. A solvent that has a dielectric constant greater than or equal to 2 and less than or equal to 5 at room temperature, has high solubility, and is versatile is further preferable, and toluene or chloroform is preferably used as the solution, for example.

The first color conversion layer 205G includes the second substance that absorbs light from the second light-emitting device 207G and emits light. Light emitted from the second light-emitting device 207G enters the first color conversion layer 205G and is converted to green light with a longer wavelength (with a peak wavelength of the emission spectrum of approximately 500 nm to 600 nm, preferably approximately 500 nm to 560 nm) to exist. Similarly, the reference numeral 205R denotes a color conversion layer, and the second color conversion layer 205R includes a third substance that absorbs light from the third light-emitting device 207R and emits light. Light emitted from the third light-emitting device 207R enters the second color conversion layer 205R and is converted to red light with a longer wavelength (with a peak wavelength of the emission spectrum of approximately 600 nm to 750 nm, preferably approximately 610 nm to 700 nm) to exist. The first color conversion layer 205G and the second color conversion layer 205R preferably include a substance which performs color conversion, such as a QD, at a concentration such that light from the light-emitting devices can be sufficiently absorbed and transmission of the light can be avoided as much as possible.

Similarly, the reference numeral 205W denotes a color conversion layer, and the color third conversion layer 205W includes a third substance that absorbs light from the fourth light-emitting device 207W and emits light. Light emitted from the fourth light-emitting device 207W enters the third color conversion layer 205W and is converted to yellow light with a longer wavelength (with a peak wavelength of the emission spectrum of approximately 560 nm to 610 nm, preferably 580 nm to 595 nm) to exist. The third color conversion layer 205W includes at least one or more rare earth elements such as europium, cerium, and yttrium, and is capable of converting blue light emission into yellow light emission efficiently. The third color conversion layer 205W includes a substance which performs color conversion such that light from the light-emitting devices is adequately transmitted. Light converted in the color third conversion layer 205W and light from the light-emitting devices that is transmitted through the third color conversion layer 205W are mixed to produce white light emission.

Note that these pixels may each further include a color filter.

In the light-emitting apparatus having the above-described structure, part of light does not reach the color conversion layers because of optical losses due to absorption by the electrode or the like, an evanescent mode, and optical confinement caused by the difference in refractive index between the resin and each light-emitting device that are bonded to each other. Therefore, reducing such losses is required.

Figure 2A:
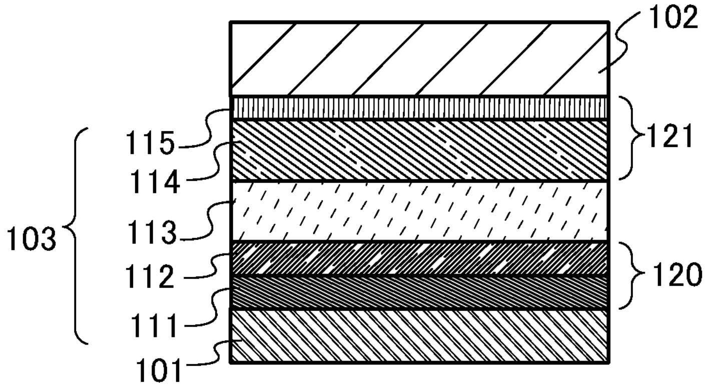
FIG. 2A to FIG. 2C are schematic views of light-emitting devices.
Figure 2B:
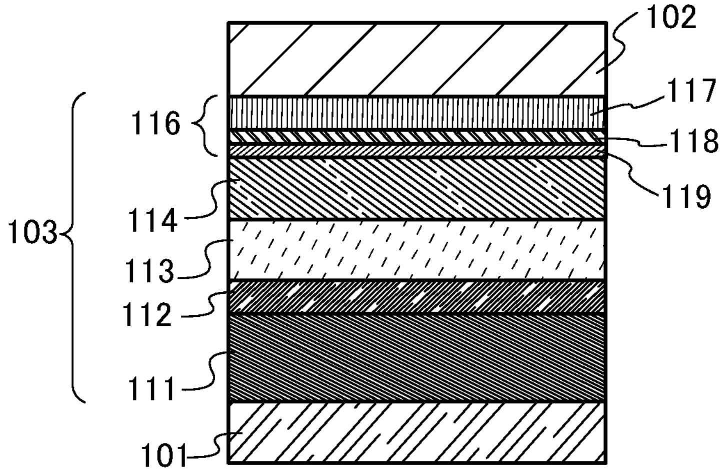
Figure 2C:
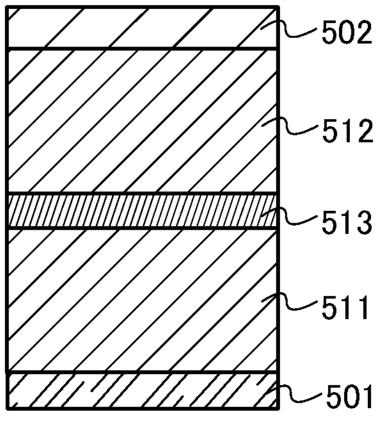

In view of the above, the light-emitting device 207 is a light-emitting device having the structure illustrated in FIG. 2A to FIG. 2C. The light-emitting device used in the light-emitting apparatus of one embodiment of the present invention is described below.

The light-emitting device illustrated in FIG. 2A includes an anode 101, a cathode 102, and an EL layer 103, where the EL layer includes a hole-injection layer 111, a hole-transport layer 112, a light-emitting layer 113, an electron-transport layer 114, and an electron-injection layer 115. Furthermore, the light-emitting layer 113 is a layer containing at least a light-emitting material. Note that the structure of the EL layer 103 is not limited to this structure, and an embodiment where some of the above-described layers are not formed or an embodiment where other functional layers such as a carrier-blocking layer, an exciton-blocking layer, and an intermediate layer are formed may be employed.

One embodiment of the present invention has a structure provided with a low refractive index layer in at least one of the region between the light-emitting layer 113 and the anode 101 (a hole-transport region 120) and the region between the light-emitting layer 113 and the cathode 102 (an electron-transport region 121) in the EL layer 103.

The low refractive index layer is a layer-shaped region that is substantially parallel to the anode 101 and the cathode 102 and has a lower refractive index than the light-emitting layer 113. Since the refractive index of an organic compound included in a light-emitting device is typically approximately 1.8 to 1.9, the refractive index of the low refractive index layer is preferably lower than or equal to 1.75; specifically, the ordinary refractive index in the blue light emission region (greater than or equal to 455 nm and less than or equal to 465 nm) is preferably higher than or equal to 1.50 and lower than or equal to 1.75, or the ordinary refractive index with respect to light of 633 nm, which is typically used in refractive index measurement, is preferably higher than or equal to 1.45 and lower than or equal to 1.70.

Note that in the case where light is incident on a material having optical anisotropy, light with a plane of vibration parallel to the optical axis is referred to as extraordinary light (rays) and light with a plane of vibration perpendicular to the optical axis is referred to as ordinary light (rays); the refractive index of the material with respect to ordinary light might differ from that with respect to extraordinary light. In such a case, the ordinary refractive index and the extraordinary refractive index can be separately calculated by anisotropy analysis. Note that in the case where the measured material has both the ordinary refractive index and the extraordinary refractive index, the ordinary refractive index is used as an index in this specification.

The light-emitting layer 113 contains a light-emitting material described above, and light is obtained from the light-emitting material in the light-emitting device 207 of one embodiment of the present invention. The light-emitting layer 113 may include a host material and other materials. Although any layer other than the light-emitting layer 113 may be the low refractive index layer, any one or more of the hole-injection layer 111, the hole-transport layer 112, the electron-transport layer 114, and the electron-injection layer 115 are each preferably the low refractive index layer. When the layer with a low refractive index is present in the EL layer, light quenching as an optical loss inside the device due to an evanescent mode and a thin film mode is inhibited and accordingly light extraction efficiency is improved. This enables the light-emitting device to have high external quantum efficiency. Note that the layer with a low refractive index is preferably provided in a region close to the light-emitting layer.

In particular, each side of the light-emitting layer 113, i.e., each of the hole-transport region 120 and the electron-transport region 121 is preferably the layer with a low refractive index because the effect of improving the light extraction efficiency is heightened and the refractive index of the color conversion layer that exerts an efficiency-improving effect is reduced.

The entire regions of the hole-transport region 120 and the electron-transport region 121 are not necessarily the low refractive index layers, and at least part in the thickness direction of one or both of the hole-transport region 120 and the electron-transport region 121 are provided as the low refractive index layer. For example, in the hole-transport region 120, at least one of the functional layers provided in the hole-transport region 120, such as the hole-injection layer 111, the hole-transport layer 112, and an electron-blocking layer, is the low refractive index layer; and in the electron-transport region 121, at least one of the functional layers provided in the electron-transport region 121, such as a hole-blocking layer, the electron-transport layer 114, and the electron-injection layer 115, is the low refractive index layer.

Next, examples of specific structures and materials of the above light-emitting device are described. As described above, the light-emitting device of one embodiment of the present invention includes, between the pair of electrodes of the anode 101 and the cathode 102, the EL layer 103 including a plurality of layers; the EL layer 103 includes the low refractive index layer in any of the layers.

The anode 101 is preferably formed using a metal, an alloy, or a conductive compound having a high work function (specifically, 4.0 eV or more), a mixture thereof, or the like. Specifically, for example, indium oxide-tin oxide (ITO: Indium Tin Oxide), indium oxide-tin oxide containing silicon or silicon oxide, indium oxide-zinc oxide, indium oxide containing tungsten oxide and zinc oxide (IWZO), and the like can be given. These conductive metal oxide films are usually formed by a sputtering method but may also be formed by application of a sol-gel method or the like. An example of the formation method is a method in which indium oxide-zinc oxide is formed by a sputtering method using a target in which 1 to 20 wt % zinc oxide is added to indium oxide. Indium oxide containing tungsten oxide and zinc oxide (IWZO) can also be formed by a sputtering method using a target containing 0.5 to 5 wt % tungsten oxide and 0.1 to 1 wt % zinc oxide with respect to indium oxide. In addition, gold (Au), platinum (Pt), nickel (Ni), tungsten (W), chromium (Cr), molybdenum (Mo), iron (Fe), cobalt (Co), copper (Cu), palladium (Pd), a nitride of a metal material (such as titanium nitride), and the like can be given. Graphene can also be used. Note that when a composite material described later is used for a layer that is in contact with the anode 101 in the EL layer 103, an electrode material can be selected regardless of its work function.

Although the EL layer 103 preferably has a stacked-layer structure, there is no particular limitation on the stacked-layer structure, and various layers such as a hole-injection layer, a hole-transport layer, an electron-transport layer, an electron-injection layer, a carrier-blocking layer, an exciton-blocking layer, and a charge-generation layer can be employed as described above. Two kinds of stacked-layer structure of the EL layer 103 are described in this embodiment: the structure illustrated in FIG. 2A, which includes the hole-injection layer 111, the hole-transport layer 112, the light-emitting layer 113, the electron-transport layer 114, and the electron-injection layer 115; and the structure illustrated in FIG. 2B, which includes the hole-injection layer 111, the hole-transport layer 112, the light-emitting layer 113, the electron-transport layer 114, the electron-injection layer 115, and a charge-generation layer 116. Materials forming the layers are specifically described below.

The hole-injection layer 111 is a layer containing a substance having an electron-accepting property. Either an organic compound or an inorganic compound can be used as the substance having an acceptor property.

Examples of the organic compound having an acceptor property include a compound having an electron-withdrawing group (a halogen group or a cyano group), such as 7,7,8,8-tetracyano-2,3,5,6-tetrafluoroquinodimethane (abbreviation: $F_4$-TCNQ), chloranil, 2,3,6,7,10,11-hexacyano-1,4,5,8,9,12-hexaazatriphenylene (abbreviation: HAT-CN), 1,3,4,5,7,8-hexafluorotetracyano-naphthoquinodimethane (abbreviation: F6-TCNNQ), or 2-(7-dicyanomethylene-1,3,4,5,6,8,9,10-octafluoro-7H-pyren-2-ylidene)malononitrile. A compound in which electron-withdrawing groups are bonded to a condensed aromatic ring having a plurality of heteroatoms, such as HAT-CN, is particularly preferable because it is thermally stable. A [3]radialene derivative having an electron-withdrawing group (in particular, a cyano group or a halogen group such as a fluoro group) has a very high electron-accepting property and thus is preferable. Specific examples include α,α',α"-1,2,3-cyclopropanetriylidenetris[4-cyano-2,3,5,6-tetrafluorobenzeneacetonitrile], α,α',α"-1,2,3-cyclopropanetriylidenetris[2,6-dichloro-3,5-difluoro-4-(trifluoromethyl)benzeneacetonitrile], and α,α',α"-1,2,3-cyclopropanetriylidenetris[2,3,4,5,6-pentafluorobenzeneacetonitrile].

As the substance having an acceptor property, an inorganic compound such as molybdenum oxide, vanadium oxide, ruthenium oxide, tungsten oxide, or manganese oxide can also be used, other than the above-described organic compounds.

The hole-injection layer 111 can be formed using a phthalocyanine-based complex compound such as phthalocyanine (abbreviation: $H_2Pc$) or copper phthalocyanine (CuPc), an aromatic amine compound such as 4,4'-bis[N-(4-diphenylaminophenyl)-N-phenylamino]biphenyl (abbreviation: DPAB) or N,N-bis{4-[bis(3-methylphenyl)amino]phenyl}-N,N-diphenyl-(1,1'-biphenyl)-4,4'-diamine (abbreviation: DNTPD), or a high molecule such as poly(3,4-ethylenedioxythiophene)/poly(styrenesulfonic acid) (PEDOT/PSS). The substance having an acceptor property can extract electrons from an adjacent hole-transport layer (or hole-transport material) by the application of an electric field.

Alternatively, a composite material in which a material having a hole-transport property contains the above-described acceptor substance can be used for the hole-injection layer 111. By using a composite material in which a material having a hole-transport property contains an acceptor substance, a material used to form an electrode can be selected regardless of its work function. In other words, besides a material having a high work function, a material having a low work function can also be used for the anode 101.

As the material having a hole-transport property used for the composite material, any of a variety of organic compounds such as aromatic amine compounds, carbazole derivatives, aromatic hydrocarbons, and high molecular compounds (e.g., oligomers, dendrimers, or polymers) can be used. Note that the material having a hole-transport property used for the composite material is preferably a substance having a hole mobility of $1\times10^{-6}$ $cm^2/Vs$ or higher. Organic compounds, which can be used as the material having a hole-transport property in the composite material, are specifically given below.

Examples of the aromatic amine compounds that can be used for the composite material include N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis{4-[bis(3-methylphenyl)amino]phenyl}-N,N-diphenyl-(1,1'-biphenyl)-4,4'-diamine (abbreviation: DNTPD), and 1,3,5-tris[N-(4-diphenylaminophenyl)-N-phenylamino]benzene (abbreviation: DPA3B). Specific examples of the carbazole derivatives include 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), 4,4'-di(N-carbazolyl)biphenyl (abbreviation: CBP), 1,3,5-tris[4-(N-carbazolyl)phenyl]benzene (abbreviation: TCPB), 9-[4-(10-phenylanthracen-9-yl)phenyl]-9H-carbazole (abbreviation: CzPA), and 1,4-bis[4-(N-carbazolyl)phenyl]-2,3,5,6-tetraphenylbenzene.

Examples of the aromatic hydrocarbon include 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, and 2,5,8,11-tetra(tert-butyl)perylene. Other examples include pentacene and coronene. The aromatic hydrocarbon may have a vinyl skeleton. Examples of the aromatic hydrocarbon having a vinyl group include 4,4'-bis(2,2-diphenylvinyl)biphenyl (abbreviation: DPVBi) and 9,10-bis[4-(2,2-diphenylvinyl)phenyl]anthracene (abbreviation: DPVPA). Note that the organic compound of one embodiment of the present invention can also be used.

Other examples include high molecular compounds such as poly(N-vinylcarbazole) (abbreviation: PVK), poly(4-vinyltriphenylamine) (abbreviation: PVTPA), poly[N-(4-{V-[4-(4-diphenylamino)phenyl]phenyl-NV-phenylamino}phenyl)methacrylamide] (abbreviation: PTPDMA), and poly[N,N-bis(4-butylphenyl)-N,N-bis(phenyl)benzidine] (abbreviation: Poly-TPD).

The material having a hole-transport property used in the composite material further preferably has any of a carbazole skeleton, a dibenzofuran skeleton, a dibenzothiophene skeleton, and an anthracene skeleton. In particular, an aromatic amine having a substituent that includes a dibenzofuran ring or a dibenzothiophene ring, an aromatic monoamine that includes a naphthalene ring, or an aromatic monoamine in which a 9-fluorenyl group is bonded to nitrogen of amine through an arylene group may be used. Note that the second organic compound preferably has an N,N-bis(4-biphenyl) amino group because a light-emitting device having a long lifetime can be fabricated. Specific examples of the second organic compound include N-(4-biphenyl)-6,N-diphenylbenzo[b]naphtho[1,2-d]furan-8-amine (abbreviation: BnfABP), N,N-bis(4-biphenyl)-6-phenylbenzo[b]naphtho[1,2-d]furan-8-amine (abbreviation: BBABnf), 4,4'-bis(6-phenylbenzo[b]naphtho[1,2-d]furan-8-yl)-4"-phenyltriphenylamine (abbreviation: BnfBB1BP), N,N-bis(4-biphenyl)benzo[b]naphtho[1,2-d]furan-6-amine (abbreviation: BBABnf(6)), N,N-bis(4-biphenyl)benzo[b]naphtho[1,2-d]furan-8-amine (abbreviation: BBABnf(8)), N,N-bis(4-biphenyl)benzo[b]naphtho[2,3-d]furan-4-amine (abbreviation: BBABnf(II)(4)), N,N-bis[4-(dibenzofuran-4-yl)phenyl]-4-amino-p-terphenyl (abbreviation: DBfBB1TP), N-[4-(dibenzothiophen-4-yl)phenyl]-N-phenyl-4-biphenylamine (abbreviation: ThBA1BP), 4-(2-naphthyl)-4',4"-diphenyltriphenylamine (abbreviation: BBAβNB), 4-[4-(2-naphthyl)phenyl]-4',4"-diphenyltriphenylamine (abbreviation: BBAβNBi), 4-(2;1'-binaphthyl-6-yl)-4',4"-diphenyltriphenylamine (abbreviation: BBAαNβNB), 4,4'-diphenyl-4"-(7;1'-binaphthyl-2-yl)triphenylamine (abbreviation: BBAαNβNB-03), 4,4'-diphenyl-4"-(7-phenyl)naphthyl-2-yltriphenylamine (abbreviation: BBAPβNB-03), 4-(6;2'-binaphthyl-2-yl)-4',4"-diphenyltriphenylamine (abbreviation: BBA(βN2)B), 4,4'-diphenyl-4"-(7;2'-binaphthyl-2-yl)triphenylamine (abbreviation: BBA(βN2)B-03), 4-(1;2'-binaphthyl-4-yl)-4',4"-diphenyltriphenylamine (abbreviation: BBAβNαNB), 4-(1;2'-binaphthyl-5-yl)-4',4"-diphenyltriphenylamine (abbreviation: BBAβNαNB-02), 4-(4-biphenylyl)-4'-(2-naphthyl)-4"-phenyltriphenylamine (abbreviation: TPBiAβNB), 4-(3-biphenylyl)-4'-[4-(2-naphthyl)phenyl]-4"-phenyltriphenylamine (abbreviation: mTPBiAβNBi), 4-(4-biphenylyl)-4'-[4-(2-naphthyl)phenyl]-4"-phenyltriphenylamine (abbreviation: TPBiAβNBi), 4-(1-naphthyl)-4'-phenyltriphenylamine (abbreviation: αNBA1BP), 4,4'-bis(1-naphthyl)triphenylamine (abbreviation: αNBB1BP), 4,4'-diphenyl-4"-[4'-(carbazol-9-yl)biphenyl-4-yl]triphenylamine (abbreviation: YGTBi1BP), 4'-[4-(3-phenyl-9H-carbazol-9-yl)phenyl]tris(1,1'-biphenyl-4-yl)amine (abbreviation: YGTBi1BP-02), 4-[4'-(carbazol-9-yl)biphenyl-4-yl]-4'-(2-naphthyl)-4"-phenyltriphenylamine (abbreviation: YGTBiβNB), N-[4-(9-phenyl-9H-carbazol-3-yl)phenyl]-N-[4-(1-naphthyl)phenyl]-9,9'-spirobi[9H-fluoren]-2-amine (abbreviation: PCBNBSF), N,N-bis([1,1'-biphenyl]-4-yl)-9,9'-spirobi[9H-fluoren]-2-amine (abbreviation: BBASF), N,N-bis([1,1'-biphenyl]-4-yl)-9,9'-spirobi[9H-fluoren]-4-amine (abbreviation: BBASF(4)), N-(1,1'-biphenyl-2-yl)-N-(9,9-dimethyl-9H-fluoren-2-yl)-9,9'-spirobi[9H-fluoren]-4-amine (abbreviation: oFBiSF), N-(4-biphenyl)-N-(9,9-dimethyl-9H-fluoren-2-yl)dibenzofuran-4-amine (abbreviation: FrBiF), N-[4-(1-naphthyl)phenyl]-N-[3-(6-phenyldibenzofuran-4-yl)phenyl]-1-naphthylamine (abbreviation: mPDBfBNBN), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-[4-(9-phenylfluoren-9-yl)phenyl]triphenylamine (abbreviation: BPAFLBi), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), N-phenyl-N-[4-(9-phenyl-9H-carbazol-3-yl)phenyl]-9,9'-spirobi[9H-fluoren]-2-amine (abbreviation: PCBASF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), N,N-bis(9,9-dimethyl-9H-fluoren-2-yl)-9,9'-spirobi-9H-fluoren-4-amine, N,N-bis(9,9-dimethyl-9H-fluoren-2-yl)-9,9'-spirobi-9H-fluoren-3-amine, N,N-bis(9,9-dimethyl-9H-fluoren-2-yl)-9,9'-spirobi-9H-fluoren-2-amine, and N,N-bis(9,9-dimethyl-9H-fluoren-2-yl)-9,9'-spirobi-9H-fluoren-1-amine.

Further preferably, the material having a hole-transport property that is used in the composite material is a substance having a relatively deep HOMO level higher than or equal to −5.7 eV and lower than or equal to −5.4 eV. When the material having a hole-transport property that is used in the composite material has a relatively deep HOMO level, holes can be easily injected into the hole-transport layer 112 to easily provide a light-emitting device having a long lifetime.

When any one or more of a fluoride of an alkali metal, a fluoride of an alkaline earth metal, and alkyl fluoride is mixed into the above-described composite material so that the proportion of fluorine atoms in a layer including the mixed material is preferably 20% or higher, the refractive index of the layer can be reduced. This also enables the low refractive index layer to be formed in the EL layer 103, leading to higher external quantum efficiency of the light-emitting device. Since the spin density of the composite material mixed with the fluoride decreases with increasing the amount of fluoride, the spin density of the composite material measured by ESR spectroscopy is preferably $1.0\times10^{18}$ spins/$cm^3$ or higher. When the fluoride is mixed into the hole-injection layer, an inorganic compound, particularly molybdenum oxide is preferably used as the acceptor substance.

The refractive index of the hole-injection layer 111 can also be lowered by the use of a material with a low refractive index, such as 1,1-bis-(4-bis(4-methyl-phenyl)-amino-phenyl)-cyclohexane (abbreviation: TAPC), as the material having a hole-transport property in the above composite material. Note that the organic compound having a hole-transport property and a low refractive index is not limited to TAPC described above.

The formation of the hole-injection layer 111 can improve the hole-injection property, offering the light-emitting device with a low driving voltage. The organic compound having an acceptor property is an easy-to-use material because evaporation is easy and its film can be easily formed.

The hole-transport layer 112 is formed containing a material having a hole-transport property. The material having a hole-transport property preferably has a hole mobility higher than or equal to $1\times10^{-6}$ $cm^2$/Vs.

Examples of the material having a hole-transport property include compounds having an aromatic amine skeleton such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation:

PCBBi1BP), 4-(1-naphthyl)-4'-(9-phenyl-9H-carbazol-3-yl) triphenylamine (abbreviation: PCBANB), 4,4'-di(1-naphthyl)-4''-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), and N-phenyl-N-[4-(9-phenyl-9H-carbazol-3-yl)phenyl]spiro-9,9'-bifluoren-2-amine9H (abbreviation: PCBASF); compounds having a carbazole skeleton such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), and 3,3'-bis(9-phenyl-9H-carbazole) (abbreviation: PCCP); compounds having a thiophene skeleton such as 4,4',4''-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV); and compounds having a furan skeleton such as 4,4',4''-(benzene-1,3,5-triyl)tri(dibenzofuran) (abbreviation: DBF3P-II) and 4-{3-[3-(9-phenyl-9H-fluoren-9-yl)phenyl] phenyl}dibenzofuran (abbreviation: mmDBFFLBi-II). Among the above materials, the compound having an aromatic amine skeleton and the compound having a carbazole skeleton are preferable because these compounds are highly reliable and have high hole-transport properties to contribute to a reduction in driving voltage. Note that any of the substances given as examples of the organic compound that can be used as the material having a hole-transport property for the composite material for the hole-injection layer 111 can also be suitably used as the material included in the hole-transport layer 112.

The light-emitting layer 113 includes a light-emitting substance and a host material. The light-emitting layer 113 may additionally include other materials. Alternatively, the light-emitting layer 113 may be a stack of two layers with different compositions.

As the light-emitting substance, fluorescent substances, phosphorescent substances, substances exhibiting thermally activated delayed fluorescence (TADF), or other light-emitting substances may be used. Note that one embodiment of the present invention can more suitably be used in the case where the light-emitting layer 113 is a layer that exhibits fluorescence, specifically, blue fluorescence.

Examples of the material that can be used as a fluorescent substance in the light-emitting layer 113 are as follows. Other fluorescent substances can also be used.

The examples include 5,6-bis[4-(10-phenyl-9-anthryl) phenyl]-2,2'-bipyridine (abbreviation: PAP2BPy), 5,6-bis [4'-(10-phenyl-9-anthryl)biphenyl-4-yl]-2,2'-bipyridine (abbreviation: PAPP2BPy), N,N'-diphenyl-N,N-bis[4-(9-phenyl-9H-fluoren-9-yl)phenyl]pyrene-1,6-diamine (abbreviation: 1,6FLPAPrn), N,N-bis(3-methylphenyl)-N,N-bis[3-(9-phenyl-9H-fluoren-9-yl)phenyl]pyrene-1,6-diamine (abbreviation: 1,6mMemFLPAPrn), N,N'-bis[4-(9H-carbazol-9-yl)phenyl]-N,N-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra-tert-butylperylene (abbreviation: TBP), 4-(10-phenyl-9-anthryl)-4'-(9-phenyl-9H-carbazol-3-yl)triphenylamine (abbreviation: PCBAPA), N,N''-(2-tert-butylanthracene-9,10-diyldi-4,1-phenylene)bis [N,N',N'-triphenyl-1,4-phenylenediamine] (abbreviation: DPABPA), N,9-diphenyl-N-[4-(9,10-diphenyl-2-anthryl) phenyl]-9H-carbazol-3-amine (abbreviation: 2PCAPPA), N-[4-(9,10-diphenyl-2-anthryl)phenyl]-N,N,N-triphenyl-1,4-phenylenediamine (abbreviation: 2DPAPPA), N,N,N',N',N'',N'',N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N,N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl) tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM), N,N'-diphenyl-N,N'-(1,6-pyrene-diyl)bis[(6-phenylbenzo[b] naphtho[1,2-d]furan)-8-amine] (abbreviation: 1,6BnfAPrn-03), 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02), and 3,10-bis[N-(dibenzofuran-3-yl)-N-phenylamino]naphtho[2,3-b;6,7-b'] bisbenzofuran (abbreviation: 3,10FrA2Nbf(IV)-02). Condensed aromatic diamine compounds typified by pyrenediamine compounds such as 1,6FLPAPrn, 1,6mMemFLPAPrn, and 1,6BnfAPrn-03 are particularly preferable because of their high hole-trapping properties, high emission efficiency, or high reliability.

Examples of the material that can be used when a phosphorescent substance is used as the light-emitting substance in the light-emitting layer 113 are as follows.

The examples include an organometallic iridium complex having a 4H-triazole skeleton, such as tris{2-[5-(2-methylphenyl)-4-(2,6-dimethylphenyl)-4H-1,2,4-triazol-3-yl-κN2]phenyl-κC}iridium(III) (abbreviation: $[Ir(mpptz\text{-}dmp)_3]$), tris(5-methyl-3,4-diphenyl-4H-1,2,4-triazolato)iridium (III) (abbreviation: $[Ir(Mptz)_3]$), or tris[4-(3-biphenyl)-5-isopropyl-3-phenyl-4H-1,2,4-triazolato]iridium(III) (abbreviation: $[Ir(iPrptz\text{-}3b)_3]$); an organometallic iridium complex having a 1H-triazole skeleton, such as tris[3-methyl-1-(2-methylphenyl)-5-phenyl-1H-1,2,4-triazolato] iridium(III) (abbreviation: $[Ir(Mptz1\text{-}mp)_3]$) or tris(1-methyl-5-phenyl-3-propyl-1H-1,2,4-triazolato)iridium(III) (abbreviation: $[Ir(Prptz1\text{-}Me)_3]$); an organometallic iridium complex having an imidazole skeleton, such as fac-tris[1-(2,6-diisopropylphenyl)-2-phenyl-1H-imidazole]iridium (III) (abbreviation: [Ir(iPrpmi)$_3$]) or tris[3-(2,6-dimethylphenyl)-7-methylimidazo[1,2-f]phenanthridinato]iridium (III) (abbreviation: [Ir(dmpimpt-Me)$_3$]); and an organometallic iridium complex in which a phenylpyridine derivative having an electron-withdrawing group is a ligand, such as bis[2-(4',6'-difluorophenyl)pyridinato-N,C$^2$]iridium (III) tetrakis(1-pyrazolyl)borate (abbreviation: FIr6), bis[2-(4',6'-difluorophenyl)pyridinato-N,C$^{2'}$]iridium(III) picolinate (abbreviation: FIrpic), bis{2-[3',5'-bis(trifluoromethyl) phenyl]pyridinato-N,C$^{2'}$}iridium(III) picolinate (abbreviation: [Ir(CF$_3$ppy)$_2$(pic)]), or bis[2-(4',6'-difluorophenyl)pyridinato-N,C$^{2'}$]iridium(III) acetylacetonate (abbreviation: FIr(acac)). These are compounds exhibiting blue phosphorescent light, and are compounds having an emission peak at 440 nm to 520 nm.

Other examples include an organometallic iridium complex having a pyrimidine skeleton, such as tris(4-methyl-6-phenylpyrimidinato)iridium(III) (abbreviation: [Ir(mppm)$_3$]), tris(4-t-butyl-6-phenylpyrimidinato)iridium (III) (abbreviation: [Ir(tBuppm)$_3$]), (acetylacetonato)bis(6-methyl-4-phenylpyrimidinato)iridium(III) (abbreviation: [Ir (mppm)$_2$(acac)]), (acetylacetonato)bis(6-tert-butyl-4-phenylpyrimidinato)iridium(III) (abbreviation: [Ir (tBuppm)$_2$(acac)]), (acetylacetonato)bis[6-(2-norbornyl)-4-phenylpyrimidinato]iridium(III) (abbreviation: [Ir(nbppm)$_2$ (acac)]), (acetylacetonato)bis[5-methyl-6-(2-methylphenyl)-4-phenylpyrimidinato]iridium(III) (abbreviation: [Ir (mpmppm)$_2$(acac)]), or (acetylacetonato)bis(4,6-diphenylpyrimidinato)iridium(III) (abbreviation: [Ir(dppm)$_2$(acac)]); an organometallic iridium complex having a pyrazine skeleton, such as (acetylacetonato)bis(3,5-dimethyl-2-phenylpyrazinato)iridium(III) (abbreviation: [Ir (mppr-Me)$_2$(acac)]) or (acetylacetonato)bis(5-isopropyl-3-methyl-2-phenylpyrazinato)iridium(III) (abbreviation: [Ir (mppr-iPr)$_2$(acac)]); an organometallic iridium complex having a pyridine skeleton, such as tris(2-phenylpyridinato-N,C$^2$)iridium(III) (abbreviation: [Ir(ppy)$_3$]), bis(2-phenylpyridinato-N,C$^{2'}$)iridium(III) acetylacetonate (abbreviation: [Ir(ppy)$_2$(acac)]), bis(benzo[h]quinolinato)iridium(III) acetylacetonate (abbreviation: [Ir(bzq)$_2$(acac)]), tris(benzo [h]quinolinato)iridium(III) (abbreviation: [Ir(bzq)$_3$]), tris(2-phenylquinolinato-N,C$^{2'}$)iridium(III) (abbreviation: [Ir(pq)$_3$]), or bis(2-phenylquinolinato-N,C$^2$)iridium(III) acetylacetonate (abbreviation: [Ir(pq)$_2$(acac)]); and a rare earth metal complex such as tris(acetylacetonato) (monophenanthroline)terbium(III) (abbreviation: [Tb(acac)$_3$ (Phen)]). These are compounds that mainly exhibit green phosphorescent light, and have an emission peak at 500 nm to 600 nm. Note that organometallic iridium complexes having a pyrimidine skeleton have distinctively high reliability or emission efficiency and thus are particularly preferable.

Other examples include an organometallic iridium complex having a pyrimidine skeleton, such as (diisobutyrylmethanato)bis[4,6-bis(3-methylphenyl)pyrimidinato] iridium(III) (abbreviation: [Ir(5mdppm)$_2$(dibm)]), bis[4,6-bis(3-methylphenyl)pyrimidinato](dipivaloylmethanato) iridium(III) (abbreviation: [Ir(5mdppm)$_2$(dpm)]), or bis[4,6-di(naphthalen-1-yl)pyrimidinato](dipivaloylmethanato) iridium(III) (abbreviation: [Ir(d1npm)$_2$(dpm)]); an organometallic iridium complex having a pyrazine skeleton, such as (acetylacetonato)bis(2,3,5-triphenylpyrazinato) iridium(III) (abbreviation: [Ir(tppr)$_2$(acac)]), bis(2,3,5-triphenylpyrazinato)(dipivaloylmethanato)iridium(III) (abbreviation: [Ir(tppr)$_2$(dpm)]), or (acetylacetonato)bis[2,3-bis(4-fluorophenyl)quinoxalinato]iridium(III) (abbreviation: [Ir (Fdpq)$_2$(acac)]); an organometallic iridium complex having a pyridine skeleton, such as tris(1-phenylisoquinolinato-N,C$^{2'}$)iridium(III) (abbreviation: [Ir(piq)$_3$]) or bis(1-phenylisoquinolinato-N,C$^{2'}$)iridium(III) acetylacetonate (abbreviation: [Ir(piq)$_2$(acac)]); a platinum complex such as 2,3,7,8,12,13,17,18-octaethyl-21H,23H-porphyrinplatinum(II) (abbreviation: PtOEP); and a rare earth metal complex such as tris(1,3-diphenyl-1,3-propanedionato)(monophenanthroline)europium(III) (abbreviation: [Eu(DBM)$_3$(Phen)]) or tris [1-(2-thenoyl)-3,3,3-trifluoroacetonato](monophenanthroline)europium(III) (abbreviation: [Eu(TTA)$_3$(Phen)]). These are compounds exhibiting red phosphorescent light, and have an emission peak at 600 nm to 700 nm. Organometallic iridium complexes having a pyrazine skeleton can provide red light emission with favorable chromaticity.

Besides the above-described phosphorescent compounds, other known phosphorescent substances may be selected and used.

Examples of the TADF material include a fullerene, a derivative thereof, an acridine, a derivative thereof, and an eosin derivative. Furthermore, a metal-containing porphyrin, such as a porphyrin containing magnesium (Mg), zinc (Zn), cadmium (Cd), tin (Sn), platinum (Pt), indium (In), or palladium (Pd), can be given. Examples of the metal-containing porphyrin include a protoporphyrin-tin fluoride complex (SnF$_2$(Proto IX)), a mesoporphyrin-tin fluoride complex (SnF$_2$(Meso IX)), a hematoporphyrin-tin fluoride complex (SnF$_2$(Hemato IX)), a coproporphyrin tetramethyl ester-tin fluoride complex (SnF$_2$(Copro III-4Me)), an octaethylporphyrin-tin fluoride complex (SnF$_2$(OEP)), an etioporphyrin-tin fluoride complex (SnF$_2$(Etio I)), and an octaethylporphyrin-platinum chloride complex (PtCl$_2$OEP), which are represented by the following structural formulae.

[Chemical Formula 1]

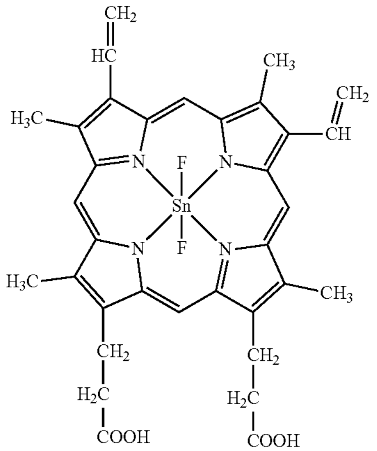

SnF$_2$(Proto IX)

-continued

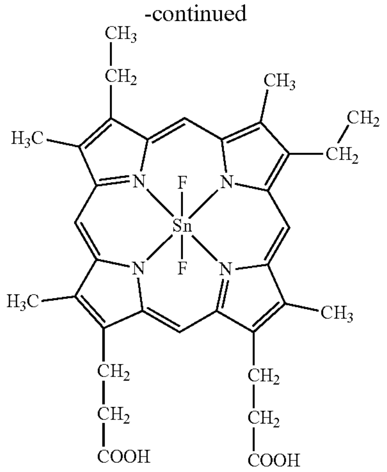

$SnF_2$(Meso IX)

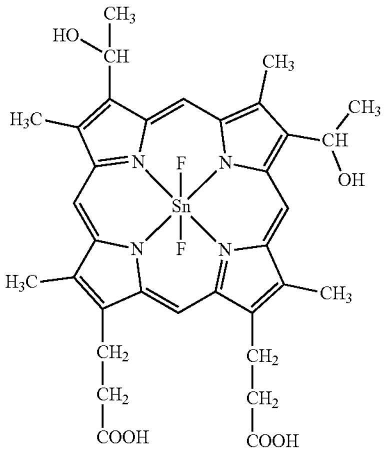

$SnF_2$(Hemato IX)

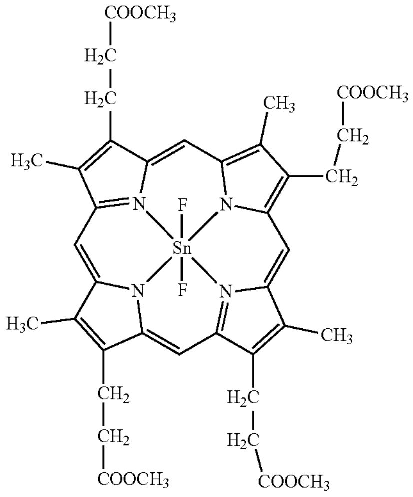

$SnF_2$(Copro III-4Me)

-continued

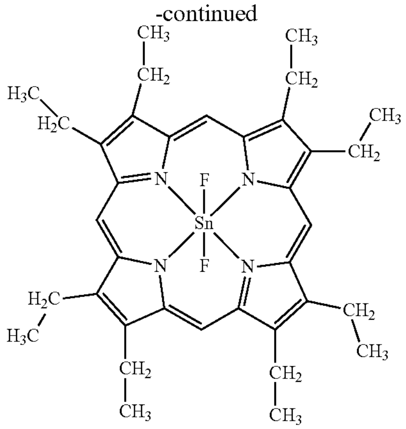

$SnF_2$(OEP)

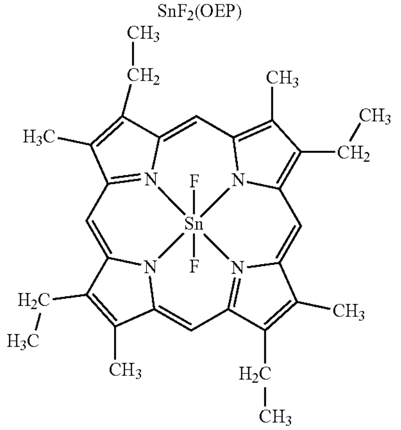

$SnF_2$(Etio I)

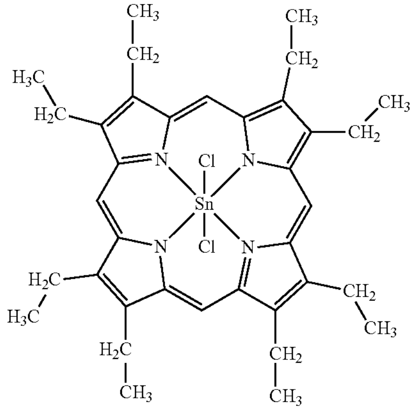

$PtCl_2OEP$

Alternatively, a heterocyclic compound having one or both of a π-electron rich heteroaromatic ring and a π-electron deficient heteroaromatic ring that is represented by the following structural formulae, such as 2-(biphenyl-4-yl)-4,6-bis(12-phenylindolo[2,3-a]carbazol-11-yl)-1,3,5-triazine (abbreviation: PIC-TRZ), 9-(4,6-diphenyl-1,3,5-triazin-2-yl)-9'-phenyl-9H,9'H-3,3'-bicarbazole (abbreviation: PCCzTzn), 9-[4-(4,6-diphenyl-1,3,5-triazin-2-yl)phenyl]-9'-phenyl-9H,9'H-3,3'-bicarbazol (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), or 10-phenyl-10H,10'H-spiro[acridin-9,9'-anthracen]-10'-one (abbreviation: ACRSA) can be used. Such a heterocyclic compound is preferable because of having excellent electron-transport and hole-transport properties owing to a π-electron rich heteroaromatic ring and a π-electron deficient heteroaromatic ring. Among skeletons having the π-electron deficient heteroaromatic ring, a pyridine skeleton, a diazine skeleton (a pyrimidine skeleton, a pyrazine skeleton, and a pyridazine skeleton), and a triazine skeleton are preferred because of their high stability and reliability. In particular, a benzofuropyrimidine skeleton, a benzothienopyrimidine skeleton, a benzofuropyrazine skeleton, and a benzothienopyrazine skeleton are preferred because of their high acceptor properties and high reliability. Among skeletons having the π-electron rich heteroaromatic ring, an acridine skeleton, a phenoxazine skeleton, a phenothiazine skeleton, a furan skeleton, a thiophene skeleton, and a pyrrole skeleton have high stability and reliability; thus, at least one of these skeletons is preferably included. A dibenzofuran skeleton is preferable as a furan skeleton, and a dibenzothiophene skeleton is preferable as a thiophene skeleton. As a pyrrole skeleton, an indole skeleton, a carbazole skeleton, an indolocarbazole skeleton, a bicarbazole skeleton, and a 3-(9-phenyl-9H-carbazol-3-yl)-9H-carbazole skeleton are particularly preferable. Note that a substance in which the π-electron rich heteroaromatic ring is directly bonded to the π-electron deficient heteroaromatic ring is particularly preferred because the electron-donating property of the π-electron rich heteroaromatic ring and the electron-accepting property of the π-electron deficient heteroaromatic ring are both improved, the energy difference between the S1 level and the T1 level becomes small, and thus thermally activated delayed fluorescence can be obtained with high efficiency. Note that an aromatic ring to which an electron-withdrawing group such as a cyano group is bonded may be used instead of the it-electron deficient heteroaromatic ring. As a π-electron rich skeleton, an aromatic amine skeleton, a phenazine skeleton, or the like can be used. As a π-electron deficient skeleton, a xanthene skeleton, a thioxanthene dioxide skeleton, an oxadiazole skeleton, a triazole skeleton, an imidazole skeleton, an anthraquinone skeleton, a skeleton containing boron such as phenylborane or boranthrene, an aromatic ring or a heteroaromatic ring having a cyano group or a nitrile group such as benzonitrile or cyanobenzene, a carbonyl skeleton such as benzophenone, a phosphine oxide skeleton, a sulfone skeleton, or the like can be used. As described above, a π-electron deficient skeleton and a π-electron rich skeleton can be used instead of at least one of the π-electron deficient heteroaromatic ring and the π-electron rich heteroaromatic ring.

[Chemical Formula 2]

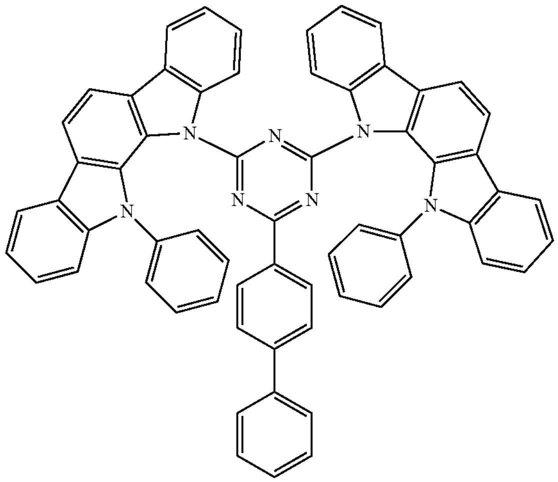

PIC-TRZ

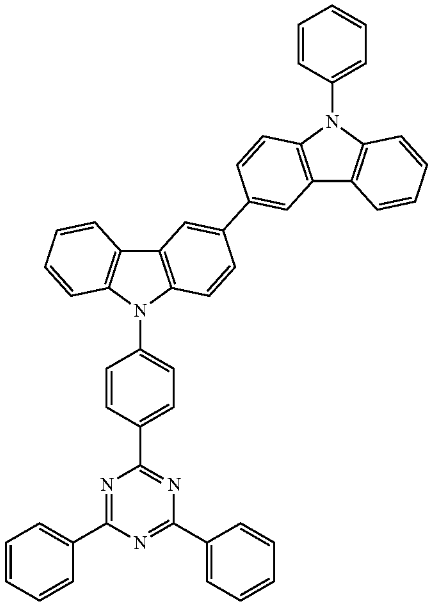

PCCzPTzn

-continued

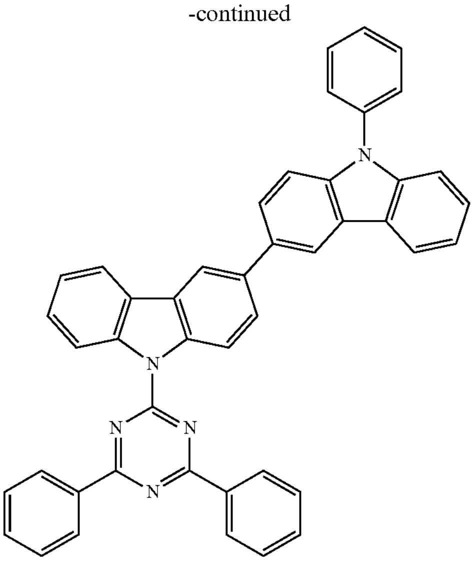

PCCzTzn

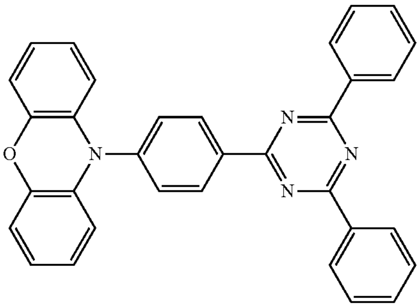

PXZ-TRZ

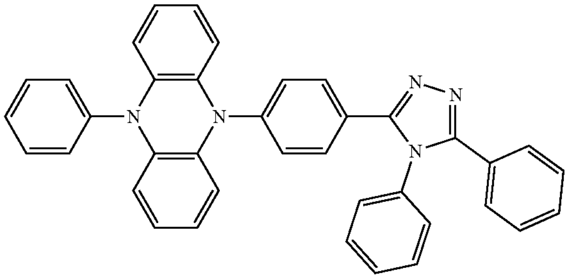

PPZ-3TPT

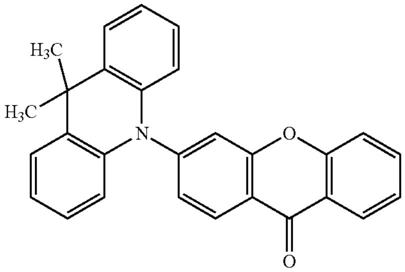

ACRXTN

-continued

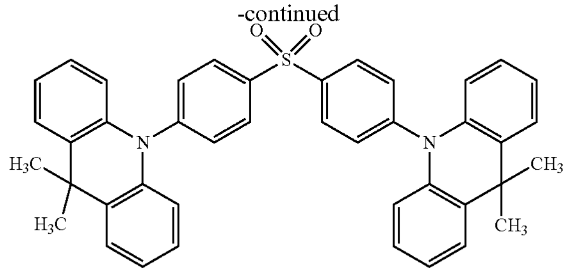

DMAC-DPS

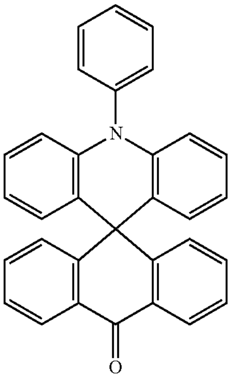

ACRSA

Note that a TADF material is a material having a small difference between the Si level and the T1 level and a function of converting triplet excitation energy into singlet excitation energy by reverse intersystem crossing. Thus, a TADF material can upconvert triplet excitation energy into singlet excitation energy (i.e., reverse intersystem crossing) using a small amount of thermal energy and efficiently generate a singlet excited state. In addition, the triplet excitation energy can be converted into light.

An exciplex whose excited state is formed of two kinds of substances has an extremely small difference between the S1 level and the T1 level and functions as a TADF material capable of converting triplet excitation energy into singlet excitation energy.

A phosphorescent spectrum observed at a low temperature (e.g., 77 K to 10 K) is used for an index of the T1 level. When the level of energy with a wavelength of the line obtained by extrapolating a tangent to the fluorescent spectrum at a tail on the short wavelength side is the Si level and the level of energy with a wavelength of the line obtained by extrapolating a tangent to the phosphorescent spectrum at a tail on the short wavelength side is the T1 level, the difference between the S1 level and the T1 level of the TADF material is preferably smaller than or equal to 0.3 eV, further preferably smaller than or equal to 0.2 eV.

When a TADF material is used as the light-emitting substance, the Si level of the host material is preferably higher than that of the TADF material. In addition, the T1 level of the host material is preferably higher than that of the TADF material.

As the host material in the light-emitting layer, various carrier-transport materials such as materials having an electron-transport property, materials having a hole-transport property, and the above-described TADF materials can be used.

The material having a hole-transport property is preferably an organic compound having an aromatic amine skeleton or a π-electron rich heteroaromatic ring skeleton.

Examples of the substance include compounds having an aromatic amine skeleton such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), and N-phenyl-N-[4-(9-phenyl-9H-carbazol-3-yl)phenyl]spiro-9,9'-bifluoren-2-amine9H (abbreviation: PCBASF); compounds having a carbazole skeleton such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), and 3,3'-bis(9-phenyl-9H-carbazole) (abbreviation: PCCP); compounds having a thiophene skeleton such as 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV); and compounds having a furan skeleton such as 4,4',4"-(benzene-1,3,5-triyl)tri(dibenzofuran) (abbreviation: DBF3P-II) and 4-{3-[3-(9-phenyl-9H-fluoren-9-yl)phenyl]phenyl}dibenzofuran (abbreviation: mmDBFFLBi-II). Among the above materials, the compound having an aromatic amine skeleton and the compound having a carbazole skeleton are preferable because these compounds are highly reliable and have high hole-transport properties to contribute to a reduction in driving voltage. In addition, the organic compounds given as examples of the first substance can also be used.

As the material having an electron-transport property, for example, a metal complex such as bis(10-hydroxybenzo[h]quinolinato)beryllium(II) (abbreviation: $BeBq_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato]zinc(II) (abbreviation: ZnBTZ); or an organic compound having a π-electron deficient heteroaromatic ring is preferable. Examples of the organic compound having a π-electron deficient heteroaromatic ring skeleton include a heterocyclic compound having a polyazole skeleton, such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2"-(1,3,5-benzenetriyl)tris(1-phenyl-1H-benzimidazole) (abbreviation: TPBI), or 2-[3-(dibenzothiophen-4-yl)phenyl]-1-phenyl-1H-benzimidazole (abbreviation: mDBTBIm-II); a heterocyclic compound having a diazine skeleton, such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 4,6-bis[3-(phenanthren-9-yl)phenyl]pyrimidine (abbreviation: 4,6mPnP2Pm), or 4,6-bis[3-(4-dibenzothienyl)phenyl]pyrimidine (abbreviation: 4,6mDBTP2Pm-II); and a heterocyclic compound having a pyridine skeleton, such as 3,5-bis[3-(9H-carbazol-9-yl)phenyl]pyridine (abbreviation: 35DCzPPy) or 1,3,5-tri[3-(3-pyridyl)phenyl]benzene (abbreviation: TmPyPB). Among the above, the heterocyclic compound having a diazine skeleton and the heterocyclic compound having a pyridine skeleton have favorable reliability and thus are preferable. In particular, the heterocyclic compound having a diazine (pyrimidine or pyrazine) skeleton has a high electron-transport property and contributes to a reduction in driving voltage.

As the TADF material that can be used as the host material, the above materials mentioned as the TADF material can also be used. When the TADF material is used as the host material, triplet excitation energy generated in the TADF material is converted into singlet excitation energy by reverse intersystem crossing and transferred to the light-emitting substance, whereby the emission efficiency of the light-emitting device can be increased. Here, the TADF material functions as an energy donor, and the light-emitting substance functions as an energy acceptor.

This is very effective in the case where the light-emitting substance is a fluorescent substance. In that case, the Si level of the TADF material is preferably higher than that of the fluorescent substance in order that high emission efficiency can be achieved. Furthermore, the T1 level of the TADF material is preferably higher than the Si level of the fluorescent substance. Therefore, the T1 level of the TADF material is preferably higher than that of the fluorescent substance.

It is also preferable to use a TADF material that emits light whose wavelength overlaps with the wavelength of a lowest-energy-side absorption band of the fluorescent substance, in which case excitation energy is transferred smoothly from the TADF material to the fluorescent substance and light emission can be obtained efficiently.

In addition, in order to efficiently generate singlet excitation energy from the triplet excitation energy by reverse intersystem crossing, carrier recombination preferably occurs in the TADF material. It is also preferable that the triplet excitation energy generated in the TADF material not be transferred to the triplet excitation energy of the fluorescent substance. For that reason, the fluorescent substance preferably has a protective group around a luminophore (a skeleton which causes light emission) of the fluorescent substance. As the protective group, a substituent having no π bond and a saturated hydrocarbon are preferably used. Specific examples include an alkyl group having 3 to 10 carbon atoms, a substituted or unsubstituted cycloalkyl group having 3 to 10 carbon atoms, and a trialkylsilyl group having 3 to 10 carbon atoms. It is further preferable that the fluorescent substance have a plurality of protective groups. The substituents having no π bond are poor in carrier transport performance, whereby the TADF material and the luminophore of the fluorescent substance can be distanced from each other with little influence on carrier transportation or carrier recombination. Here, the luminophore refers to an atomic group (skeleton) that causes light emission in a fluorescent substance. The luminophore is preferably a skeleton having a π bond, further preferably includes an aromatic ring, and still further preferably includes a condensed aromatic ring or a condensed heteroaromatic ring. Examples of the condensed aromatic ring or the condensed heteroaromatic ring include a phenanthrene skeleton, a stilbene skeleton, an acridone skeleton, a phenoxazine skeleton, and a phenothiazine skeleton. Specifically, a fluorescent substance having any of a naphthalene skeleton, an anthracene skeleton, a fluorene skeleton, a chrysene skeleton, a triphenylene skeleton, a tetracene skeleton, a pyrene skeleton, a perylene skeleton, a coumarin skeleton, a quinacridone skeleton, and a naphthobisbenzofuran skeleton is preferred because of its high fluorescence quantum yield.

In the case where a fluorescent substance is used as the light-emitting substance, a material having an anthracene skeleton is suitably used as the host material. The use of a substance having an anthracene skeleton as the host material for the fluorescent substance makes it possible to obtain a light-emitting layer with high emission efficiency and high durability. Among the substances having an anthracene skeleton, a substance having a diphenylanthracene skeleton, in particular, a substance having a 9,10-diphenylanthracene skeleton, is chemically stable and thus is preferably used as the host material. The host material preferably has a carbazole skeleton because the hole-injection and hole-transport properties are improved; further preferably, the host material has a benzocarbazole skeleton in which a benzene ring is further condensed to carbazole because the HOMO level thereof is shallower than that of carbazole by approximately 0.1 eV and thus holes enter the host material easily. In particular, the host material preferably has a dibenzocarbazole skeleton because the HOMO level thereof is shallower than that of carbazole by approximately 0.1 eV so that holes enter the host material easily, the hole-transport property is improved, and the heat resistance is increased. Accordingly, a substance that has both a 9,10-diphenylanthracene skeleton and a carbazole skeleton (or a benzocarbazole or dibenzocarbazole skeleton) is further preferable as the host material. Note that in terms of the hole-injection and hole-transport properties described above, instead of a carbazole skeleton, a benzofluorene skeleton or a dibenzofluorene skeleton may be used. Examples of such a substance include 9-phenyl-3-[4-(10-phenyl-9-anthryl)phenyl]-9H-carbazole (abbreviation: PCzPA), 3-[4-(1-naphthyl)-phenyl]-9-phenyl-9H-carbazole (abbreviation: PCPN), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), 9-phenyl-10-{4-(9-phenyl-9H-fluoren-9-yl)biphenyl-4'-yl}anthracene (abbreviation: FLPPA), and 9-(1-naphthyl)-10-[4-(2-naphthyl)phenyl]anthracene (abbreviation: αN-βNPAnth). In particular, CzPA, cgDBCzPA, 2mBnfPPA, and PCzPA exhibit excellent properties and thus are preferably selected.

Note that the host material may be a mixture of a plurality of kinds of substances; in the case of using a mixed host material, it is preferable to mix a material having an electron-transport property with a material having a hole-transport property. By mixing the material having an electron-transport property with the material having a hole-transport property, the transport property of the light-emitting layer 113 can be easily adjusted and a recombination region can be easily controlled. The weight ratio of the content of the material having a hole-transport property to the content of the material having an electron-transport property may be 1:19 to 19:1.

Note that a phosphorescent substance can be used as part of the mixed material. When a fluorescent substance is used as the light-emitting substance, a phosphorescent substance can be used as an energy donor for supplying excitation energy to the fluorescent substance.

An exciplex may be formed of these mixed materials. These mixed materials are preferably selected so as to form an exciplex that exhibits light emission whose wavelength overlaps with the wavelength of a lowest-energy-side absorption band of the light-emitting substance, in which case energy can be transferred smoothly and light emission can be obtained efficiently. The use of such a structure is preferable because the driving voltage can also be reduced.

Note that at least one of the materials forming an exciplex may be a phosphorescent substance. In this case, triplet excitation energy can be efficiently converted into singlet excitation energy by reverse intersystem crossing.

Combination of a material having an electron-transport property and a material having a hole-transport property whose HOMO level is higher than or equal to that of the material having an electron-transport property is preferable for forming an exciplex efficiently. In addition, the LUMO level of the material having a hole-transport property is preferably higher than or equal to that of the material having an electron-transport property. Note that the LUMO levels and the HOMO levels of the materials can be derived from the electrochemical characteristics (the reduction potentials and the oxidation potentials) of the materials that are measured by cyclic voltammetry (CV).

The formation of an exciplex can be confirmed by a phenomenon in which the emission spectrum of the mixed film in which the material having a hole-transport property and the material having an electron-transport property are mixed is shifted to the longer wavelength side than the emission spectrum of each of the materials (or has another peak on the longer wavelength side) observed by comparison of the emission spectra of the material having a hole-transport property, the material having an electron-transport property, and the mixed film of these materials, for example. Alternatively, the formation of an exciplex can be confirmed by a difference in transient response, such as a phenomenon in which the transient PL lifetime of the mixed film has longer lifetime components or has a larger proportion of delayed components than that of each of the materials, observed by comparison of transient photoluminescence (PL) of the material having a hole-transport property, the material having an electron-transport property, and the mixed film of these materials. The transient PL can be rephrased as transient electroluminescence (EL). That is, the formation of an exciplex can also be confirmed by a difference in transient response observed by comparison of the transient EL of the material having a hole-transport property, the material having an electron-transport property, and the mixed film of these materials.

In one embodiment of the present invention, the color conversion of light emitted from the light-emitting devices is performed through photoluminescence. When light of the three primary colors is obtained without separate formation of light-emitting devices, light emitted from the light-emitting devices is preferably blue light with the highest energy. When blue light is also obtained by the conversion, light emitted from the light-emitting devices is preferably purple light to light in the ultraviolet region.

The electron-transport layer 114 is a layer containing a substance having an electron-transport property. As the substance having an electron-transport property, it is possible to use any of the above-listed substances having electron-transport properties that can be used as the host material.

Note that the electron-transport layer preferably includes a material having an electron-transport property and an alkali metal, an alkaline earth metal, a compound thereof, or a complex thereof. The electron mobility of the electron-transport layer 114 in the case where the square root of the electric field strength [V/cm] is 600 is preferably higher than or equal to $1\times10^{-7}$ $cm^2/Vs$ and lower than or equal to $5\times10^{-5}$ $cm^2/Vs$. The amount of electrons injected into the light-emitting layer can be controlled by the reduction in the electron-transport property of the electron-transport layer 114, whereby the light-emitting layer can be prevented from having excess electrons. It is particularly preferable to employ this structure when the hole-injection layer is formed using a composite material that includes a material having a hole-transport property with a relatively deep HOMO level of −5.7 eV or higher and −5.4 eV or lower, in which case a long lifetime can be achieved. In this case, the material having an electron-transport property preferably has a HOMO level of −6.0 eV or higher. It is particularly preferable that this structure be employed when the hole-injection layer is formed using a composite material that includes a material having a hole-transport property with a relatively deep HOMO level of −5.7 eV or higher and −5.4 eV or lower, in which case the light-emitting device can have a long lifetime. In this case, the material having an electron-transport property preferably has a HOMO level of −6.0 eV or higher. The material having an electron-transport property is preferably an organic compound having an anthracene skeleton and further preferably an organic compound having both an anthracene skeleton and a heterocyclic skeleton. The heterocyclic skeleton is preferably a nitrogen-containing five-membered ring skeleton or a nitrogen-containing six-membered ring skeleton, and particularly preferably a nitrogen-containing five-membered ring skeleton or a nitrogen-containing six-membered ring skeleton including two heteroatoms in the ring, such as a pyrazole ring, an imidazole ring, an oxazole ring, a thiazole ring, a pyrazine ring, a pyrimidine ring, or a pyridazine ring. In addition, it is preferable that the alkali metal, the alkaline earth metal, the compound thereof, or the complex thereof have a 8-hydroxyquinolinato structure. Specific examples include 8-hydroxyquinolinato-lithium (abbreviation: Liq) and 8-hydroxyquinolinato-sodium (abbreviation: Naq). In particular, a complex of a monovalent metal ion, especially a complex of lithium is preferable, and Liq is further preferable. Note that in the case where the 8-hydroxyquinolinato structure is included, a methyl-substituted product (e.g., a 2-methyl-substituted product or a 5-methyl-substituted product) of the alkali metal, the alkaline earth metal, the compound, or the complex can also be used. There is preferably a difference in the concentration (including 0) of the alkali metal, the alkaline earth metal, the compound thereof, or the complex thereof in the electron-transport layer in the thickness direction.

As the electron-injection layer 115, a layer containing an alkali metal, an alkaline earth metal, or a compound thereof, such as lithium fluoride (LiF), cesium fluoride (CsF), calcium fluoride ($CaF_2$), or 8-hydroxyquinolinato-lithium (Liq) may be provided as the electron-injection layer 115 between the electron-transport layer 114 and the cathode 102. For example, an electride or a layer that is formed using a substance having an electron-transport property and that includes an alkali metal, an alkaline earth metal, or a compound thereof can be used as the electron-injection layer 115. Examples of the electride include a substance in which electrons are added at high concentration to calcium oxide-aluminum oxide.

Note that as the electron-injection layer 115, it is possible to use a layer including a substance that has an electron-transport property (preferably an organic compound having a bipyridine skeleton) and includes a fluoride of the alkali metal or the alkaline earth metal at a concentration higher than that at which the electron-injection layer 115 becomes in a microcrystalline state (50 wt % or higher). Since the layer is a low refractive index layer, a light-emitting device including the layer can have high external quantum efficiency.

The effect of introducing the layer with a low refractive index is increased when the low refractive index layer is provided on the side of the electrode through which light is extracted. In the structure where the color conversion layer is provided on the cathode side, the effect is larger when the low refractive index layer is provided in the position between the light-emitting layer and the cathode than when the low refractive index layer is provided in the position between the anode and the light-emitting layer; further preferably, the low refractive index layer is provided in each position because the much larger effect is obtained. This effect improves device characteristics when color conversion is performed, so that a color conversion light-emitting device with high efficiency can be obtained.

Instead of the electron-injection layer 115, the charge-generation layer 116 may be provided (FIG. 2B). The charge-generation layer refers to a layer capable of injecting holes into a layer in contact with the cathode side of the charge-generation layer and electrons into a layer in contact with the anode side thereof when a potential is applied. The charge-generation layer 116 includes at least a p-type layer 117. The p-type layer 117 is preferably formed using any of the composite materials given above as examples of materials that can be used for the hole-injection layer 111. The p-type layer 117 may be formed by stacking a film including the above-described acceptor material as a material included in the composite material and a film including a hole-transport material. When a potential is applied to the p-type layer 117, electrons are injected into the electron-transport layer 114 and holes are injected into the cathode 102; thus, the light-emitting device operates. When a potential is applied to the p-type layer 117, electrons are injected into the electron-transport layer 114 and holes are injected into the cathode 102; thus, the light-emitting device operates. Since the organic compound of one embodiment of the present invention has a low refractive index, using the organic compound for the P-type layer 117 enables the light-emitting device to have high external quantum efficiency.

Note that the charge-generation layer 116 preferably includes one or both of an electron-relay layer 118 and an electron-injection buffer layer 119 in addition to the p-type layer 117.

The electron-relay layer 118 includes at least the substance having an electron-transport property and has a function of preventing an interaction between the electron-injection buffer layer 119 and the p-type layer 117 and smoothly transferring electrons. The LUMO level of the substance having an electron-transport property included in the electron-relay layer 118 is preferably between the LUMO level of the acceptor substance in the p-type layer 117 and the LUMO level of a substance included in a layer of the electron-transport layer 114 that is in contact with the charge-generation layer 116. As a specific value of the energy level, the LUMO level of the substance having an electron-transport property in the electron-relay layer 118 is preferably higher than or equal to −5.0 eV, further preferably higher than or equal to −5.0 eV and lower than or equal to −3.0 eV. Note that as the substance having an electron-transport property in the electron-relay layer 118, a phthalocyanine-based material or a metal complex having a metal-oxygen bond and an aromatic ligand is preferably used.

The electron-injection buffer layer 119 can be formed using a substance having a high electron-injection property, e.g., an alkali metal, an alkaline earth metal, a rare earth metal, or a compound thereof (an alkali metal compound (including an oxide such as lithium oxide, a halide, and a carbonate such as lithium carbonate or cesium carbonate), an alkaline earth metal compound (including an oxide, a halide, and a carbonate), or a rare earth metal compound (including an oxide, a halide, and a carbonate)).

In the case where the electron-injection buffer layer 119 contains the substance having an electron-transport property and a donor substance, an organic compound such as tetrathianaphthacene (abbreviation: TTN), nickelocene, or decamethylnickelocene can be used as the donor substance, as well as an alkali metal, an alkaline earth metal, a rare earth metal, or a compound thereof (e.g., an alkali metal compound (including an oxide such as lithium oxide, a halide, and a carbonate such as lithium carbonate and cesium carbonate), an alkaline earth metal compound (including an oxide, a halide, and a carbonate), or a rare earth metal compound (including an oxide, a halide, and a carbonate)). As the substance with an electron-transport property, a material similar to the above-described material for the electron-transport layer 114 can be used.

As a substance of the cathode 102, any of metals, alloys, and electrically conductive compounds with a low work function (specifically, lower than or equal to 3.8 eV), mixtures thereof, and the like can be used. Specific examples of such a cathode material include elements belonging to Group 1 and Group 2 of the periodic table, such as alkali metals (e.g., lithium (Li) and cesium (Cs)), magnesium (Mg), calcium (Ca), and strontium (Sr), alloys containing these elements (e.g., MgAg and AlLi), rare earth metals such as europium (Eu) and ytterbium (Yb), and alloys containing these rare earth metals. However, when the electron-injection layer is provided between the cathode 102 and the electron-transport layer, any of a variety of conductive materials such as Al, Ag, ITO, or indium oxide-tin oxide containing silicon or silicon oxide can be used for the cathode 102 regardless of the work function. Films of these conductive materials can be formed by a dry process such as a vacuum evaporation method or a sputtering method, an ink-jet method, a spin coating method, or the like. Alternatively, a wet process using a sol-gel method or a wet process using a paste of a metal material may be employed.

Any of a variety of methods can be used for forming the EL layer 103, regardless of a dry method or a wet method. For example, a vacuum evaporation method, a gravure printing method, an offset printing method, a screen printing method, an ink-jet method, a spin coating method, or the like may be used.

Different methods may be used to form the electrodes or the layers described above.

The structure of the layers provided between the anode 101 and the cathode 102 is not limited to the above-described structure. Preferably, a light-emitting region where holes and electrons recombine is positioned away from the anode 101 and the cathode 102 so as to inhibit quenching due to the proximity of the light-emitting region and a metal used for electrodes or carrier-injection layers.

Furthermore, in order that transfer of energy from an exciton generated in the light-emitting layer can be inhibited, preferably, the hole-transport layer or the electron-transport layer, which is in contact with the light-emitting layer 113, particularly a carrier-transport layer closer to the recombination region in the light-emitting layer 113, is preferably formed using a substance having a wider band gap than the light-emitting material of the light-emitting layer or the light-emitting material included in the light-emitting layer.

Next, an embodiment of a light-emitting device with a structure in which a plurality of light-emitting units are stacked (also referred to as a stacked device or a tandem device) is described with reference to FIG. 2C. This light-emitting device includes a plurality of light-emitting units between an anode and a cathode. One light-emitting unit has substantially the same structure as the EL layer 103 illustrated in FIG. 2A. In other words, the light-emitting device illustrated in FIG. 2C can be called a light-emitting device including a plurality of light-emitting units, and the light-emitting device illustrated in FIG. 2A or FIG. 2B can be called a light-emitting device including one light-emitting unit.

In FIG. 2C, a first light-emitting unit 511 and a second light-emitting unit 512 are stacked between an anode 501 and a cathode 502, and a charge-generation layer 513 is provided between the first light-emitting unit 511 and the second light-emitting unit 512. The anode 501 and the cathode 502 correspond, respectively, to the anode 101 and the cathode 102 illustrated in FIG. 2A, and the materials given in the description for FIG. 2A can be used. Furthermore, the first light-emitting unit 511 and the second light-emitting unit 512 may have the same structure or different structures.

The charge-generation layer 513 has a function of injecting electrons into one of the light-emitting units and injecting holes into the other of the light-emitting units when a voltage is applied to the anode 501 and the cathode 502. That is, in FIG. 2C, the charge-generation layer 513 injects electrons into the first light-emitting unit 511 and holes into the second light-emitting unit 512 when voltage is applied such that the potential of the anode becomes higher than the potential of the cathode.

The charge-generation layer 513 preferably has a structure similar to that of the charge-generation layer 116 described with reference to FIG. 2B. A composite material of an organic compound and a metal oxide has an excellent carrier-injection property and an excellent carrier-transport property; thus, low-voltage driving and low-current driving can be achieved. Note that in the case where the anode-side surface of a light-emitting unit is in contact with the charge-generation layer 513, the charge-generation layer 513 can also serve as a hole-injection layer of the light-emitting unit; therefore, a hole-injection layer is not necessarily provided in the light-emitting unit.

In the case where the electron-injection buffer layer 119 is provided in the charge-generation layer 513, the electron-injection buffer layer 119 serves as an electron-injection layer in the light-emitting unit on the anode side; therefore, an electron-injection layer is not necessarily formed in the light-emitting unit on the anode side.

The light-emitting device having two light-emitting units is described with reference to FIG. 2C; however, one embodiment of the present invention can also be applied to a light-emitting device in which three or more light-emitting units are stacked. With a plurality of light-emitting units partitioned by the charge-generation layer 513 between a pair of electrodes as in the light-emitting device of this embodiment, it is possible to provide a long-life light-emitting apparatus which can emit light with high luminance at a low current density. A light-emitting apparatus which can be driven at a low voltage and has low power consumption can be provided.

Figure 3:
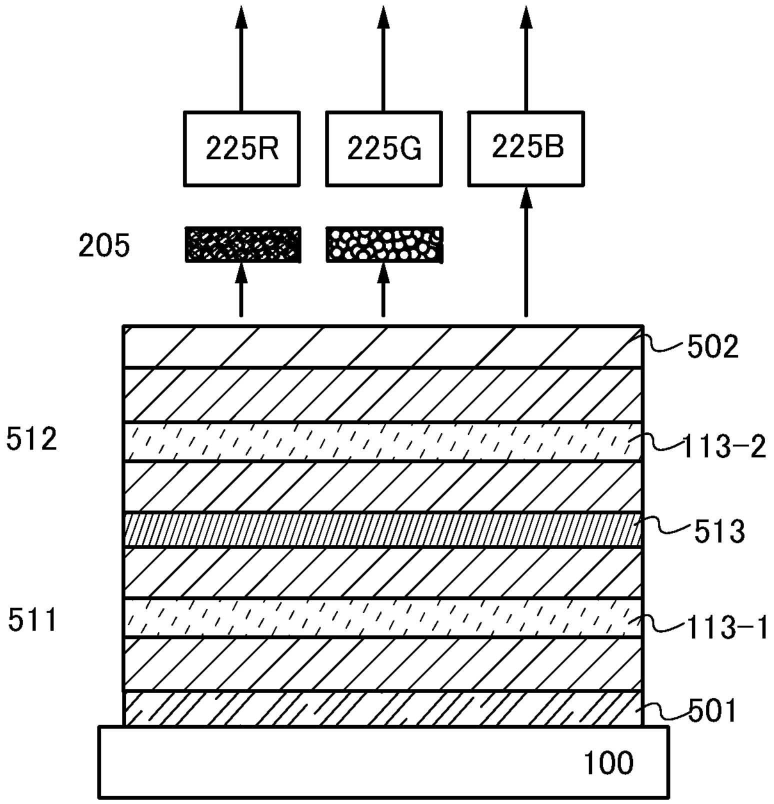
FIG. 3 is a schematic view of a light-emitting device.

Like FIG. 2C, FIG. 3 is a schematic view of a light-emitting apparatus in which a light-emitting device including a plurality of light-emitting units is applied to one embodiment of the present invention. In FIG. 3, the anode 501 is formed over the substrate 100, and the first light-emitting unit 511 including a first light-emitting layer 113-1 and the second light-emitting unit 512 including a second light-emitting layer 113-2 are stacked with the charge-generation layer 513 provided therebetween. Light is emitted from the light-emitting device directly or through the color conversion layer 205. Note that the color purity may be improved through color filters 225R, 225G, and 225B. Note that FIG. 3 illustrates the structure where the color filter 225B is provided; however, one embodiment of the present invention is not limited to this. For example, in FIG. 3, an overcoat layer may be provided instead of the color filter 225B. For the overcoat layer, an organic resin material, typically an acrylic-based resin or a polyimide-based resin may be used. In this specification and the like, the color filter layer may be referred to as a coloring layer and the overcoat layer may be referred to as a resin layer. Thus, the color filter 225R may be referred to as a first coloring layer and the color filter 225G may be referred to as a second coloring layer.

The above-described layers or electrodes such as the EL layer 103, the first light-emitting unit 511, the second light-emitting unit 512, and the charge-generation layer can be formed by a method such as an evaporation method (including a vacuum evaporation method), a droplet discharge method (also referred to as an ink-jet method), a coating method, or a gravure printing method, for example. A low molecular material, a middle molecular material (including an oligomer and a dendrimer), or a high molecular material may be included in the layers or electrodes.

Here, in consideration of color reproducibility of a full color display, in order to express a wider color gamut, it is essential to obtain light with high color purity. Light emitted from an organic compound has a broader spectrum than light emitted from an inorganic compound in many cases, and the spectrum is preferably narrowed with a microcavity structure in order to obtain light emission with sufficiently high color purity.

Actually, a light-emitting device appropriately using a suitable dopant and a microcavity structure can provide blue light emission that corresponds to the color gamut of Rec.2020, which is defined by the BT.2020 standard and the BT.2100 standard. When the microcavity structure of the light-emitting device is configured to enhance blue light, a light-emitting apparatus with high color purity and high efficiency can be obtained.

The light-emitting device having a microcavity structure includes a reflective electrode and a transfective electrode as a pair of electrodes of the light-emitting device. The reflective electrode and the transfective electrode correspond to the anode 101 and the cathode 102 which are described above. One of the anode 101 and the cathode 102 may be the reflective electrode and the other may be the transflective electrode.

In the light-emitting device having a microcavity structure, light emitted in all directions from a light-emitting layer in the EL layer is reflected and resonated by the reflective electrode and the transfective electrode, so that a certain wavelength of light is amplified and the light has directivity.

The reflective electrode has a visible light reflectivity of 40% to 100%, preferably 70% to 100% and a resistivity of $1\times10^{-2}$ Ωcm or lower. Examples of the material include for the reflective electrode include aluminum (Al) and an alloy containing Al. Examples of the alloy containing Al include an alloy containing Al and L (L represents one or more of titanium (Ti), neodymium (Nd), nickel (Ni), and lanthanum (La)), such as an alloy containing Al and Ti and an alloy containing Al, Ni, and La. Aluminum has low resistance and high light reflectivity. Aluminum is included in earth's crust in large amount and is inexpensive; therefore, use of aluminum can reduce costs for manufacturing a light-emitting device with aluminum. Alternatively, silver (Ag), an alloy of Ag and N (N represents one or more of yttrium (Y), Nd, magnesium (Mg), ytterbium (Yb), Al, Ti, gallium (Ga), zinc (Zn), indium (In), tungsten (W), manganese (Mn), tin (Sn), iron (Fe), Ni, copper (Cu), palladium (Pd), iridium (Ir), and gold (Au)), or the like can be used. Examples of the alloy containing silver include an alloy containing silver, palladium, and copper, an alloy containing silver and copper, an alloy containing silver and magnesium, an alloy containing silver and nickel, an alloy containing silver and gold, and an alloy containing silver and ytterbium. Besides, a transition metal such as tungsten, chromium (Cr), molybdenum (Mo), copper, or titanium can be used.

Note that between the reflective electrode and the EL layer 103, a transparent electrode layer can be formed as an optical distance adjustment layer with use of a conductive material having a light-transmitting property, and the anode 101 can consist of the reflective electrode and the transparent electrode. With the transparent electrode layer, the optical distance (cavity length) of the microcavity structure can be also adjusted. Examples of the conductive material having a light-transmitting property include metal oxides such as indium tin oxide (hereinafter referred to as ITO), indium tin oxide containing silicon or silicon oxide (abbreviation: ITSO), indium oxide-zinc oxide (indium zinc oxide), indium oxide-tin oxide containing titanium, indium titanium oxide, and indium oxide containing tungsten oxide and zinc oxide.

The transflective electrode has a visible light reflectivity of 20% to 80%, preferably 40% to 70%, and a resistivity of $1\times10^{-2}$ cm or lower. The semi-transmissive semi-reflective electrode can be formed using one or more kinds of conductive metals and alloys, conductive compounds, and the like. Specifically, a metal oxide, such as indium tin oxide (hereinafter referred to as ITO), indium tin oxide containing silicon or silicon oxide (ITSO), indium oxide-zinc oxide (indium zinc oxide), indium oxide-tin oxide containing titanium, indium-titanium oxide, or indium oxide containing tungsten oxide and zinc oxide, can be used. A metal thin film having a thickness that allows transmission of light (preferably, a thickness greater than or equal to 1 nm and less than or equal to 30 nm) can also be used. As the metal, Ag, an alloy of Ag and Al, an alloy of Ag and Mg, an alloy of Ag and Au, an alloy of Ag and Yb, or the like can be used.

The reflective electrode can be either one of the anode 101 and the cathode 102 and the semi-transmissive and semi-reflective electrode may be the other.

Note that when the light-emitting device has atop emission structure, the light extraction efficiency can be improved by providing an organic cap layer over a surface of the cathode 102 which is opposite to a surface of the cathode 102 in contact with the EL layer 103. The organic cap layer can reduce a difference in a refractive index at an interface between the electrode and the air; thus, the light extraction efficiency can be improved. The thickness of the organic cap layer is preferably greater than or equal to 5 nm and less than or equal to 120 nm, further preferably greater than or equal to 30 nm and less than or equal to 90 nm. An organic compound layer including a substance with a molecular weight of greater than or equal to 300 and less than or equal to 1200 is preferably used as the organic cap layer. Furthermore, the organic cap layer is preferably formed using a conductive organic material. Although the transflective electrode needs to be thinned to have a certain light-transmitting property, its conductivity might be decreased when the transflective electrode is thin. With use of a conductive material for the organic cap layer, the light extraction efficiency can be improved, the conductivity can be secured, and the manufacturing yield of the light-emitting device can be improved. Note that an organic compound with less absorption in the visible region can be preferably used. For the organic cap layer, the organic compound used for the EL layer 103 can also be used. In that case, the organic cap layer can be formed with a deposition apparatus or a deposition chamber for forming the EL layer 103, so that the organic cap layer can be easily formed.

In the light-emitting device, by changing the thickness of the transparent electrode provided in contact with the above-described reflective electrode and the thicknesses of carrier-transport layers, such as a hole-injection layer and a hole-transport layer, the optical path length (cavity length) between the reflective electrode and the transflective electrode can be changed. Thus, light with a wavelength that is resonated between the reflective electrode and the transflective electrode can be intensified while light with a wavelength that is not resonated therebetween can be attenuated.

Note that in the microcavity structure, the optical path length (the optical distance) between an interface of the reflective electrode with the EL layer and an interface of the transflective electrode with the EL layer is preferably integral multiple of $\lambda/2$ when a wavelength desired to be amplified is $\lambda$ nm.

In light emission, light that is reflected back by the reflective electrode (first reflected light) considerably interferes with light that directly enters the transflective electrode from the light-emitting layer (first incident light). For this reason, the optical path length between the reflective electrode and the light-emitting layer is preferably adjusted to $(2n-1)\lambda/4$ (n is a natural number of 1 or larger and $\lambda$ is a wavelength of light to be amplified). By adjusting the optical path length, the phases of the first reflected light and the first incident light can be aligned with each other and the light emitted from the light-emitting layer can be further amplified.

With the microcavity structure, emission intensity with a specific wavelength in the front direction can be increased, whereby power consumption can be reduced. Furthermore, the probability of light incident to the color conversion layer can be increased.

Light whose spectrum is narrowed with a microcavity structure is known to have high directivity perpendicularly to a screen. On the other hand, light emitted through the color conversion layer using a QD hardly has directivity because light from a QD or a light-emitting organic compound is emitted in all directions. A color conversion layer causes some loss of light emitted from a light-emitting device, and thus in a display using a color conversion layer, blue light, which has the shortest wavelength, is obtained directly from a light-emitting device and green light and red light are obtained through color conversion layers. Therefore, differences in light distribution characteristics are generated between a blue pixel and a green and a red pixel, and. Such large differences in light distribution characteristics cause viewing angle dependence, which is directly linked to deterioration in display quality. In particular, the adverse influence is large in the case where a large number of people view a large-sized screen, such as a TV.

In view of the above, in the light-emitting apparatus of one embodiment of the present invention, a pixel without a color conversion layer may be provided with a structure having a function of scattering light or a pixel with a color conversion layer may be provided with a structure for imparting directivity.

The structure having a function of scattering light may be provided on an optical path of light emitted from the light-emitting device to the outside of the light-emitting apparatus. Although light emitted from the light-emitting device having a microcavity structure has high directivity, when light is scattered by the structure having a function of scattering a light, its directivity can be reduced or the scattered light can have directivity; as a result, light passing through a color conversion layer and light without through a color conversion layer can have similar light distribution characteristics. Accordingly, the viewing angle dependence can be reduced.

Figure 4A:
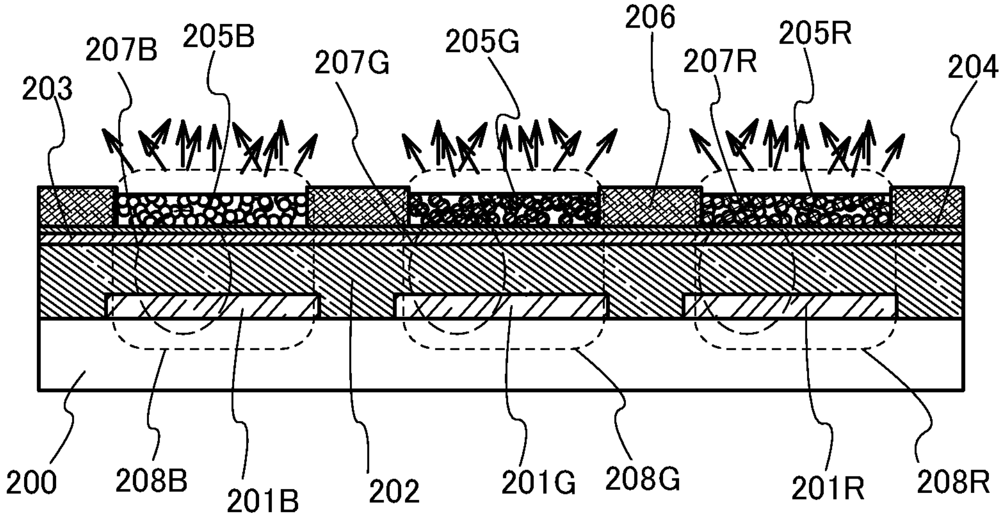
FIG. 4A to FIG. 4C are conceptual views of a light-emitting apparatus.
Figure 4B:
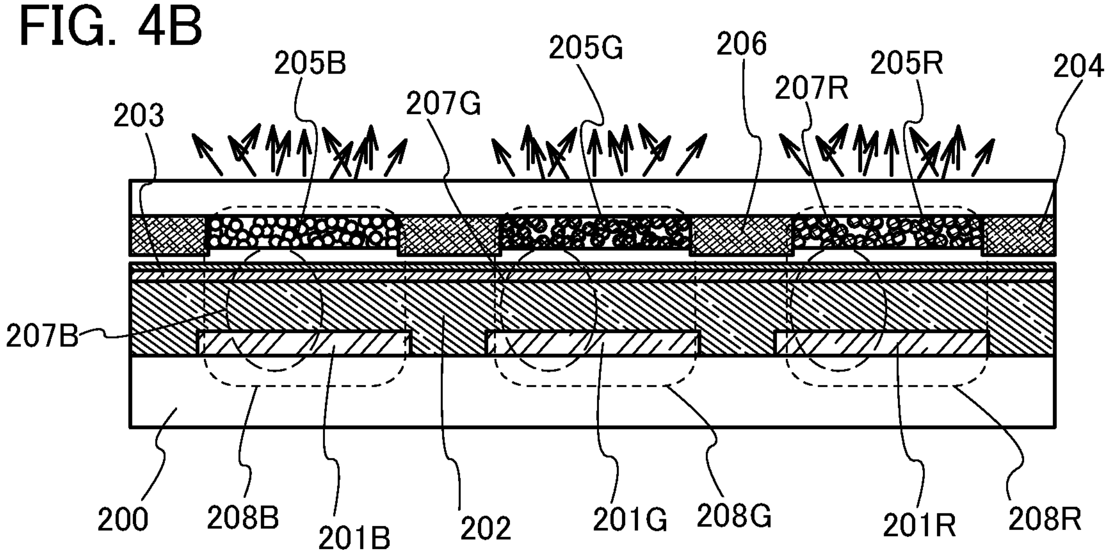
Figure 4C:
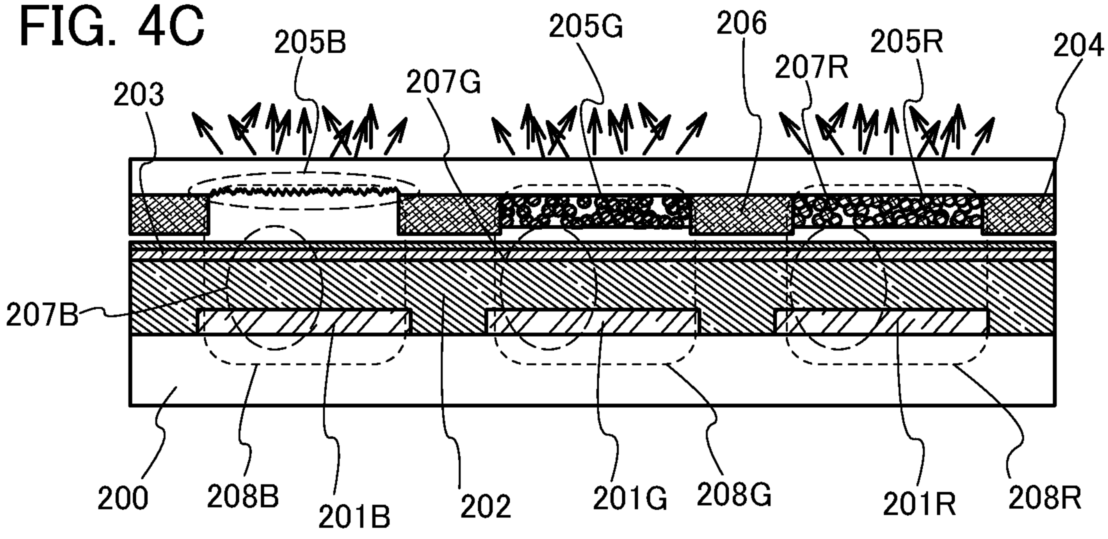

FIG. 4A to FIG. 4C illustrate a structure in which a structure 205B having a function of scattering light emitted from the first light-emitting device 207B is provided in the first pixel 208B. The structure 205B having a function of scattering light emitted from the first light-emitting device 207B may be a layer including a first substance that scatters light emitted from the first light-emitting device, as illustrated in FIG. 4A and FIG. 4B or may have a structure body which scatters light emitted from the first light-emitting device, as illustrated in FIG. 4C.

Figure 5A:
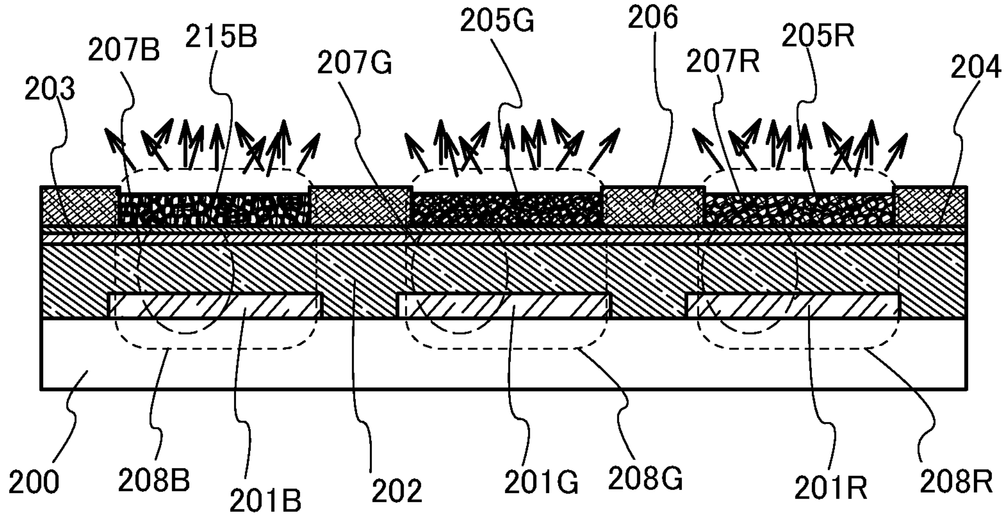
FIG. 5A to FIG. 5C are conceptual views of a light-emitting apparatus.
Figure 5B:
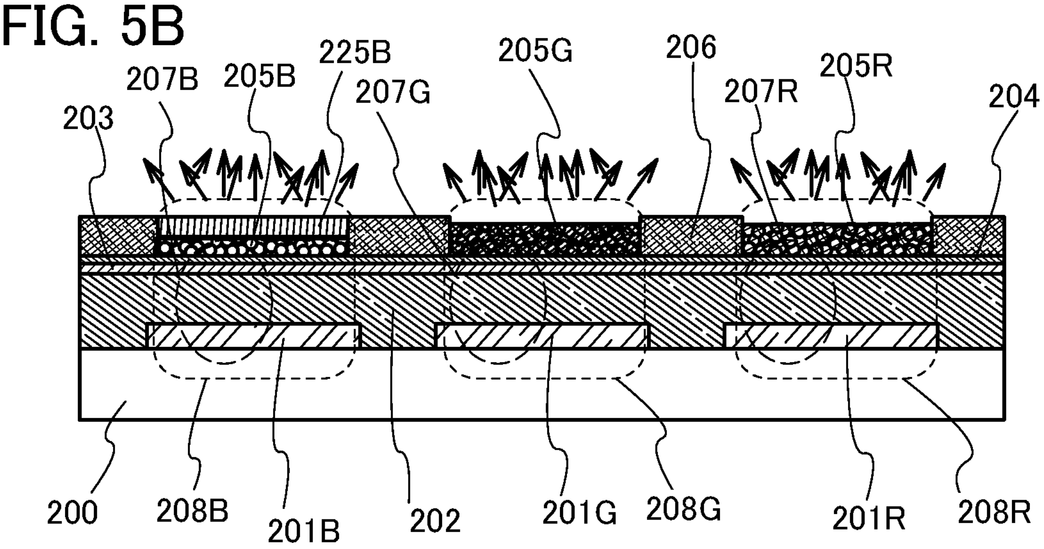
Figure 5C:
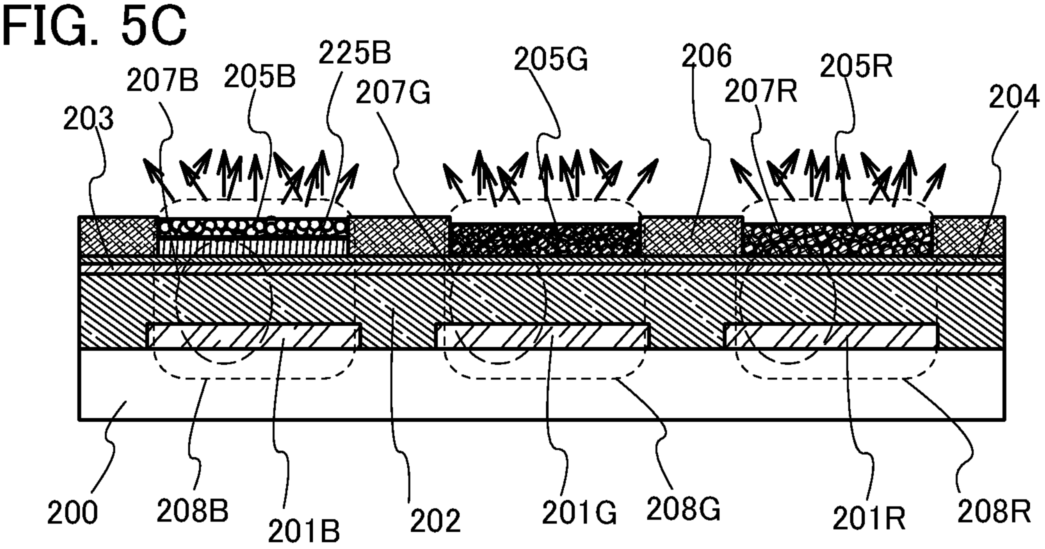

FIG. 5A to FIG. 5C illustrate modification examples. FIG. 5A illustrates a state including a layer also serving as a blue color filter (a color filter 215B) instead of the structure 225B having a function of scattering light illustrated in FIG. 4A. FIG. 5B and FIG. 5C illustrate states each including the structure 225B having a function of scattering light and the blue color filter 215B. Note that the blue color filter 215B may be in contact with the structure 225B having a function of scattering light, as illustrated in FIG. 5B and FIG. 5C, or may be formed on another structure body such as a sealing substrate. Thus, the light-emitting apparatus has improved color purity while scattering light having directivity. Furthermore, reflection of external light can also be suppressed, leading to preferable display.

Light emitted from the first pixel 208B can be light with low directivity because light emitted from the first light-emitting device 207B passes through the structure 225B. This relieves a difference in light distribution characteristics depending on colors, and leads to a light-emitting apparatus with a high display quality.

Figure 6A:
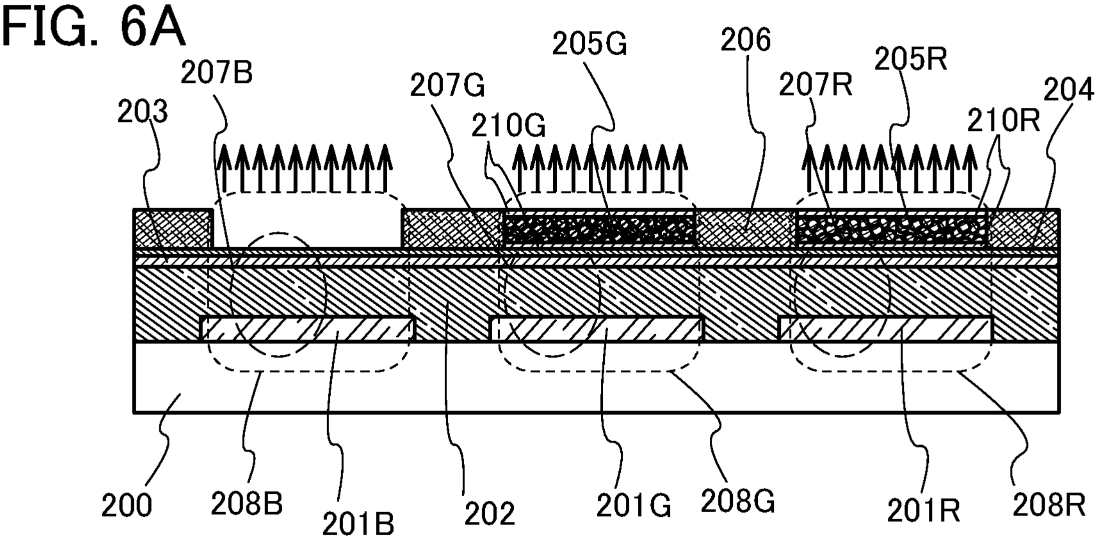
FIG. 6A and FIG. 6B are conceptual views of a passive matrix light-emitting apparatus.
Figure 6B:
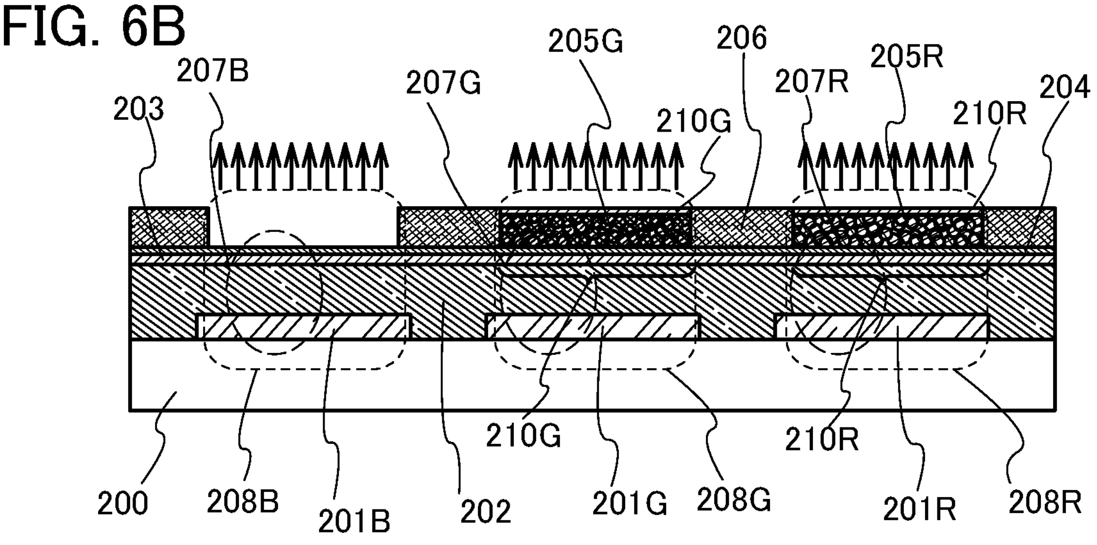

In light-emitting apparatuses of one embodiment of the present invention illustrated in FIG. 6A and FIG. 6B, a means 210G and a means 210R for imparting the directivity to light emitted from the first color conversion layer are provided. There is no limitation on the means for imparting directivity to light emitted from the first color conversion layer. For example, a microcavity structure may be formed by forming a transflective layer such that a color conversion layer is interposed. Note that FIG. 6A illustrates a state in which transflective layers are formed below and above a color conversion layer, and FIG. 6B illustrates a state in which the transflective layer of the color conversion layer, which is on the light-emitting device side, is also used as a cathode (transflective electrode) of the light-emitting device.

Light from the second pixel 208G and the third pixel 208R can be light with high directivity by providing means 210G and 210R for imparting directivity to light emitted from the color conversion layer. This relieves a difference in alignment characteristics depending on colors, and leads to a light-emitting apparatus with high display quality.

With the use of a QD as the substance that absorbs light and emits light in the color conversion layer, when the color conversion layer has an appropriate refractive index, i.e., when the QDs are dispersed into a resin having an appropriate refractive index, a larger amount of light emitted from the light-emitting layer can reach the color conversion layer. In general, a layer provided in contact with the electrode having a light-transmitting property to improve light extraction efficiency employs a material having a relatively high refractive index. However, there are only limited choices of organic compounds having a higher refractive index than many organic compounds. Here, the present inventors have found that the refractive index of the resin that exerts the effect of improving light extraction efficiency can be reduced by the low refractive index layer provided inside the EL layer. Specifically, in a comparative pixel including a light-emitting device without a low refractive index layer inside the EL layer, when the refractive index of the resin in which QDs are dispersed is higher than or equal to 2.20, the amount of the light becomes a maximum value. Meanwhile, in a pixel including a light-emitting device including the low refractive index layer inside the EL layer, when the refractive index of the resin is approximately 2.00, the amount of the light becomes a maximum value, and when the refractive index is 1.80 or higher, the amount of light reaching the color conversion layer is larger than the maximum amount of light reaching the color conversion layer in the comparative pixel. Furthermore, the amount of light reaching the color conversion layer is improved within a wide range of ordinary refractive index of the resin of 1.40 to 2.10 inclusive.

Since the range of the refractive index higher than or equal to 1.80 and lower than or equal to 2.00 covers the refractive indices of many organic compounds used for organic EL devices, a wide range of material choices is available. By contrast, few organic compounds have a refractive index higher than or equal to 2.20. In addition, the efficiency in the comparative pixel decreases when the resin with a refractive index lower than or equal to 2.20 is used. Hence, when QDs are dispersed in a resin with a refractive index around 1.90 in the volume zone of the refractive indices of organic compounds, the efficiency differs from that of the pixel using the low refractive index layer by as much as 14% to 17%.

The above reveals that the combination of the light-emitting device including the low refractive index layer and the color conversion layer using a QD brings not only the efficiency-improving effect due to the low refractive index layer but also the effect of increasing the range of material choices of the resin in which the QD is dispersed and the unique effect of maximizing the efficiency-improving effect with the use of a resin having a normal refractive index.

Note that the readiness of the use of the resin having a normal refractive index means that a material that sufficiently satisfies the other requisite performances can be selected from a very wide range. The structure of one embodiment of the present invention achieves a variety of benefits, such as obtaining a light-emitting apparatus whose efficiency is increased by selecting a resin with a high light-transmitting property, obtaining a light-emitting apparatus whose reliability is improved by selecting a resin with good durability, and obtaining a light-emitting apparatus with low manufacturing cost due to the use of an inexpensive resin.

An effect similar to the above can be obtained also in the structure in which the color conversion layer and the light-emitting device are bonded with a resin having an appropriate refractive index. This increases the light reaching the color conversion layer, so that the light-emitting apparatus can have high efficiency. The resin having an appropriate refractive index may also serve as the protective layer 204 or may be provided between the protective layer 204 and the color conversion layer. Note that the refractive index of the resin is assumed to be based on the above description of the refractive index of the resin in which QDs are dispersed.

Reducing the refractive index of the resin in which QDs are dispersed can promise higher extraction efficiency of light released from the color conversion layer. When a dielectric with a refractive index higher than 1 emits light in the air, the light-trapping effect according to Snell's law is caused and this light-trapping effect is decreased by reducing the refractive index. Thus, reducing the refractive index of the resin in which QDs are dispersed improves the extraction efficiency of light derived from the color conversion layer using the QD.

In the device including the low refractive index layer inside the EL layer, using a material with a low refractive index for the resin in which QDs are dispersed increases not only light reaching the color conversion layer using the QDs but also the amount of light released from the color conversion layer using the QDs to the outside of the device. Thus, a color conversion light-emitting device with high efficiency can be manufactured.

Embodiment 2

This embodiment describes an organic compound having a hole-transport property which can be used for the hole-transport region 120 (the hole-injection layer 111, the hole-transport layer 112, and the like) and an organic compound having an electron-transport property which can be used for the electron-transport region 121 (the electron-transport layer 114, the electron-injection layer 115, and the like) in the light-emitting device 207 in Embodiment 1.

The low refractive index layer can be formed by formation of each functional layer using a substance having a relatively low refractive index. However, in general, a high carrier-transport property and a low refractive index have a trade-off relationship. This is because the carrier-transport property of an organic compound largely depends on an unsaturated bond, and an organic compound having many unsaturated bonds tends to have a high refractive index. Even having a low refractive index, a material with a low carrier-transport property causes a problem such as a decrease in emission efficiency or reliability due to an increase in driving voltage or poor carrier balance, so that a light-emitting device with favorable characteristics cannot be obtained. Furthermore, even when a material has a sufficient carrier-transport property and a low refractive index, a highly reliable light-emitting device cannot be obtained if the material has a problem in the glass transition temperature (Tg) or the resistance due to an unstable structure.

As an organic compound having a hole-transport property, a monoamine compound including a first aromatic group, a second aromatic group, and a third aromatic group, in which the first aromatic group, the second aromatic group, and the third aromatic group are bonded to the same nitrogen atom, is preferably used.

In the monoamine compound, the proportion of carbon atoms forming a bond by the sp3 hybrid orbitals to the total number of carbon atoms in the molecule is preferably higher than or equal to 23% and lower than or equal to 55%. In addition, it is preferable that the integral value of signals at lower than 4 ppm exceed the integral value of signals at 4 ppm or higher in the results of $^1$H-NMR measurement conducted on the monoamine compound.

The monoamine compound preferably has at least one fluorene skeleton. One or more of the first aromatic group, the second aromatic group, and the third aromatic group are preferably a fluorene skeleton.

Examples of the above-described organic compound having a hole-transport property include organic compounds having structures represented by General Formulae ($G_{h1}1$) to ($G_{h1}4$) shown below.

[Chemical Formula 3]

($G_{h1}1$)

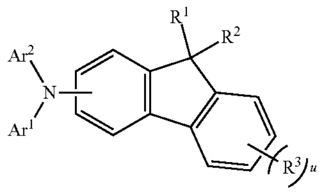

In General Formula ($G_{h1}1$), $Ar^1$ and $Ar^2$ each independently represent a benzene ring or a substituent in which two or three benzene rings are bonded to each other. Note that one or both of $Ar^1$ and $Ar^2$ have one or more hydrocarbon groups each having 1 to 12 carbon atoms forming a bond only by the sp3 hybrid orbitals. The total number of carbon atoms contained in all of the hydrocarbon groups bonded to $Ar^1$ and $Ar^2$ is 8 or more and the total number of carbon atoms contained in all of the hydrocarbon groups bonded to either $Ar^1$ or $Ar^2$ is 6 or more. Note that in the case where a plurality of straight-chain alkyl groups each having one or two carbon atoms are bonded to $Ar^1$ or $Ar^2$ as the hydrocarbon groups, the straight-chain alkyl groups may be bonded to each other to form a ring.

[Chemical Formula 4]

($G_{h1}2$)

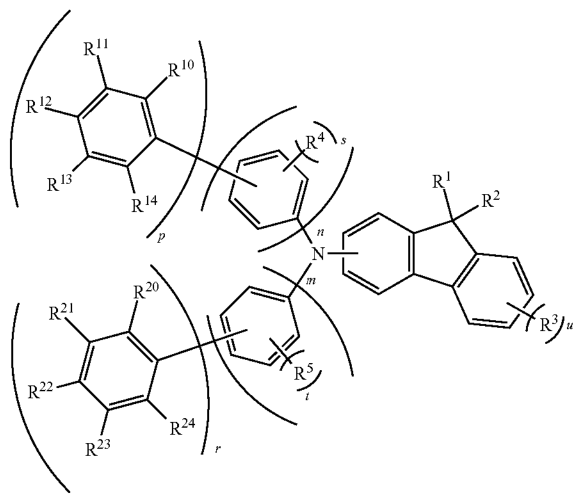

In General Formula ($G_{h1}2$) shown above, m and r each independently represent 1 or 2 and m+r is 2 or 3. Furthermore, t each independently represents an integer of 0 to 4 and is preferably 0. $R^5$ represents hydrogen or a hydrocarbon group having 1 to 3 carbon atoms. When m is 2, the kind and number of substituents and the position of bonds included in one phenylene group may be the same as or different from those of the other phenylene group; and when r is 2, the kind and number of substituents and the position of bonds included in one phenyl group may be the same as or different from those of the other phenyl group. In the case where t is an integer of 2 to 4, $R^5$s may be the same as or different from each other, and adjacent groups (adjacent $R^5$s) may be bonded to each other to form a ring.

[Chemical Formula 5]

($G_{h1}3$)

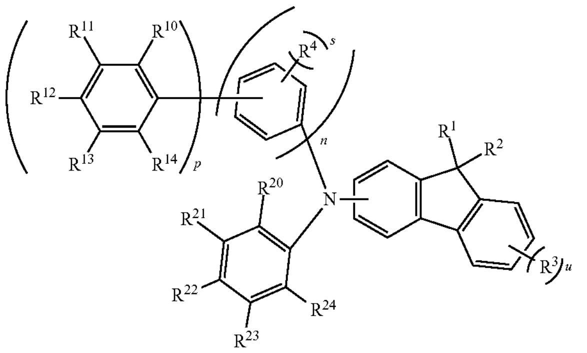

In General Formulae ($G_{h1}2$) and ($G_{h1}3$), n and p each independently represent 1 or 2 and n+p is 2 or 3. In addition, s each independently represents an integer of 0 to 4 and is preferably 0. $R^4$ represents hydrogen or a hydrocarbon group having 1 to 3 carbon atoms. When n is 2, the kind and number of substituents and the position of bonds in one phenylene group may be the same as or different from those of the other phenylene group; and when p is 2, the kind and number of substituents and the position of bonds in one phenyl group may be the same as or different from those of the other phenyl group. In the case where s is an integer of 2 to 4, $R^4$s may be the same as or different from each other.

[Chemical Formula 6]

($G_{h1}4$)

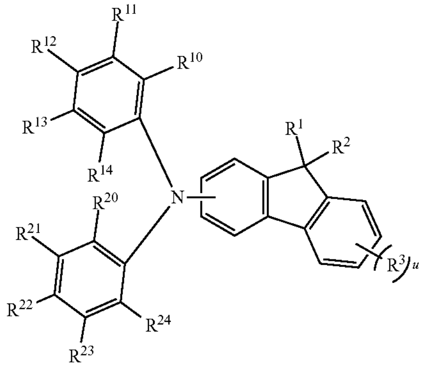

In General Formulae ($G_{h1}2$) to ($G_{h1}4$), $R^{10}$ to $R^{14}$ and $R^{20}$ to $R^{24}$ each independently represent hydrogen or a hydrocarbon group having 1 to 12 carbon atoms forming a bond only by the $sp^3$ hybrid orbitals. Note that at least three of $R^{10}$ to $R^{14}$ and at least three of $R^{20}$ to $R^{24}$ are preferably hydrogen. As the hydrocarbon group having 1 to 12 carbon atoms forming a bond only by the $sp^3$ hybrid orbitals, a tert-butyl group and a cyclohexyl group are preferable. The total number of carbon atoms contained in $R^{10}$ to $R^{14}$ and $R^{20}$ to $R^{24}$ is 8 or more and the total number of carbon atoms contained in either $R^{10}$ to $R^{14}$ or $R^{20}$ to $R^{24}$ is 6 or more. Note that adjacent groups of $R^4$, $R^{10}$ to $R^{14}$ and $R^{20}$ to $R^{24}$ may be bonded to each other to form a ring.

In General Formulae ($G_{h1}1$) to ($G_{h1}4$), u represents an integer of 0 to 4 and is preferably 0. Note that in the case where u is an integer of 2 to 4, $R^3$s may be the same as or different from each other. In addition, $R^1$, $R^2$, and $R^3$ each independently represent an alkyl group having 1 to 4 carbon atoms, and $R^1$ and $R^2$ may be bonded to each other to form a ring.

An arylamine compound that has at least one aromatic group having first to third benzene rings and at least three alkyl groups is also preferable as one of the materials having a hole-transport property that can be used in the hole-transport region 120. Note that the first to third benzene rings are bonded in this order, and the first benzene ring is directly bonded to nitrogen of amine.

The first benzene ring may further include a substituted or unsubstituted phenyl group and preferably includes an unsubstituted phenyl group. Furthermore, the second benzene ring or the third benzene ring may include a phenyl group substituted by an alkyl group.

Note that hydrogen is not directly bonded to carbon atoms at 1- and 3-positions in two or more of, preferably all of the first to third benzene rings, and the carbon atoms are bonded to any of the first to third benzene rings, the phenyl group substituted by the alkyl group, the at least three alkyl groups, and the nitrogen of the amine.

It is preferable that the arylamine compound further include a second aromatic group. It is preferable that the second aromatic group have an unsubstituted monocyclic ring or a substituted or unsubstituted bicyclic or tricyclic condensed ring; in particular, it is further preferable that the second aromatic group be a group having a substituted or unsubstituted bicyclic or tricyclic condensed ring where the number of carbon atoms forming the ring is 6 to 13. It is still further preferable that the second aromatic group be a group including a fluorene ring. Note that a dimethylfluorenyl group is preferable as the second aromatic group.

It is preferable that the arylamine compound further include a third aromatic group. The third aromatic group is a group having 1 to 3 substituted or unsubstituted benzene rings.

It is preferable that the at least three alkyl groups and the alkyl group substituted for the phenyl group be each a chain alkyl group having 2 to 5 carbon atoms. In particular, as the alkyl group, a chain alkyl group having a branch formed of 3 to 5 carbon atoms is preferable, and a t-butyl group is further preferable.

Examples of the above-described material having a hole-transport property include organic compounds having structures represented by ($G_{h2}1$) to ($G_{h2}3$) shown below.

[Chemical Formula 7]

($G_{h2}1$)

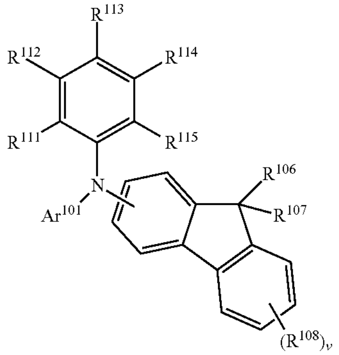

(g1)

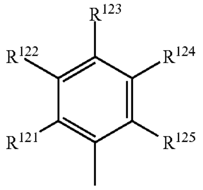

(g2)

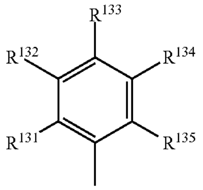

Note that in General Formula ($G_{h2}1$), $Ar^{101}$ represents a substituted or unsubstituted benzene ring or a substituent in which two or three substituted or unsubstituted benzene rings are bonded to one another.

[Chemical Formula 8]

($G_{h2}2$)

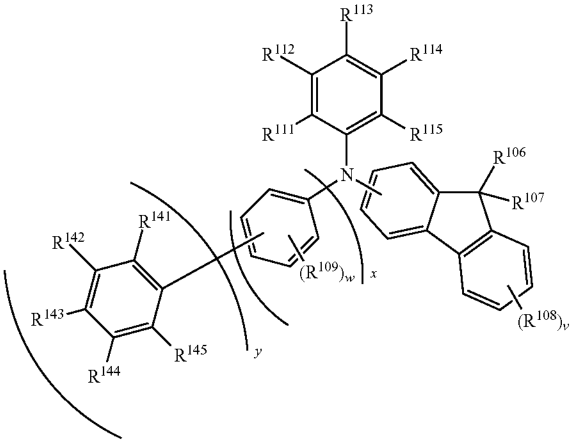

(g1)

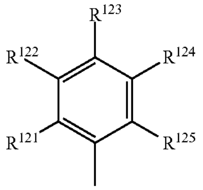

-continued (g2)

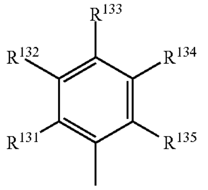

Note that in General Formula $(G_{h2}2)$ shown above, x and y each independently represent 1 or 2 and x+y is 2 or 3. Furthermore, $R^{109}$ represents an alkyl group having 1 to 4 carbon atoms, and w represents an integer of 0 to 4. $R^{141}$ to $R^{145}$ each independently represent any one of hydrogen, an alkyl group having 1 to 6 carbon atoms, and a cycloalkyl group having 5 to 12 carbon atoms. When w is 2 or more, $R^{109}$s may be the same as or different from each other. When x is 2, the kind and number of substituents and the position of bonds included in one phenylene group may be the same as or different from those of the other phenylene group. When y is 2, the kind and number of substituents included in one phenyl group including $R^{141}$ to $R^{145}$ may be the same as or different from those of the other phenyl group including $R^{141}$ to $R^{145}$.

[Chemical Formula 9]

$(G_{h2}3)$

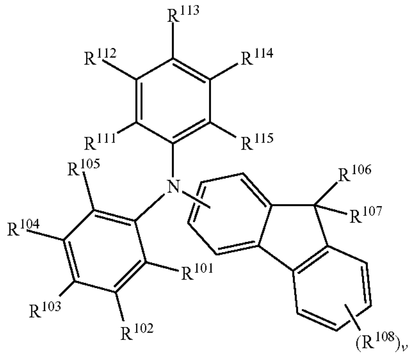

(g1)

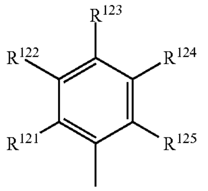

(g2)

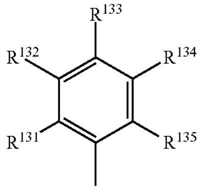

In General Formula $(G_{h2}3)$ shown above, $R^{101}$ to $R^{105}$ each independently represent any one of hydrogen, an alkyl group having 1 to 6 carbon atoms, a cycloalkyl group having 6 to 12 carbon atoms, and a substituted or unsubstituted phenyl group.

In General Formulae $(G_{h2}1)$ to $(G_{h2}3)$ shown above, $R^{106}$, $R^{107}$, and $R^{108}$ each independently represent an alkyl group having 1 to 4 carbon atoms, and v represents an integer of 0 to 4. Note that when v is 2 or more, $R^{108}$s may be the same as or different from each other. One of $R^{111}$ to $R^{115}$ represents a substituent represented by General Formula (g1) shown above, and the others each independently represent any one of hydrogen, an alkyl group having 1 to 6 carbon atoms, and a substituted or unsubstituted phenyl group. In General Formula (g1), one of $R^{121}$ to $R^{125}$ represents a substituent represented by General Formula (g2) shown above, and the others each independently represent any one of hydrogen, an alkyl group having 1 to 6 carbon atoms, and a phenyl group substituted by an alkyl group having 1 to 6 carbon atoms. In General Formula (g2) shown above, $R^{131}$ to $R^{135}$ each independently represent any one of hydrogen, an alkyl group having 1 to 6 carbon atoms, and a phenyl group substituted by an alkyl group having 1 to 6 carbon atoms. Note that at least three of $R^{111}$ to $R^{115}$, $R^{121}$ to $R^{125}$, and $R^{131}$ to $R^{135}$ are each an alkyl group having 1 to 6 carbon atoms; the number of substituted or unsubstituted phenyl groups in $R^{111}$ to $R^{115}$ is one or less; and the number of phenyl groups substituted by an alkyl group having 1 to 6 carbon atoms in $R^{121}$ to $R^{125}$ and $R^{131}$ to $R^{135}$ is one or less. In at least two combinations of the three combinations $R^{112}$ and $R^{114}$, $R^{122}$ and $R^{124}$, and $R^{132}$ and $R^{134}$, at least one R represents any of the substituents other than hydrogen.

The above-described organic compounds having a hole-transport property are organic compounds having a favorable hole-transport property and an ordinary refractive index higher than or equal to 1.50 and lower than or equal to 1.75 in the blue light emission region (greater than or equal to 455 nm and less than or equal to 465 nm) or an ordinary refractive index higher than or equal to 1.45 and lower than or equal to 1.70 with respect to light of 633 nm, which is typically used in refractive index measurement. A high Tg and high reliability can also be obtained at the same time. Such an organic compound having a hole-transport property has an enough hole-transport property and thus can be used as a material of the hole-transport layer 112.

In the case of using the above-described hole-transport organic compound with a low refractive index in the hole-injection layer 111, the organic compound having a hole-transport property mixed with a substance having an acceptor property is preferably used. Examples of the substance having an acceptor property include a compound having an electron-withdrawing group (a halogen group or a cyano group), such as 7,7,8,8-tetracyano-2,3,5,6-tetrafluoroquinodimethane (abbreviation: $F_4$-TCNQ), chloranil, 2,3,6,7,10,11-hexacyano-1,4,5,8,9,12-hexaazatriphenylene (abbreviation: HAT-CN), 1,3,4,5,7,8-hexafluorotetracyanonaphthoquinodimethane (abbreviation: F6-TCNNQ), or 2-(7-dicyanomethylene-1,3,4,5,6,8,9,10-octafluoro-7H-pyren-2-ylidene)malononitrile. A compound in which electron-withdrawing groups are bonded to a condensed aromatic ring having a plurality of heteroatoms, such as HAT-CN, is particularly preferable because it is thermally stable. A [3]radialene derivative having an electron-withdrawing group (in particular, a cyano group or a halogen group such as a fluoro group) has a very high electron-accepting property and thus is preferable. Specific examples include α,α',α''-1,2,3-cyclopropanetriylidenetris[4-cyano-2,3,5,6-tetrafluorobenzeneacetonitrile], α,α',α''-1,2,3-cyclopropanetriylidenetris[2,6-dichloro-3,5-difluoro-4-(trifluoromethyl)benzeneacetonitrile], and α,α',α''-1,2,3-cyclopropanetriylidenetris[2,3,4,5,6-pentafluorobenzeneacetonitrile].

As the substance having an acceptor property, molybdenum oxide, vanadium oxide, ruthenium oxide, tungsten oxide, manganese oxide, or the like can be used, other than the above-described organic compounds. Alternatively, the hole-injection layer 111 can be formed using a phthalocyanine-based complex compound such as phthalocyanine (abbreviation: $H_2Pc$) or copper phthalocyanine (CuPc), an aromatic amine compound such as 4,4'-bis[N-(4-diphenylaminophenyl)-N-phenylamino]biphenyl (abbreviation: DPAB) or N,N'-bis{4-[bis(3-methylphenyl)amino]phenyl}-N,N-diphenyl-(1,1'-biphenyl)-4,4'-diamine (abbreviation: DNTPD), or a high molecule such as poly(3,4-ethylenedioxythiophene)/poly(styrenesulfonic acid) (PEDOT/PSS). The substance having an acceptor property can extract electrons from an adjacent hole-transport layer (or hole-transport material) by the application of an electric field.

In the case of forming the hole-injection layer 111 by mixing the above-described material having an acceptor property in the material having a hole-transport property, it is possible to select the material for forming the electrode regardless of the work function. In other words, besides a material having a high work function, a material having a low work function can also be used for the anode 101.

As the electron-transport organic compound with a low refractive index that can be used in the electron-transport region 121, an organic compound which includes at least one six-membered heteroaromatic ring having 1 to 3 nitrogen atoms, a plurality of aromatic hydrocarbon rings each of which has 6 to 14 carbon atoms forming a ring and at least two of which are benzene rings, and a plurality of hydrocarbon groups forming a bond by sp3 hybrid orbitals is preferably used.

In the above organic compound, total carbon atoms forming a bond by sp3 hybrid orbitals preferably account for higher than or equal to 10% and lower than or equal to 60%, further preferably higher than or equal to 10% and lower than or equal to 50% of total carbon atoms in molecules of the organic compound. Alternatively, when the above organic compound is subjected to $^1$H-NMR measurement, the integral value of signals at lower than 4 ppm is preferably ½ or more of the integral value of signals at 4 ppm or higher.

The molecular weight of the organic compound having an electron-transport property is preferably greater than or equal to 500 and less than or equal to 2000. It is preferable that all the hydrocarbon groups forming a bond by sp3 hybrid orbitals in the above organic compound be bonded to the aromatic hydrocarbon rings each having 6 to 14 carbon atoms forming a ring, and the LUMO of the organic compound not be distributed in the aromatic hydrocarbon rings.

The organic compound having an electron-transport property is preferably an organic compound represented by General Formula ($G_{e1}1$) or ($G_{e1}2$) shown below.

[Chemical Formula 10]

($G_{e1}1$)

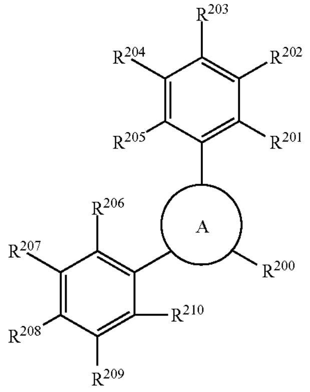

($G_{e1}1$-1)

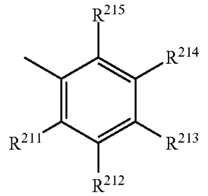

In the formula, A represents a six-membered heteroaromatic ring having 1 to 3 nitrogen atoms, and is preferably any of a pyridine ring, a pyrimidine ring, a pyrazine ring, a pyridazine ring, and a triazine ring.

Furthermore, $R^{200}$ represents any of hydrogen, an alkyl group having 1 to 6 carbon atoms, an alicyclic group having 3 to 10 carbon atoms, and a substituent represented by Formula (G1-1).

At least one of $R^{201}$ to $R^{215}$ represents a phenyl group having a substituent and the others each independently represent any of hydrogen, an alkyl group having 1 to 6 carbon atoms, an alicyclic group having 3 to 10 carbon atoms, a substituted or unsubstituted aromatic hydrocarbon group having 6 to 14 carbon atoms in a ring, and a substituted or unsubstituted pyridyl group. Note that $R^{201}$, $R^{203}$, $R^{205}$, $R^{206}$, $R^{208}$, $R^{210}$, $R^{211}$, $R^{213}$, and $R^{215}$ are preferably hydrogen. The phenyl group having a substituent has one or two substituents, which each independently represent any of an alkyl group having 1 to 6 carbon atoms, an alicyclic group having 3 to 10 carbon atoms, and a substituted or unsubstituted aromatic hydrocarbon group having 6 to 14 carbon atoms in a ring.

The organic compound represented by General Formula ($G_{e1}1$) shown above has a plurality of hydrocarbon groups selected from an alkyl group having 1 to 6 carbon atoms and an alicyclic group having 3 to 10 carbon atoms, and total carbon atoms forming a bond by $sp^3$ hybrid orbitals account for higher than or equal to 10% and lower than or equal to 60% of total carbon atoms in molecules of the organic compound.

The organic compound having an electron-transport property is preferably an organic compound represented by General Formula ($G_{e1}2$) shown below.

[Chemical Formula 11]

$(G_{e1}2)$

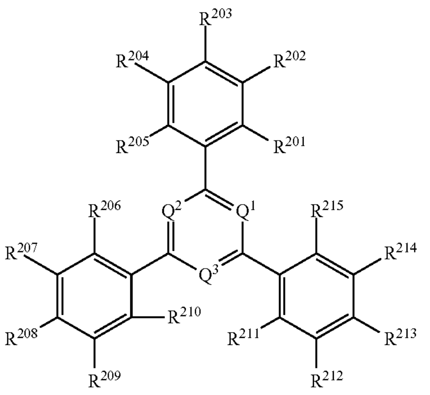

In the formula, two or three of $Q^1$ to $Q^3$ represent N; in the case where two of $Q^1$ to $Q^3$ are N, the rest represents CH.

At least any one of $R^{201}$ to $R^{215}$ represents a phenyl group having a substituent and the others each independently represent any of hydrogen, an alkyl group having 1 to 6 carbon atoms, an alicyclic group having 3 to 10 carbon atoms, a substituted or unsubstituted aromatic hydrocarbon group having 6 to 14 carbon atoms in a ring, and a substituted or unsubstituted pyridyl group. Note that $R^{201}$, $R^{203}$, $R^{205}$, $R^{206}$, $R^{208}$, $R^{210}$, $R^{211}$, $R^{213}$, and $R^{215}$ are preferably hydrogen. The phenyl group having a substituent has one or two substituents, which each independently represent any of an alkyl group having 1 to 6 carbon atoms, an alicyclic group having 3 to 10 carbon atoms, and a substituted or unsubstituted aromatic hydrocarbon group having 6 to 14 carbon atoms in a ring.

The organic compound represented by General Formula $(G_{e1}2)$ shown above has a plurality of hydrocarbon groups selected from an alkyl group having 1 to 6 carbon atoms and an alicyclic group having 3 to 10 carbon atoms, and total carbon atoms forming a bond by sp3 hybrid orbitals account for higher than or equal to 10% and lower than or equal to 60% of total carbon atoms in molecules of the organic compound.

In the organic compound represented by General Formula $(G_{e1}1)$ or $(G_{e1}2)$ shown above, the phenyl group having a substituent is preferably a group represented by Formula $(G_{e1}1\text{-}2)$ shown below.

[Chemical Formula 12]

$(G_{e1}1\text{-}2)$

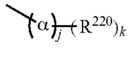

In the formula, a represents a substituted or unsubstituted phenylene group and is preferably a meta-substituted phenylene group. In the case where the meta-substituted phenylene group has a substituent, the substituent is also preferably meta-substituted. The substituent is preferably an alkyl group having 1 to 6 carbon atoms or an alicyclic group having 3 to 10 carbon atoms, further preferably an alkyl group having 1 to 6 carbon atoms, and still further preferably a t-butyl group.

$R^{220}$ represents an alkyl group having 1 to 6 carbon atoms, an alicyclic group having 3 to 10 carbon atoms, or a substituted or unsubstituted aromatic hydrocarbon group having 6 to 14 carbon atoms in a ring.

In addition, j and k each represent 1 or 2. In the case where j is 2, a plurality of a may be the same or different from each other. In the case where k is 2, a plurality of $R^{220}$ may be the same or different from each other. $R^{220}$ is preferably a phenyl group and is a phenyl group that has an alkyl group having 1 to 6 carbon atoms or an alicyclic group having 3 to 10 carbon atoms at one or both of the two meta-positions. The substituent at one or both of the two meta-positions of the phenyl group is preferably an alkyl group having 1 to 6 carbon atoms, further preferably a t-butyl group.

The above-described organic compound having an electron-transport property has a high electron-transport property and has an ordinary refractive index higher than or equal to 1.50 and lower than or equal to 1.75 in the blue light emission range (greater than or equal to 455 nm and less than or equal to 465 nm) or an ordinary refractive index higher than or equal to 1.45 and lower than or equal to 1.70 with respect to light of 633 nm, which is typically used in measurement of refractive index.

Note that in the case where the organic compound having an electron-transport property is used in the electron-transport layer 114, the electron-transport layer 114 preferably further includes a metal complex of an alkali metal or an alkaline earth metal. A heterocyclic compound having a diazine skeleton, a heterocyclic compound having a triazine skeleton, and a heterocyclic compound having a pyridine skeleton are preferable in terms of driving lifetime because they are likely to form an exciplex with an organometallic complex of an alkali metal with stable energy (the emission wavelength of the exciplex easily becomes longer). In particular, the heterocyclic compound having a diazine skeleton or the heterocyclic compound having a triazine skeleton has a deep LUMO level and thus is preferred for stabilization of energy of an exciplex.

Note that the organometallic complex of an alkali metal is preferably an organometallic complex of lithium. Alternatively, the organometallic complex of an alkali metal preferably has a ligand having a quinolinol skeleton. Further preferably, the organometallic complex of an alkali metal is preferably a lithium complex having an 8-quinolinolato structure or a derivative thereof. The derivative of a lithium complex having an 8-quinolinolato structure is preferably a lithium complex having an 8-quinolinolato structure having an alkyl group, and further preferably has a methyl group.

In the case where the lithium complex having an 8-quinolinolato structure has an alkyl group, the complex preferably has one alkyl group. It is possible that 8-quinolinolato-lithium having an alkyl group be a metal complex with a low refractive index. Specifically, the ordinary refractive index of the metal complex in a thin film state with respect to light with a wavelength in the range from 455 nm to 465 nm can be higher than or equal to 1.45 and lower than or equal to 1.70, and the ordinary refractive index thereof with respect to light with a wavelength of 633 nm can be higher than or equal to 1.40 and lower than or equal to 1.65.

In particular, the use of 6-alkyl-8-quinolinolato-lithium having an alkyl group at the 6 position has an effect of lowering the driving voltage of a light-emitting device. Of 6-alkyl-8-quinolinolato-lithium, 6-methyl-8-quinolinolato-lithium is preferably used.

Here, the above-described 6-alkyl-8-quinolinolato-lithium can be represented by General Formula (G1) shown below.

[Chemical Formula 13]

(G1)

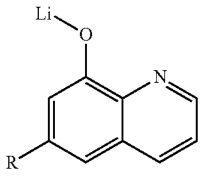

In General Formula (G1) shown above, R represents an alkyl group having 1 to 3 carbon atoms.

Of the metal complex represented by General Formula (G1) shown above, a metal complex shown below is a preferable embodiment.

[Chemical Formula 14]

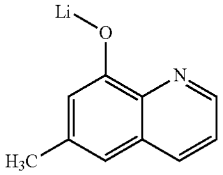

Li-6mq

The organic compound having an electron-transport property used in the electron-transport layer 114 of the light-emitting device of one embodiment of the present invention preferably has an alkyl group having 3 or 4 carbon atoms as described above; in particular, the organic compound having an electron-transport property preferably has a plurality of such alkyl groups. However, too many alkyl groups in molecules reduce the carrier-transport property; thus, carbon atoms forming a bond by sp3 hybrid orbitals in the organic compound having an electron-transport property preferably account for higher than or equal to 10% and lower than or equal to 60%, further preferably account for higher than or equal to 10% and lower than or equal to 50% of total carbon atoms in the organic compound. The organic compound having an electron-transport property with such a structure can achieve a low refractive index without a significant impairment of the electron-transport property.

As described above, a layer having a lower refractive index can be achieved without a large decrease in driving voltage or the like by including the organic compound having an electron-transport property with a low refractive index and the metal complex of an alkali metal with a low refractive index. As a result, the light extraction efficiency of the light-emitting layer 113 is improved so that the light-emitting device of one embodiment of the present invention can be a light-emitting element having high emission efficiency.

In addition, the above organic compound can be used as a host material. Furthermore, the hole-transport material and an electron-transport material may be deposited by co-evaporation so that an exciplex is formed of the electron-transport material and the hole-transport material. The exciplex having an appropriate emission wavelength allows efficient energy transfer to the light-emitting material, achieving a light-emitting device with a high efficiency and a long lifetime.

Embodiment 3

In this embodiment, a display device including the light-emitting apparatus described in Embodiment 1 will be described.

Figure 7A:
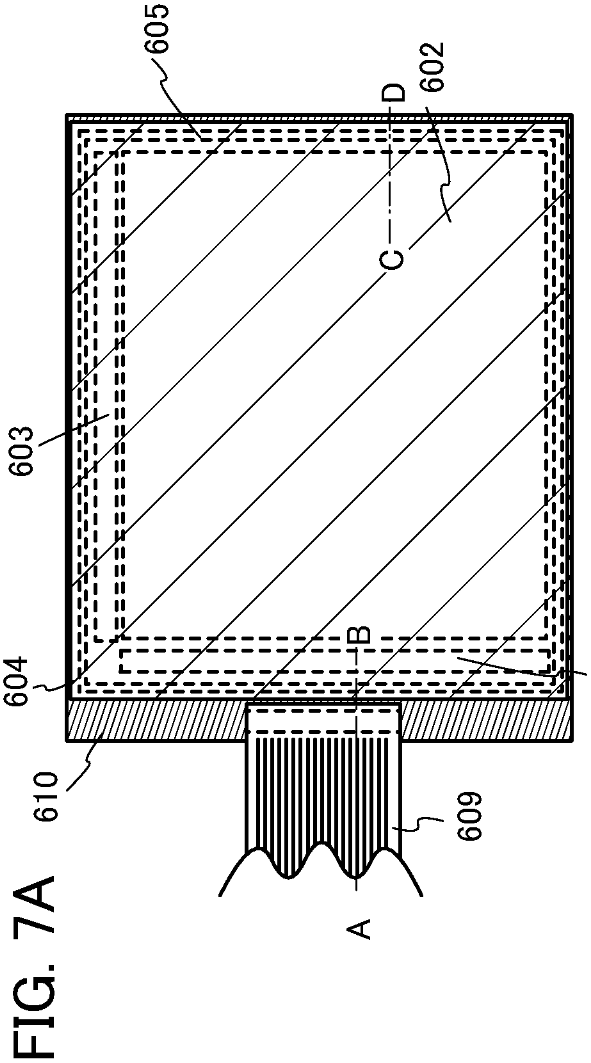
FIG. 7A and FIG. 7B are conceptual views of an active matrix light-emitting apparatus.
Figure 7B:
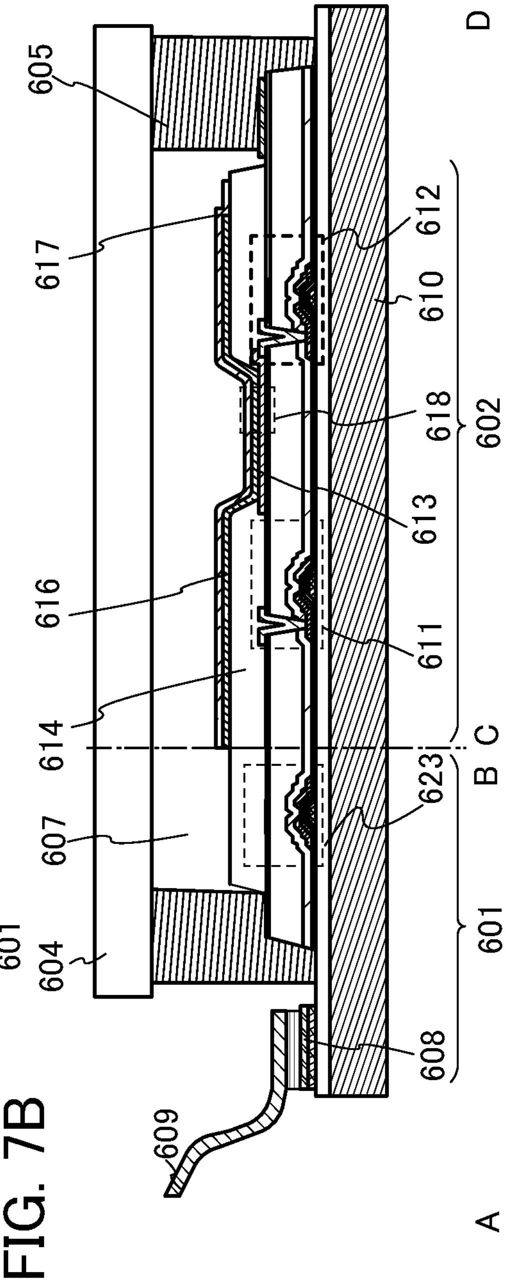

In this embodiment, the display device manufactured using the light-emitting apparatus described in Embodiment 1 is described with reference to FIG. 7. Note that FIG. 7A is a top view of the display device and FIG. 7B is a cross-sectional view taken along the lines A-B and C-D in FIG. 7A. This display device includes a driver circuit portion (source line driver circuit) 601, a pixel portion 602, and a driver circuit portion (gate line driver circuit) 603, which control light emission of a light-emitting apparatus and are illustrated with dotted lines. Reference numeral 604 denotes a sealing substrate, 605 denotes a sealing material, and 607 denotes a space surrounded by the sealing material 605.

A lead wiring 608 is a wiring for transmitting signals to be input to the source line driver circuit 601 and the gate line driver circuit 603 and receives a video signal, a clock signal, a start signal, a reset signal, or the like from an FPC (flexible printed circuit) 609 serving as an external input terminal. Although only the FPC is illustrated here, a printed wiring board (PWB) may be attached to the FPC. The light-emitting apparatus in this specification includes, in its category, not only the light-emitting apparatus itself but also the light-emitting apparatus provided with the FPC or the PWB.

Next, a cross-sectional structure is described with reference to FIG. 7B. The driver circuit portions and the pixel portion are formed over an element substrate 610; here, the source line driver circuit 601, which is a driver circuit portion, and one pixel in the pixel portion 602 are illustrated.

The element substrate 610 may be formed using a substrate containing glass, quartz, an organic resin, a metal, an alloy, a semiconductor, or the like or a plastic substrate formed of FRP (Fiber Reinforced Plastics), PVF (poly(vinyl fluoride)), polyester, acrylic, or the like.

The structure of transistors used in pixels or driver circuits is not particularly limited. For example, inverted staggered transistors may be used, or staggered transistors may be used. Furthermore, top-gate transistors or bottom-gate transistors may be used. A semiconductor material used for the transistors is not particularly limited, and for example, silicon, germanium, silicon carbide, gallium nitride, or the like can be used. Alternatively, an oxide semiconductor containing at least one of indium, gallium, and zinc, such as an In—Ga—Zn-based metal oxide, may be used.

There is no particular limitation on the crystallinity of a semiconductor material used for the transistors, and an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used because deterioration of the transistor characteristics can be inhibited.

Here, an oxide semiconductor is preferably used for semiconductor devices such as the transistors provided in the pixels or driver circuits and transistors used for touch sensors described later, and the like. In particular, an oxide semiconductor having a wider band gap than silicon is preferably used. When an oxide semiconductor having a wider band gap than silicon is used, the off-state current of the transistors can be reduced.

The oxide semiconductor preferably contains at least indium (In) or zinc (Zn). Further preferably, the oxide semiconductor contains an oxide represented by an In-M-Zn-based oxide (M represents a metal such as Al, Ti, Ga, Ge, Y, Zr, Sn, La, Ce, or Hf).

An oxide semiconductor that can be used in one embodiment of the present invention is described below.

Oxide semiconductors are classified into a single crystal oxide semiconductor and a non-single-crystal oxide semiconductor. Examples of a non-single-crystal oxide semiconductor include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear crystal grain boundary even in the vicinity of distortion in the CAAC-OS. That is, formation of a crystal grain boundary is found to be inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

The CAAC-OS tends to have a layered crystal structure (also referred to as a layered structure) in which a layer containing indium and oxygen (hereinafter, an In layer) and a layer containing the element M, zinc, and oxygen (hereinafter, an (M,Zn) layer) are stacked. Note that indium and the element M can be replaced with each other, and when the element Min the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is an oxide semiconductor with high crystallinity. On the other hand, a clear crystal grain boundary is difficult to observe in the CAAC-OS; thus, it can be said that a reduction in electron mobility due to the crystal grain boundary is less likely to occur. Entry of impurities, formation of defects, or the like might decrease the crystallinity of an oxide semiconductor. This means that the CAAC-OS is an oxide semiconductor having small amounts of impurities and defects (e.g., oxygen vacancies ($V_O$)). Thus, an oxide semiconductor including the CAAC-OS is physically stable. Therefore, the oxide semiconductor including the CAAC-OS is resistant to heat and has high reliability.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, in some cases, the nc-OS cannot be distinguished from an a-like OS or an amorphous oxide semiconductor, depending on an analysis method.

Note that an indium-gallium-zinc oxide (hereinafter, IGZO) that is an oxide semiconductor containing indium, gallium, and zinc has a stable structure in some cases by being formed of the above-described nanocrystals. In particular, crystals of IGZO tend not to grow in the air and thus, a stable structure is obtained when IGZO is formed of smaller crystals (e.g., the above-described nanocrystals) rather than larger crystals (here, crystals with a size of several millimeters or several centimeters).

The a-like OS is an oxide semiconductor having a structure between those of the nc-OS and the amorphous oxide semiconductor. The a-like OS includes avoid or a low-density region. That is, the a-like OS has lower crystallinity than the nc-OS and the CAAC-OS.

An oxide semiconductor has various structures with different properties. Two or more of the amorphous oxide semiconductor, the polycrystalline oxide semiconductor, the a-like OS, the nc-OS, and the CAAC-OS may be included in an oxide semiconductor of one embodiment of the present invention.

A CAC (Cloud-Aligned Composite)-OS may be used as an oxide semiconductor other than the above.

A CAC-OS has a conducting function in part of the material and has an insulating function in another part of the material; as a whole, the CAC-OS has a function of a semiconductor. Note that in the case where the CAC-OS is used in an active layer of a transistor, the conducting function is to allow electrons (or holes) serving as carriers to flow, and the insulating function is to not allow electrons serving as carriers to flow. By the complementary action of the conducting function and the insulating function, the CAC-OS can have a switching function (On/Off function). In the CAC-OS, separation of the functions can maximize each function.

Furthermore, the CAC-OS includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, in some cases, the conductive regions are observed to be coupled in a cloud-like manner with their boundaries blurred.

In the CAC-OS, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

The CAC-OS includes components having different band gaps. For example, the CAC-OS includes a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS is used in a channel formation region of a transistor, high current drive capability in the on state of the transistor, that is, high on-state current and high field-effect mobility, can be obtained.

In other words, the CAC-OS can also be referred to as a matrix composite or a metal matrix composite.

The use of the above-described oxide semiconductor materials for the semiconductor layer makes it possible to provide a highly reliable transistor in which a change in the electrical characteristics is inhibited.

Charge accumulated in a capacitor through a transistor including the above-described semiconductor layer can be held for a long time because of the low off-state current of the transistor. When such a transistor is used in a pixel, operation of a driver circuit can be stopped while a gray scale of an image displayed in each display region is maintained. As a result, an electronic device with extremely low power consumption can be obtained.

For stable characteristics of the transistor and the like, a base film is preferably provided. The base film can be formed with a single layer or stacked layers using an inorganic insulating film such as a silicon oxide film, a silicon nitride film, a silicon oxynitride film, or a silicon nitride oxide film. The base film can be formed by a sputtering method, a CVD (Chemical Vapor Deposition) method (e.g., a plasma CVD method, a thermal CVD method, or an MOCVD (Metal Organic CVD) method), an ALD (Atomic Layer Deposition) method, a coating method, a printing method, or the like. Note that the base film is not necessarily provided.

Note that an FET 623 is illustrated as a transistor formed in the driver circuit portion 601. The driver circuit may be formed with any of a variety of circuits such as a CMOS circuit, a PMOS circuit, or an NMOS circuit. Although a driver integrated type in which the driver circuit is formed over the substrate is illustrated in this embodiment, the driver circuit is not necessarily formed over the substrate, and the driver circuit can be formed outside, not over the substrate.

The pixel portion 602 includes a plurality of pixels including a switching FET 611, a current controlling FET 612, and an anode 613 electrically connected to a drain of the current controlling FET 612. One embodiment of the present invention is not limited to the structure. The pixel portion 602 may include three or more FETs and a capacitor in combination.

Note that an insulator 614 is formed to cover an end portion of the anode 613. Here, the insulator 614 can be formed using a positive photosensitive acrylic resin film.

In order to improve the coverage with an EL layer or the like which is formed later, the insulator 614 is formed to have a curved surface with curvature at its upper or lower end portion. For example, in the case where a positive photosensitive acrylic resin is used as a material of the insulator 614, only the upper end portion of the insulator 614 preferably has a curved surface with a curvature radius (0.2 μm to 3 μm). As the insulator 614, either a negative photosensitive resin or a positive photosensitive resin can be used.

An EL layer 616 and a cathode 617 are formed over the anode 613. Here, a material having a high work function is preferably used as a material of the anode 613. For example, a single-layer film of an ITO film, an indium tin oxide film containing silicon, an indium oxide film containing zinc oxide at 2 to 20 wt %, a titanium nitride film, a chromium film, a tungsten film, a Zn film, a Pt film, or the like, a stack of a titanium nitride film and a film containing aluminum as its main component, a stack of three layers of a titanium nitride film, a film containing aluminum as its main component, and a titanium nitride film, or the like can be used. The stacked-layer structure enables low wiring resistance, favorable ohmic contact, and a function as an anode.

The EL layer 616 is formed by any of a variety of methods such as an evaporation method using an evaporation mask, an inkjet method, and a spin coating method. The EL layer 616 has the structure described in Embodiment 1. As another material included in the EL layer 616, a low molecular compound or a high molecular compound (including an oligomer or a dendrimer) may be used.

As a material used for the cathode 617, which is formed over the EL layer 616, a material having a low work function (e.g., Al, Mg, Li, and Ca, or an alloy or a compound thereof, such as MgAg, MgIn, and AlLi) is preferably used. In the case where light generated in the EL layer 616 passes through the cathode 617, a stack of a thin metal film and a transparent conductive film (e.g., ITO, indium oxide containing zinc oxide at 2 to 20 wt %, indium tin oxide containing silicon, or zinc oxide (ZnO)) is preferably used for the cathode 617.

Note that the light-emitting device is formed with the anode 613, the EL layer 616, and the cathode 617.

The sealing substrate 604 is attached to the element substrate 610 with the sealing material 605, so that a light-emitting device 618 is provided in the space 607 surrounded by the element substrate 610, the sealing substrate 604, and the sealing material 605. The space 607 may be filled with a filler, and may be filled with an inert gas (such as nitrogen or argon), or the sealing material. It is preferable that the sealing substrate be provided with a recessed portion and a drying agent be provided in the recessed portion, in which case deterioration due to influence of moisture can be inhibited.

An epoxy-based resin or glass frit is preferably used for the sealing material 605. It is preferable that such a material transmit moisture or oxygen as little as possible. As the sealing substrate 604, a glass substrate, a quartz substrate, or a plastic substrate formed of FRP (Fiber Reinforced Plastics), PVF (poly(vinyl fluoride)), polyester, acrylic, or the like can be used.

Although not illustrated in FIG. 7 a protective film may be provided over the cathode. As the protective film, an organic resin film or an inorganic insulating film may be formed. The protective film may be formed so as to cover an exposed portion of the sealing material 605. The protective film may be provided so as to cover surfaces and side surfaces of the pair of substrates and exposed side surfaces of a sealing layer, an insulating layer, and the like.

The protective film can be formed using a material that does not easily transmit an impurity such as water. Thus, diffusion of an impurity such as water from the outside into the inside can be effectively inhibited.

As a material of the protective film, an oxide, a nitride, a fluoride, a sulfide, a ternary compound, a metal, a polymer, or the like can be used. For example, a material containing aluminum oxide, hafnium oxide, hafnium silicate, lanthanum oxide, silicon oxide, strontium titanate, tantalum oxide, titanium oxide, zinc oxide, niobium oxide, zirconium oxide, tin oxide, yttrium oxide, cerium oxide, scandium oxide, erbium oxide, vanadium oxide, indium oxide, or the like; a material containing aluminum nitride, hafnium nitride, silicon nitride, tantalum nitride, titanium nitride, niobium nitride, molybdenum nitride, zirconium nitride, gallium nitride, or the like; a material containing a nitride containing titanium and aluminum, an oxide containing titanium and aluminum, an oxide containing aluminum and zinc, a sulfide containing manganese and zinc, a sulfide containing cerium and strontium, an oxide containing erbium and aluminum, an oxide containing yttrium and zirconium, or the like can be used.

The protective film is preferably formed using a deposition method with favorable step coverage. One such method is an atomic layer deposition (ALD) method. A material that can be deposited by an ALD method is preferably used for the protective film. A dense protective film having reduced defects such as cracks or pinholes or a uniform thickness can be formed by an ALD method. Furthermore, damage caused to a process member in forming the protective film can be reduced.

By an ALD method, a uniform protective film with few defects can be formed even on, for example, a surface with a complex uneven shape or upper, side, and lower surfaces of a touch panel.

The light-emitting apparatus in this embodiment is manufactured using the light-emitting apparatus described in Embodiment 1 and thus a display device having favorable characteristic can be obtained. Specifically, since the light-emitting apparatus described in Embodiment 1 has along lifetime, the display apparatus can have high reliability. Since the display device using the light-emitting apparatus described in Embodiment 1 has high emission efficiency and thus the display apparatus can achieve low power consumption.

Figure 8A:
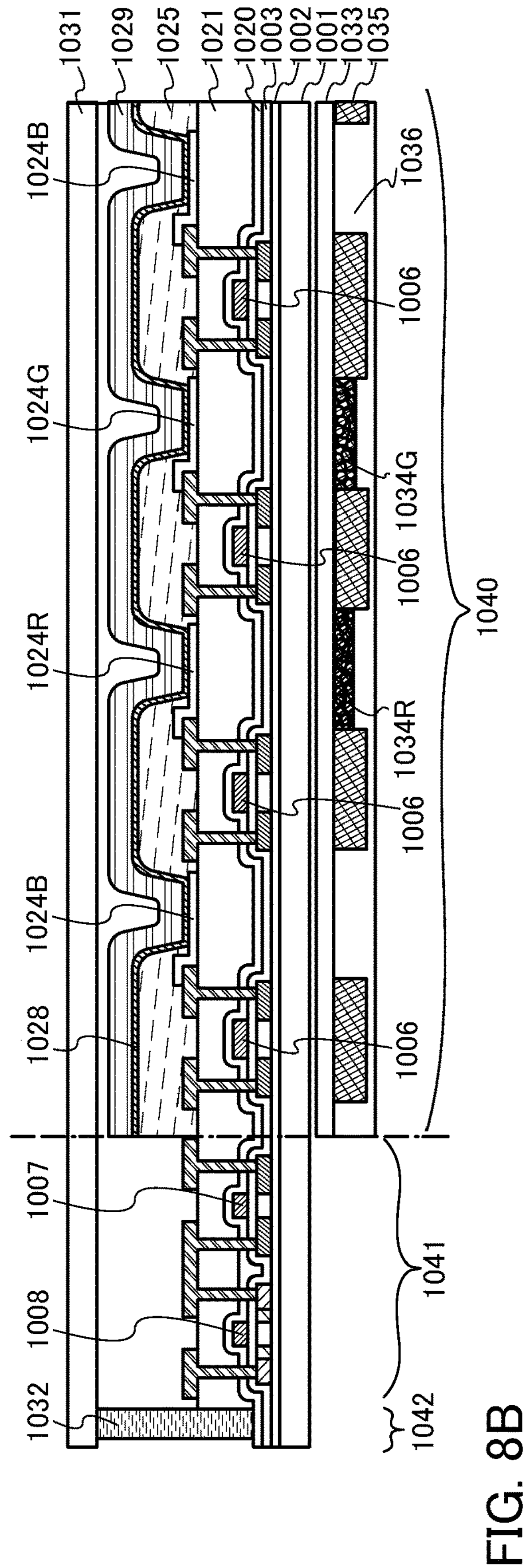
FIG. 8A and FIG. 8B are conceptual views of active matrix light-emitting apparatuses.

FIG. 8 illustrates an example of a light-emitting apparatus in which full color display is achieved by formation of light-emitting devices exhibiting blue light emission and with the use of color conversion layers. FIG. 8A illustrates a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, anodes 1024R, 1024G, and 1024B of the light-emitting devices, a partition 1025, an EL layer 1028, a cathode 1029 of the light-emitting devices, a sealing substrate 1031, a sealing material 1032, and the like.

In FIG. 8A, the color conversion layers (a red color conversion layer 1034R and a green color conversion layer 1034G) are provided on a transparent base material 1033. A black matrix 1035 may be additionally provided. The transparent base material 1033 provided with the color conversion layers and the black matrix is aligned and fixed to the substrate 1001. Note that the color conversion layers and the black matrix 1035 may be covered with an overcoat layer 1036.

Figure 8B:
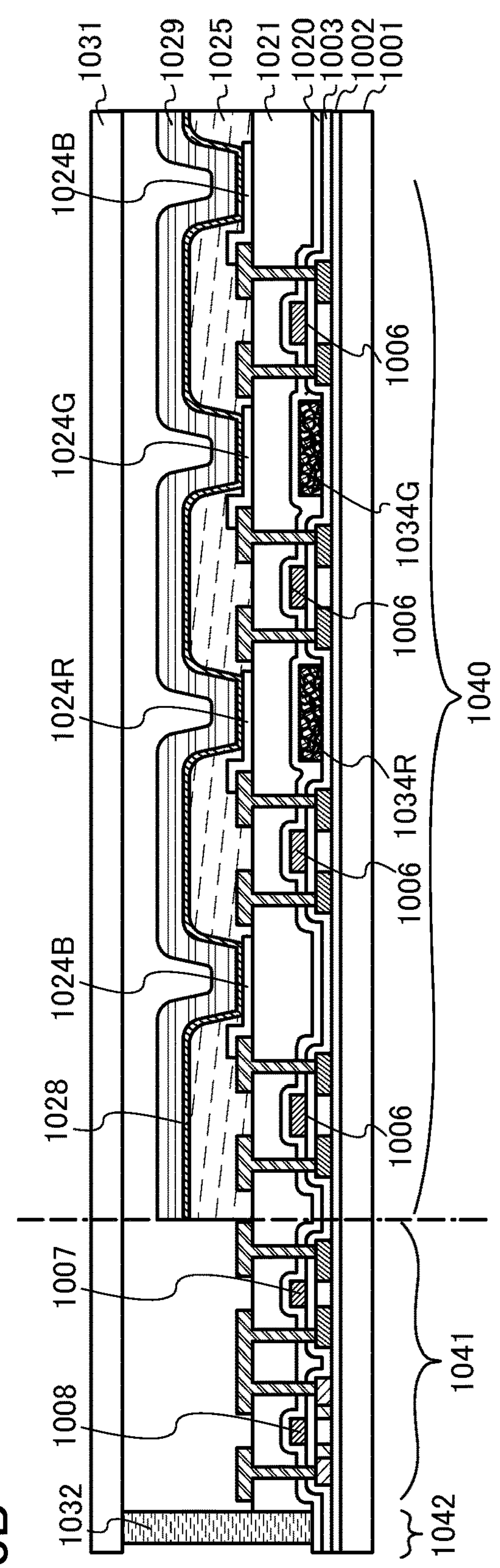

FIG. 8B shows an example in which the color conversion layers (the red color conversion layer 1034R and the green color conversion layer 1034G) are provided between the gate insulating film 1003 and the first interlayer insulating film 1020. As in the structure, the coloring layers may be provided between the substrate 1001 and the sealing substrate 1031.

Figure 9:
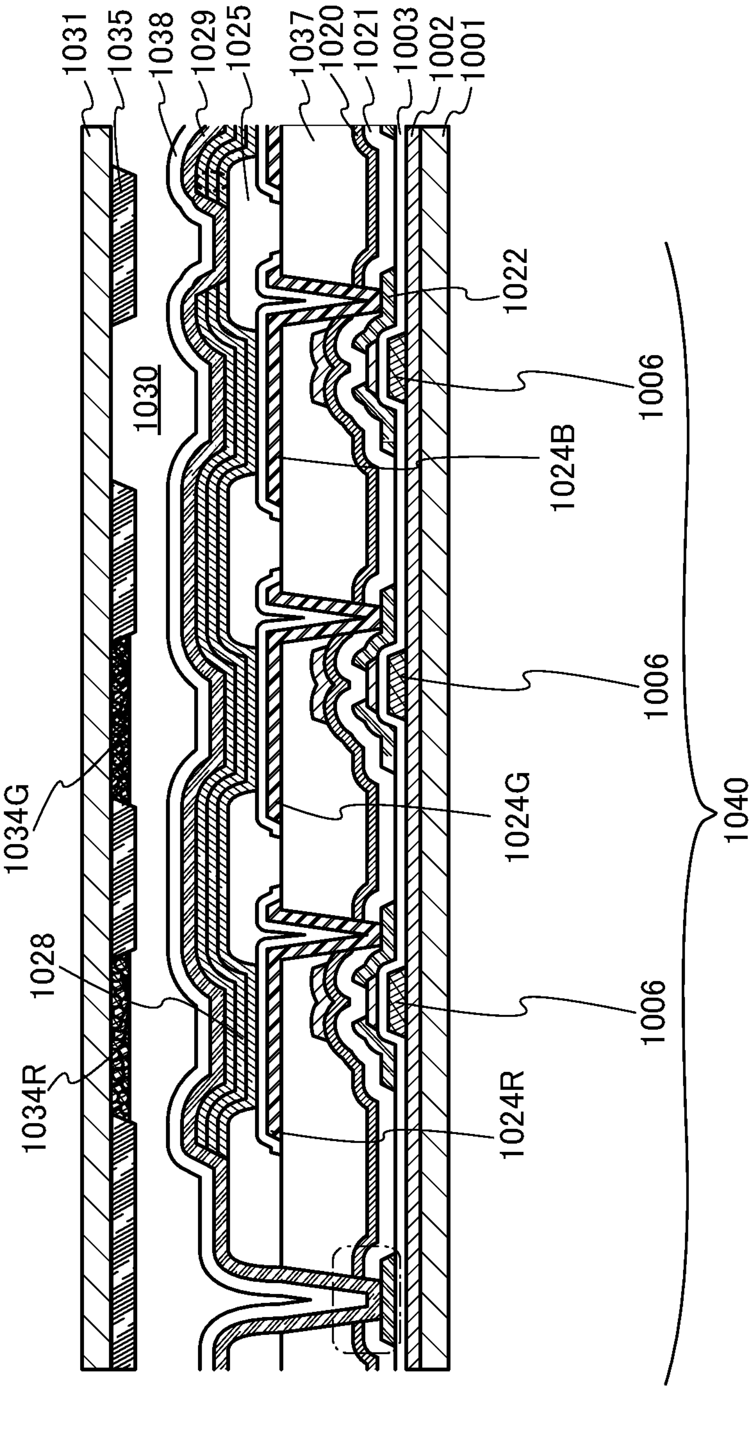
FIG. 9 is a conceptual view of an active matrix light-emitting apparatus.

The above-described light-emitting apparatus has a structure in which light is extracted from the substrate 1001 side where FETs are formed (a bottom emission structure), but may have a structure in which light is extracted from the sealing substrate 1031 side (atop emission structure). FIG. 9 is a cross-sectional view of a light-emitting apparatus having atop emission structure. In this case, a substrate that does not transmit light can be used as the substrate 1001. The process up to the step of forming a connection electrode which connects the FET and the anode of the light-emitting device is performed in a manner similar to that of the light-emitting apparatus having a bottom emission structure. Then, a third interlayer insulating film 1037 is formed to cover the electrode 1022. This insulating film may have a planarization function. The third interlayer insulating film 1037 can be formed using a material similar to that of the second interlayer insulating film, and can alternatively be formed using any of other known materials.

The anodes 1024R, 1024G, and 1024B of the light-emitting devices each serve as an apparatus anode here, but may each serve as a cathode. In the case of a light-emitting apparatus having a top emission structure as illustrated in FIG. 9, the anodes are preferably reflective electrodes. The EL layer 1028 has a device structure with which blue light emission can be obtained.

In the case of a top emission structure as illustrated in FIG. 9, sealing can be performed with the sealing substrate 1031 on which the color conversion layers (the red color conversion layer 1034R and the green color conversion layer 1034G) are provided. The sealing substrate 1031 may be provided with the black matrix 1035 that is positioned between pixels. The color conversion layers (the red color conversion layer 1034R and the green color conversion layer 1034G) and the black matrix may be covered with the overcoat layer. Note that a light-transmitting substrate is used as the sealing substrate 1031. The color conversion layers (the red color conversion layer 1034R and the green color conversion layer 1034G) may be provided directly on the cathode 1029 (or on a protection film provided over the cathode 1029).

The insulating layer 1038 serves as a protective layer that prevents impurities from diffusing into the light-emitting devices. As a material of the insulating layer 1038, an oxide, a nitride, a fluoride, a sulfide, a ternary compound, a metal, a polymer, or the like can be used. For example, aluminum oxide, hafnium oxide, hafnium silicate, lanthanum oxide, silicon oxide, strontium titanate, tantalum oxide, titanium oxide, zinc oxide, niobium oxide, zirconium oxide, tin oxide, yttrium oxide, cerium oxide, scandium oxide, erbium oxide, vanadium oxide, indium oxide, aluminum nitride, hafnium nitride, silicon nitride, tantalum nitride, titanium nitride, niobium nitride, molybdenum nitride, zirconium nitride, gallium nitride, a nitride containing titanium and aluminum, an oxide containing titanium and aluminum, an oxide containing aluminum and zinc, a sulfide containing manganese and zinc, a sulfide containing cerium and strontium, an oxide containing erbium and aluminum, an oxide containing yttrium and zirconium, or the like can be used. Silicon nitride, silicon oxide, silicon nitride oxide, or the like is preferably used. Note that the insulating layer 1038 is not necessarily formed.

A space 1030 may be filled with a resin. The refractive index of the resin is preferably 1.4 to 2.0, more preferably 1.7 to 1.9. A layer with a relatively high refractive index between the transparent electrode and the color conversion layer can reduce losses of light due to the thin film mode, so that the light-emitting devices can have higher efficiency.

Note that in the above structure, the EL layer may have a structure including a plurality of light-emitting layers or a structure including a single light-emitting layer. The structure of the tandem light-emitting device described above may be combined with a plurality of EL layers; for example, a light-emitting device may have a structure in which a plurality of EL layers are provided with a charge-generation layer provided therebetween, and each EL layer includes a plurality of light-emitting layers or a single light-emitting layer.

In the light-emitting apparatus having a top emission structure, a microcavity structure can be favorably employed. A light-emitting device with a microcavity structure is formed with the use of a reflective electrode as the anode and a transflective electrode as the cathode. The light-emitting device with a microcavity structure includes at least an EL layer between the reflective electrode and the transflective electrode. The EL layer includes at least alight-emitting layer serving as a light-emitting region.

Note that the reflective electrode has a visible light reflectivity of 40% to 100%, preferably 70% to 100%, and a resistivity of $1\times10^{-2}$ Ωcm or lower. In addition, the transflective electrode has a visible light reflectivity of 20% to 80%, preferably 40% to 70%, and a resistivity of $1\times10^{-2}$ Ωcm or lower.

Light emitted from the light-emitting layer included in the EL layer is reflected and resonated by the reflective electrode and the transflective electrode.

In the light-emitting device, by changing thicknesses of the transparent conductive film, the composite material, the carrier-transport material, or the like, the optical path length between the reflective electrode and the transflective electrode can be changed. Thus, light with a wavelength that is resonated between the reflective electrode and the transflective electrode can be intensified while light with a wavelength that is not resonated therebetween can be attenuated.

Note that light that is reflected back by the reflective electrode (first reflected light) considerably interferes with light that directly enters the transflective electrode from the light-emitting layer (first incident light). For this reason, the optical path length between the reflective electrode and the light-emitting layer is preferably adjusted to (2n−1)/4 (n is a natural number of 1 or larger and λ is a wavelength of light to be amplified). By adjusting the optical path length, the phases of the first reflected light and the first incident light can be aligned with each other and the light emitted from the light-emitting layer can be further amplified.

Note that in the above structure, the EL layer may have a structure including a plurality of light-emitting layers or a structure including a single light-emitting layer. The structure of the tandem light-emitting device described above may be combined with a plurality of EL layers; for example, a light-emitting device may have a structure in which a plurality of EL layers are provided with a charge-generation layer provided therebetween, and each EL layer includes a plurality of light-emitting layers or a single light-emitting layer.

Embodiment 4

In this embodiment, examples of electronic devices each including the light-emitting apparatus of one embodiment of the present invention will be described. The light-emitting apparatus of one embodiment of the present invention has low power consumption and high reliability. As a result, the electronic devices described in this embodiment can each have low power consumption and high reliability.

Examples of the electronic device including the above light-emitting device include television devices (also referred to as TV or television receivers), monitors for computers and the like, digital cameras, digital video cameras, digital photo frames, cellular phones (also referred to as mobile phones or mobile phone devices), portable game machines, portable information terminals, audio playback devices, and large game machines such as pachinko machines. Specific examples of these electronic devices are shown below.

Figure 10A:
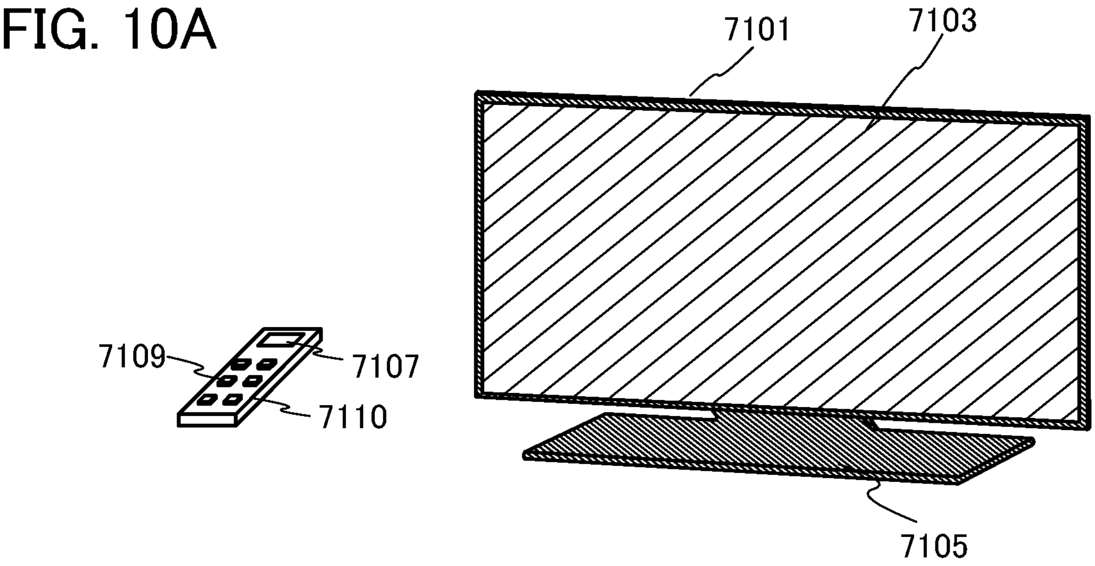
Figure 10A:
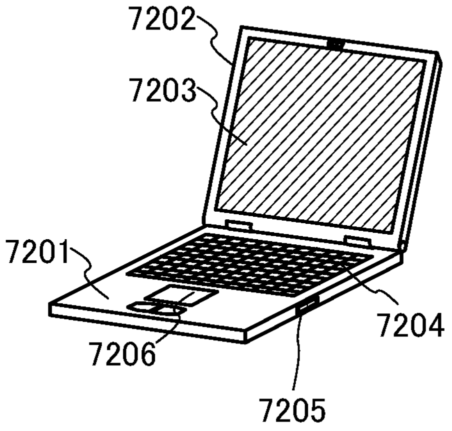
Figure 10A:
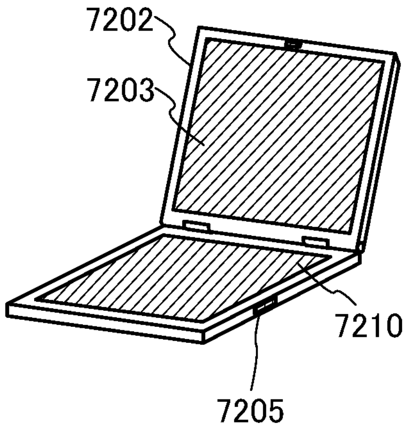

FIG. 10A shows an example of a television device. In the television device, a display portion 7103 is incorporated in a housing 7101. Here, the housing 7101 is supported by a stand 7105. Images can be displayed on the display portion 7103, and in the display portion 7103, the light-emitting devices are arranged in a matrix.

The television device can be operated with an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Note that the television device is provided with a receiver, a modem, and the like. With the use of the receiver, a general television broadcast can be received. Moreover, when the television device is connected to a communication network with or without wires via the modem, one-way (from a sender to a receiver) or two-way (between a sender and a receiver or between receivers) data communication can be performed.

FIG. 10B1 illustrates a computer, which includes a main body 7201, a housing 7202, a display portion 7203, a keyboard 7204, an external connection port 7205, a pointing device 7206, and the like. Note that this computer is manufactured using the light-emitting devices and arranged in a matrix in the display portion 7203. The computer illustrated in FIG. 10B1 may have a structure illustrated in FIG. 10B2. A computer illustrated in FIG. 10B2 is provided with a second display portion 7210 instead of the keyboard 7204 and the pointing device 7206. The second display portion 7210 is a touch panel, and input operation can be performed by touching display for input on the second display portion 7210 with a finger or a dedicated pen. The second display portion 7210 can also display images other than the display for input. The display portion 7203 may also be a touch panel. Connecting the two screens with a hinge can prevent troubles; for example, the screens can be prevented from being cracked or broken while the computer is being stored or carried.

Figure 10C:
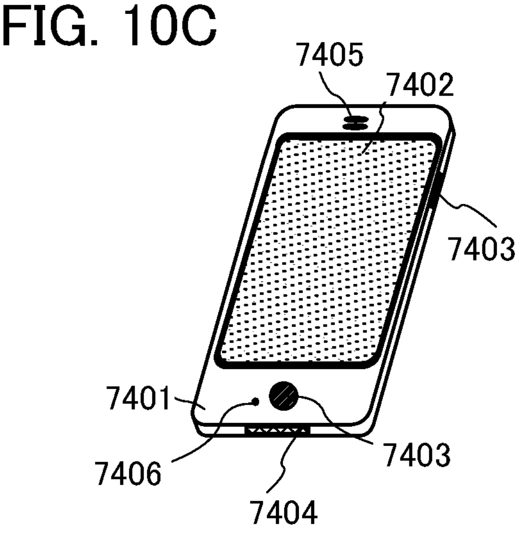

FIG. 10C shows an example of a portable terminal. A cellular phone is provided with a display portion 7402 incorporated in a housing 7401, operation buttons 7403, an external connection port 7404, a speaker 7405, a microphone 7406, and the like. Note that the cellular phone has the display portion 7402 formed using the light-emitting apparatus described in Embodiment 1.

When the display portion 7402 of the portable terminal illustrated in FIG. 10C is touched with a finger or the like, data can be input to the portable terminal. In this case, operations such as making a call and creating an e-mail can be performed by touching the display portion 7402 with a finger or the like.

The display portion 7402 has mainly three screen modes. The first mode is a display mode mainly for displaying images. The second mode is an input mode mainly for inputting data such as text. The third mode is a display-and-input mode in which the two modes, the display mode and the input mode, are combined.

For example, in the case of making a call or creating an e-mail, a text input mode mainly for inputting text is selected for the display portion 7402 so that text displayed on the screen can be input. In this case, it is preferable to display a keyboard or number buttons on almost the entire screen of the display portion 7402.

When a sensing device including a sensor such as a gyroscope sensor or an acceleration sensor for detecting inclination is provided inside the portable terminal, display on the screen of the display portion 7402 can be automatically changed by determining the orientation of the portable terminal (whether the portable terminal is placed horizontally or vertically).

The screen modes are switched by touching the display portion 7402 or operating the operation buttons 7403 of the housing 7401. Alternatively, the screen modes can be switched depending on the kind of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed for a certain period while a signal sensed by an optical sensor in the display portion 7402 is sensed, the screen mode may be controlled so as to be switched from the input mode to the display mode.

The display portion 7402 may also function as an image sensor. For example, an image of a palm print, a fingerprint, or the like is taken when the display portion 7402 is touched with the palm or the finger, whereby personal authentication can be performed. Furthermore, by providing a backlight or a sensing light source which emits near-infrared light in the display portion, an image of a finger vein, a palm vein, or the like can be taken.

Figure 11A:
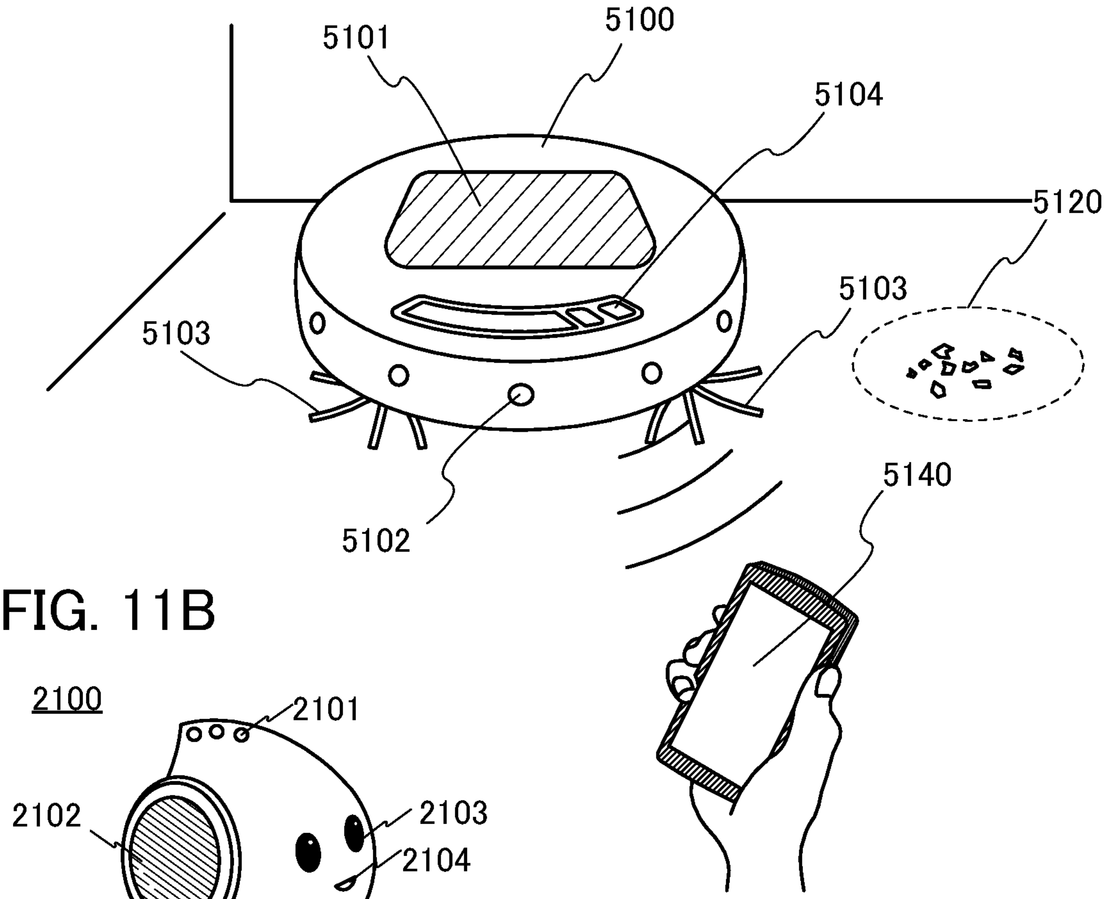

FIG. 11A is a schematic view showing an example of a cleaning robot.

A cleaning robot 5100 includes a display 5101 on its top surface, a plurality of cameras 5102 on its side surface, a brush 5103, and operation buttons 5104. Although not illustrated, the bottom surface of the cleaning robot 5100 is provided with a tire, an inlet, and the like. Furthermore, the cleaning robot 5100 includes various sensors such as an infrared sensor, an ultrasonic sensor, an acceleration sensor, a piezoelectric sensor, an optical sensor, and a gyroscope sensor. The cleaning robot 5100 has a wireless communication means.

The cleaning robot 5100 is self-propelled, detects dust 5120, and vacuums the dust through the inlet provided on the bottom surface.

The cleaning robot 5100 can determine whether there is an obstacle such as a wall, furniture, or a step by analyzing images taken by the cameras 5102. When the cleaning robot 5100 detects an object that is likely to be caught in the brush 5103 (e.g., a wire) by image analysis, the rotation of the brush 5103 can be stopped.

The display 5101 can display the remaining capacity of a battery, the amount of vacuumed dust, and the like. The display 5101 may display a path on which the cleaning robot 5100 has run. The display 5101 may be a touch panel, and the operation buttons 5104 may be provided on the display 5101.

The cleaning robot 5100 can communicate with a portable electronic device 5140 such as a smartphone. Images taken by the cameras 5102 can be displayed on the portable electronic device 5140. Accordingly, an owner of the cleaning robot 5100 can monitor his/her room even when the owner is not at home. The owner can also check the display on the display 5101 by the portable electronic device such as a smartphone.

The light-emitting apparatus of one embodiment of the present invention can be used for the display 5101.

Figure 11B:
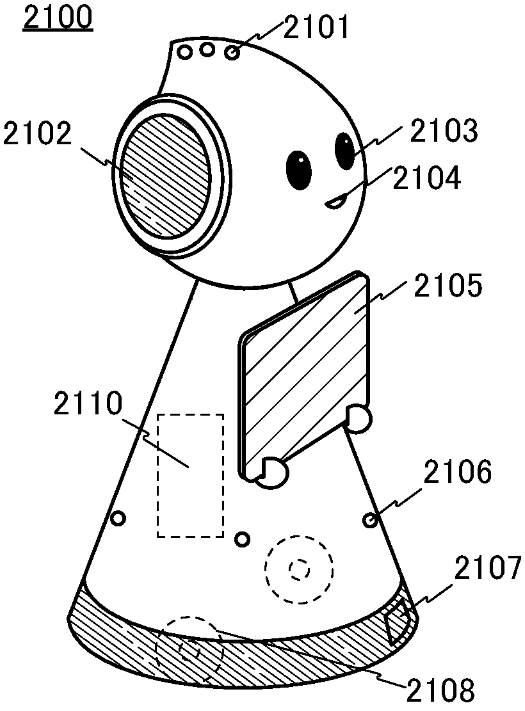

A robot 2100 illustrated in FIG. 11B includes an arithmetic device 2110, an illuminance sensor 2101, a microphone 2102, an upper camera 2103, a speaker 2104, a display 2105, a lower camera 2106, an obstacle sensor 2107, and a moving mechanism 2108.

The microphone 2102 has a function of detecting a speaking voice of a user, an environmental sound, and the like. The speaker 2104 has a function of outputting sound. The robot 2100 can communicate with a user using the microphone 2102 and the speaker 2104.

The display 2105 has a function of displaying various kinds of information. The robot 2100 can display information desired by a user on the display 2105. The display 2105 may be provided with a touch panel. Moreover, the display 2105 may be a detachable information terminal, in which case charging and data communication can be performed when the display 2105 is set at the home position of the robot 2100.

The upper camera 2103 and the lower camera 2106 each have a function of taking an image of the surroundings of the robot 2100. The obstacle sensor 2107 can detect an obstacle in the direction where the robot 2100 advances with the moving mechanism 2108. The robot 2100 can move safely by recognizing the surroundings with the upper camera 2103, the lower camera 2106, and the obstacle sensor 2107. The light-emitting apparatus of one embodiment of the present invention can be used for the display 2105.

Figure 11C:
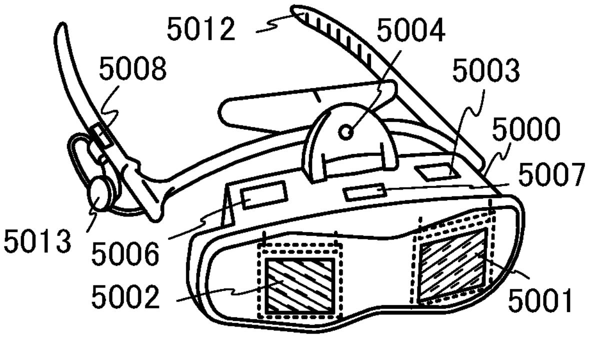

FIG. 11C shows an example of a goggle-type display. The goggle-type display includes, for example, a housing 5000, a display portion 5001, a speaker 5003, an LED lamp 5004, a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, a display portion 5002, a support 5012, and an earphone 5013.

The light-emitting apparatus of one embodiment of the present invention can be used for the display portion 5001 and the display portion 5002.

Figure 12:
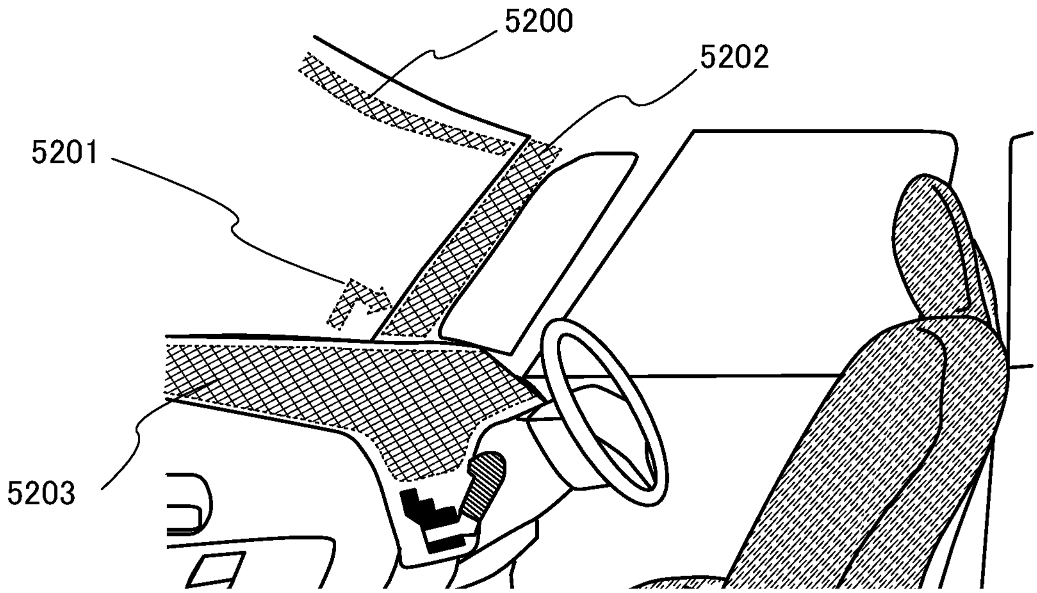
FIG. 12 is a diagram illustrating in-vehicle display devices and lighting devices.

The light-emitting apparatus of one embodiment of the present invention can also be used for an automobile windshield or an automobile dashboard. FIG. 12 illustrates one mode in which the light-emitting apparatuses of one embodiment of the present invention are used for an automobile windshield and an automobile dashboard. A display region 5200 to a display region 5203 each include the light-emitting apparatus of one embodiment of the present invention.

The display region 5200 and the display region 5201 are display devices which are provided in the automobile windshield and include the light-emitting apparatus of one embodiment of the present invention. The light-emitting device can be formed into what is called a see-through display device, through which the opposite side can be seen, by including an anode and a cathode formed of light-transmitting electrodes. Such see-through display devices can be provided even in the automobile windshield without hindering the view. In the case where a driving transistor or the like is provided, a transistor having a light-transmitting property, such as an organic transistor including an organic semiconductor material or a transistor including an oxide semiconductor, is preferably used.

The display region 5202 is a display device which is provided in a pillar portion and includes the light-emitting apparatus of one embodiment of the present invention. The display region 5202 can compensate for the view hindered by the pillar by displaying an image taken by an imaging unit provided in the car body. Similarly, the display region 5203 provided in the dashboard portion can compensate for the view hindered by the car body by displaying an image taken by an imaging unit provided on the outside of the automobile; thus, blind areas can be eliminated to enhance the safety. Images that compensate for the areas which a driver cannot see enable the driver to ensure safety easily and comfortably.

The display region 5203 can also provide a variety of kinds of information such as navigation data, speed, and the number of revolutions. The content or layout of the display can be changed as appropriate according to the user's preference. Note that such information can also be displayed on the display region 5200 to the display region 5202. The display region 5200 to the display region 5203 can also be used as lighting devices.

Figure 13A:
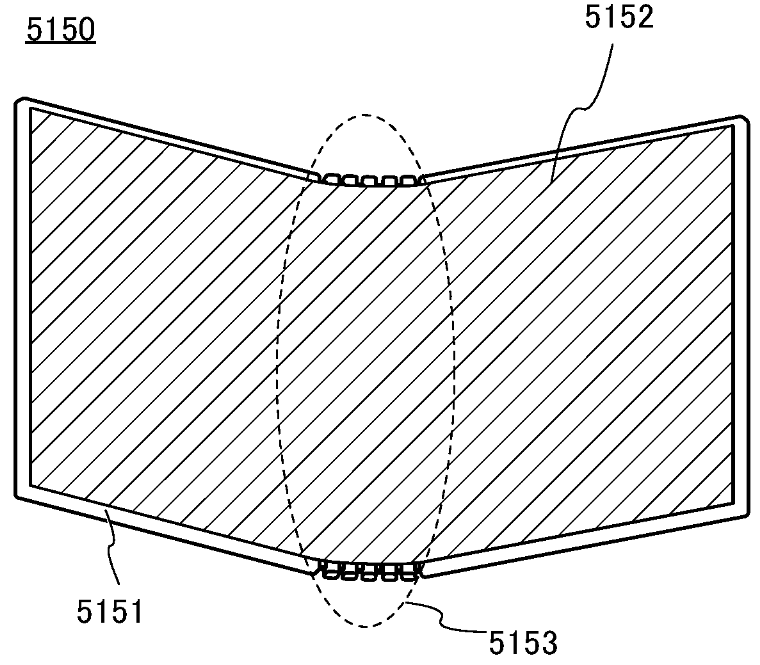
FIG. 13A and FIG. 13B are diagrams illustrating an electronic device.
Figure 13B:
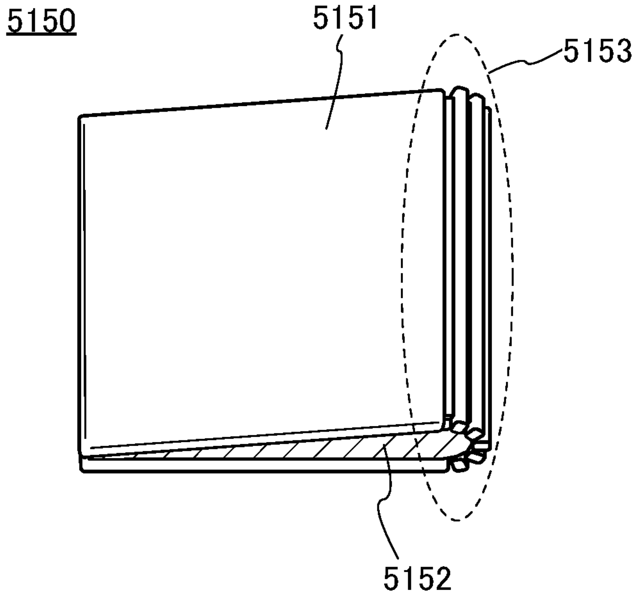

FIG. 13A and FIG. 13B illustrate a foldable portable information terminal 5150. The foldable portable information terminal 5150 includes a housing 5151, a display region 5152, and a bend portion 5153. FIG. 13A illustrates the portable information terminal 5150 that is opened. FIG. 13B illustrates the portable information terminal that is folded. Despite its large display region 5152, the portable information terminal 5150 is compact in size and has excellent portability when folded.

The display region 5152 can be folded in half with the bend portion 5153. The bend portion 5153 includes a flexible member and a plurality of supporting members. When the display region is folded, the flexible member expands. The bend portion 5153 has a radius of curvature greater than or equal to 2 mm, preferably greater than or equal to 3 mm.

Note that the display region 5152 may be a touch panel (an input/output device) including a touch sensor (an input device). The light-emitting apparatus of one embodiment of the present invention can be used for the display region 5152.

Figure 14A:
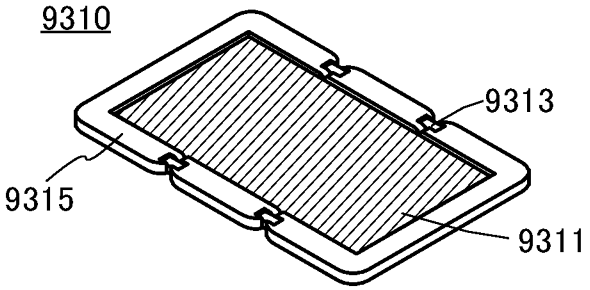
FIG. 14A to FIG. 14C are diagrams illustrating an electronic device.
Figure 14B:
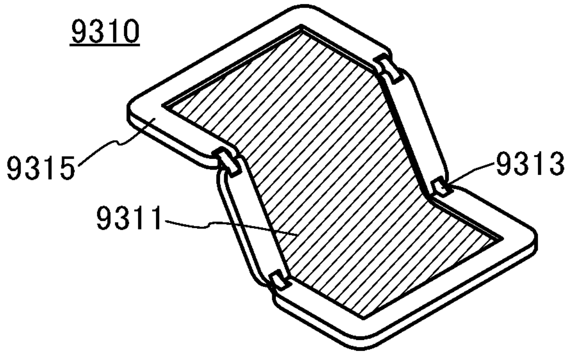
Figure 14C:
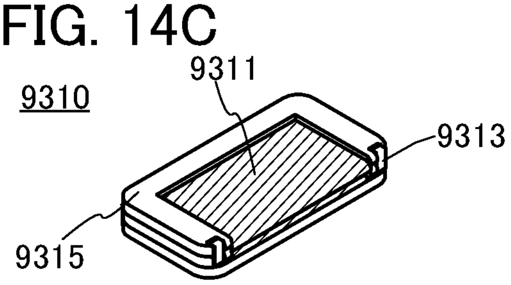

FIG. 14A to FIG. 14C illustrate a foldable portable information terminal 9310. FIG. 14A illustrates the portable information terminal 9310 that is opened. FIG. 14B illustrates the portable information terminal 9310 on the way from either the opened state or the folded state to the other state. FIG. 14C illustrates the portable information terminal 9310 that is folded. The portable information terminal 9310 is highly portable when folded. The portable information terminal 9310 is highly browsable when opened because of a seamless large display region.

A display panel 9311 is supported by three housings 9315 joined together by hinges 9313. Note that the display panel 9311 may be a touch panel (an input/output device) including a touch sensor (an input device). By folding the display panel 9311 at the hinges 9313 between two housings 9315, the portable information terminal 9310 can be reversibly changed in shape from the opened state to the folded state. The light-emitting apparatus of one embodiment of the present invention can be used for the display panel 9311.

Note that the structure described in this embodiment can be combined with any of the structures described in Embodiment 1 to Embodiment 3 as appropriate.

As described above, the application range of the light-emitting apparatus of one embodiment of the present invention is significantly wide so that this light-emitting apparatus can be applied to electronic devices in a variety of fields. By using the light-emitting apparatus of one embodiment of the present invention, an electronic device having low power consumption can be obtained.

Example 1

This example shows calculation results of the amounts of light reaching the color conversion layers in Light-emitting apparatus 1 to Light-emitting apparatus 3 of one embodiment of the present invention, each of which includes a light-emitting device including a layer with a low refractive index and a color conversion layer, and Comparative light-emitting apparatus 1 which includes a light-emitting device with a normal refractive index and a color conversion layer.

Figure 15:
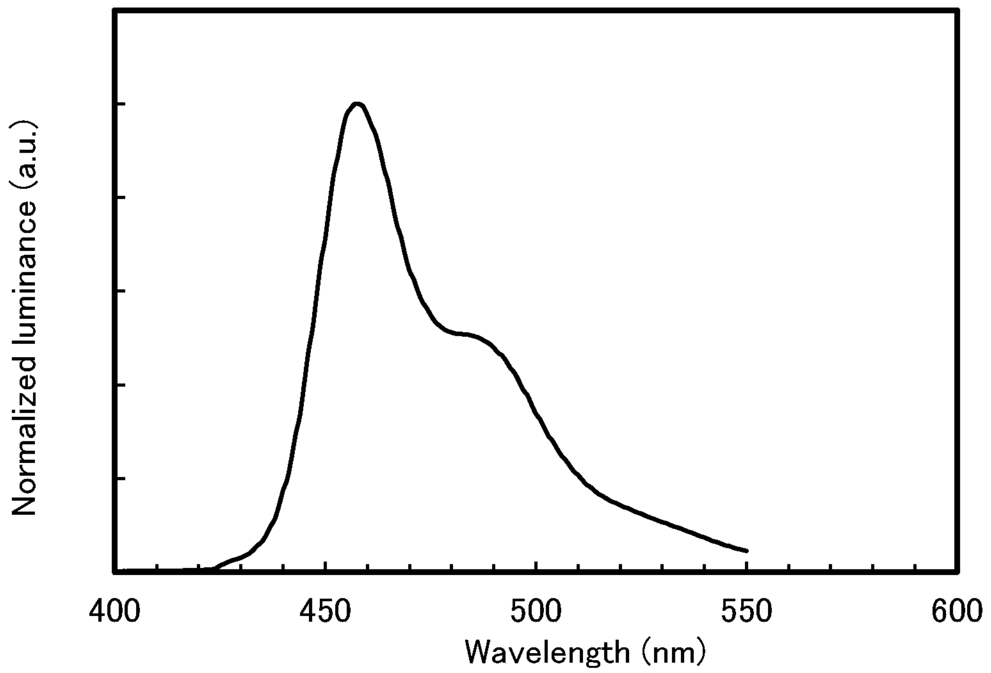
FIG. 15 is a diagram showing an emission spectrum used for calculation.

The calculation was performed using an organic device simulator (semiconducting emissive thin film optics simulator, setfos: Cybemet Systems Co., Ltd.). Alight-emitting region was fixed to the center of a light-emitting layer. As the refractive indexes of materials of the organic layers, the low refractive index and the normal refractive index were assumed to be 1.6 and 1.9, respectively. It is assumed that there is no wavelength dispersion. The thickness of each layer was optimized so that the blue index (BI) can be the maximum when the refractive index of the color conversion layer was 1. Note that light emitted from the light-emitting layer was made to have a spectrum shown in FIG. 15. The light-emitting device has a top emission structure in which light is extracted from the cathode side. The thickness of the hole-transport layer was adjusted such that the total optical path length between the reflective electrode on the anode side and the cathode was approximately 460 nm corresponding to blue light emission. It is assumed that a QD was used for the color conversion layer and quenching due to the Purcell effect was taken into consideration for the calculation. The following table shows the stacked structures of the light-emitting apparatuses used for the calculation.

TABLE 1

| | Light-emitting apparatus 1 | | Light-emitting apparatus 2 | | Light-emitting apparatus 3 | | Comparative light-emitting apparatus 1 | |
|---|---|---|---|---|---|---|---|---|
| Element structure | Refractive index | Thickness (nm) | Refractive index | Thickness (nm) | Refractive index | Thickness (nm) | Refractive index | Thickness (nm) |
| Color conversion layer | sweep | 1000 | sweep | 1000 | sweep | 1000 | sweep | 1000 |
| Cap layer | 1.9 | 66.2 | 1.9 | 65.8 | 1.9 | 65 | 1.9 | 67.2 |
| Cathode (Ag:Mg) | * | 15 | * | 15 | * | 15 | * | 15 |
| Electron-transport layer | 1.9 | 35.9 | 1.6 | 46.1 | 1.6 | 43.9 | 1.9 | 37 |
| Light-emitting layer | 1.9 | 25 | 1.9 | 25 | 1.9 | 25 | 1.9 | 25 |
| Hole-transport layer | 1.6 | 150.4 | 1.9 | 124.5 | 1.6 | 150.7 | 1.9 | 124.5 |
| Transparent electrode (ITSO) | * | 10 | * | 10 | * | 10 | * | 10 |

TABLE 1-continued

| Element structure | Light-emitting apparatus 1 Refractive index | Light-emitting apparatus 1 Thickness (nm) | Light-emitting apparatus 2 Refractive index | Light-emitting apparatus 2 Thickness (nm) | Light-emitting apparatus 3 Refractive index | Light-emitting apparatus 3 Thickness (nm) | Comparative light-emitting apparatus 1 Refractive index | Comparative light-emitting apparatus 1 Thickness (nm) |
|---|---|---|---|---|---|---|---|---|
| Anode (Ag) | * | 100 | * | 100 | * | 100 | * | 100 |

Note that the physical property values of the materials were used as the refractive indexes and extinction coefficients of Ag as the anode, ITSO, and Ag:Mg.

Figure 16:
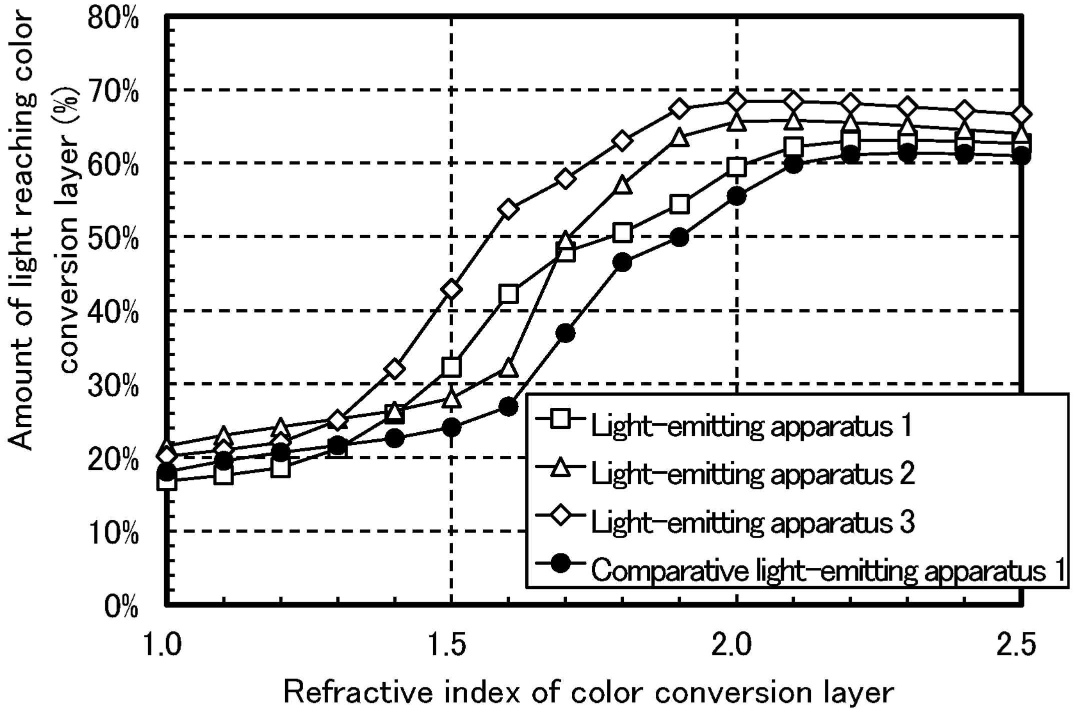
FIG. 16 is a diagram showing calculation results of the relationship between the refractive index of a color conversion layer (a QD layer) and the amount of light reaching the color conversion layer.

Under the above conditions, a change in the amount of light reaching the color conversion layer while the refractive index of the color conversion layer was changed was calculated. The amount of light that entered the conversion layer was calculated from the total of the light extraction efficiency and guide mode in the color conversion layer in the device structure where no light is absorbed by the color conversion layer. FIG. 16 shows the results.

It is found from FIG. 16 that a reduction in the refractive index of the hole-transport layer increases the amount of light reaching the color conversion layer while the refractive index of the color conversion layer is within the practical range. The increase in the amount of light reaching the color conversion layer means an increase in excitation light reaching the color conversion layer, and more QDs can be excited. In addition, the lower refractive index of the color conversion layer is found to exhibit the highest efficiency in Light-emitting apparatus 2 including the low refractive index layer in the electron-transport region and Light-emitting apparatus 3 including the low refractive index layers in the hole-transport region and the electron-transport region.

Specifically, in Comparative light-emitting apparatus 1 including a light-emitting device without a low refractive index layer inside the EL layer, when the refractive index of the resin in which QDs are dispersed is higher than or equal to 2.20, the amount of the light becomes a maximum value. Meanwhile, in pixels, Light-emitting apparatus 1 to Light-emitting apparatus 3 including a light-emitting device including the low refractive index layer inside the EL layer, when the refractive index of the resin is approximately 2.00, the amount of the light becomes a maximum value, and when the refractive index is 1.80 or higher, the amount of light reaching the color conversion layer is larger than the maximum amount of light reaching the color conversion layer in Comparative light-emitting apparatus 1. Furthermore, the amount of light reaching the color conversion layer is improved within a wide range of ordinary refractive index of the resin of 1.40 to 2.10 inclusive.

In general, a layer provided in contact with the electrode having a light-transmitting property to improve light extraction efficiency employs a material having a relatively high refractive index. However, there are only limited choices of organic compounds having a higher refractive index than many organic compounds. However, in Light-emitting apparatus 1 to Light-emitting apparatus 3 of one embodiment of the present invention, the refractive index of the resin that exerts the effect of improving the light extraction efficiency is found to be reduced by providing the low refractive index layer inside the EL layer.

Since the range of the refractive index higher than or equal to 1.80 and lower than or equal to 2.00 covers the refractive indices of many organic compounds used for organic EL devices, a wide range of material choices is available. By contrast, few organic compounds have a refractive index higher than or equal to 2.20. In addition, the efficiency in Comparative light-emitting device 1 decreases when the resin with a refractive index lower than or equal to 2.20 is used. Hence, when QDs are dispersed in a resin with a refractive index around 1.90 in the volume zone of the refractive indices of organic compounds, the efficiency differs from that of the light-emitting apparatus of one embodiment of the present invention using the low refractive index layer by as much as 14% to 17%.

The above reveals that the combination of the light-emitting device including the low refractive index layer and the color conversion layer using a QD brings not only the efficiency-improving effect due to the low refractive index layer but also the effect of increasing the range of material choices of the resin in which the QD is dispersed and the unique effect of maximizing the efficiency-improving effect with the use of a resin having a normal refractive index.

Note that the readiness of the use of the resin having a normal refractive index means that a material that sufficiently satisfies the other requisite performances can be selected from a very wide range. The structure of one embodiment of the present invention achieves a variety of benefits, such as obtaining a light-emitting apparatus whose efficiency is increased by selecting a resin with a high light-transmitting property, obtaining a light-emitting apparatus whose reliability is improved by selecting a resin with good durability, and obtaining a light-emitting apparatus with low manufacturing cost due to the use of an inexpensive resin.

The refractive index of the color conversion layer can be referred to as the refractive index of the resin in which QDs are dispersed. An effect similar to the above can be obtained also in the structure in which the color conversion layer and the light-emitting device are bonded with a resin having an appropriate refractive index. This increases the light reaching the color conversion layer, so that the light-emitting apparatus can have high efficiency. Note that the refractive index of the resin is assumed to be based on the above description of the refractive index of the resin in which QDs are dispersed.

Reference Example 1

In this reference example, Light-emitting device 1 to Light-emitting device 3 and Comparative light-emitting device 1 used in the light-emitting apparatus of one embodiment of the present invention described in the above embodiment are described. Structural formulae of organic compounds used in this reference example are shown below.

[Chemical Formula 15]
(i)
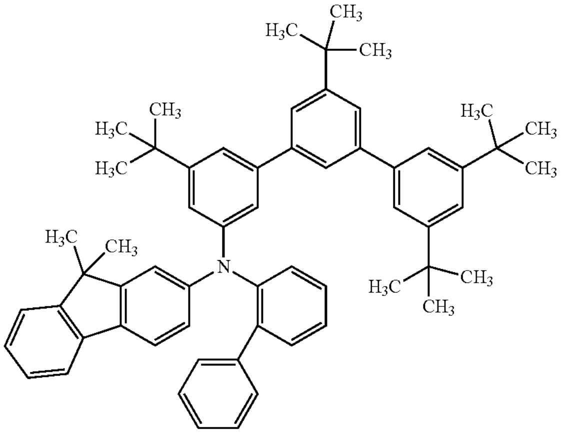
mmtBumTPoFBi-02
(ii)
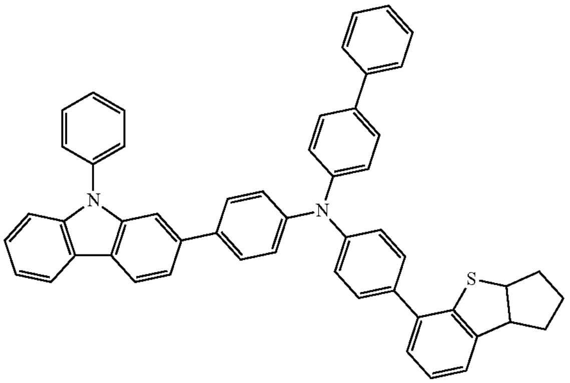
PCBBiPDBt-02
(iii)
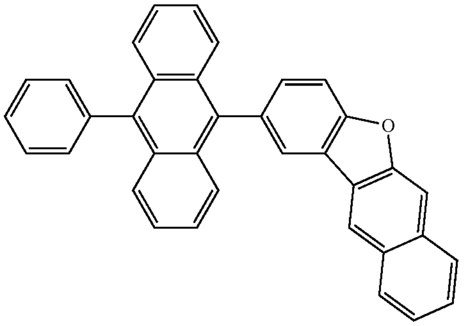
Bnf(II)PhA
(iv)
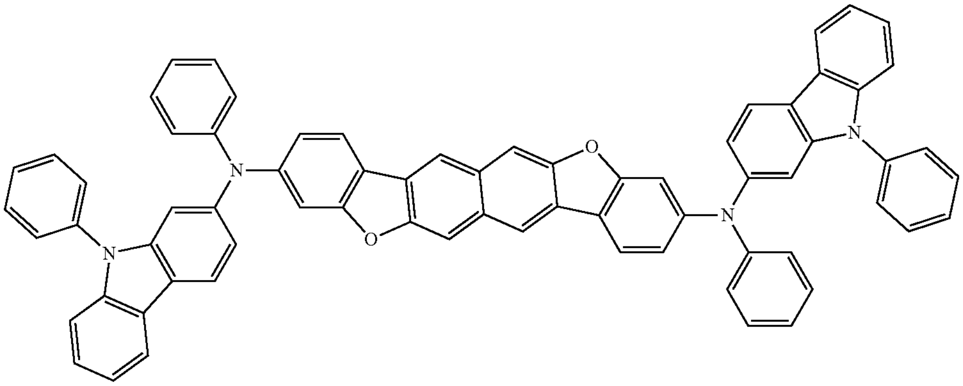
3,10PCA2Nbf(IV)-02

-continued (v)

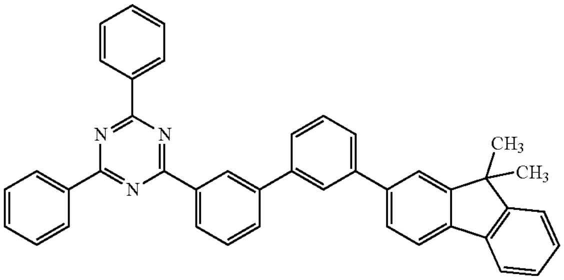

mFBPTzn (vi)

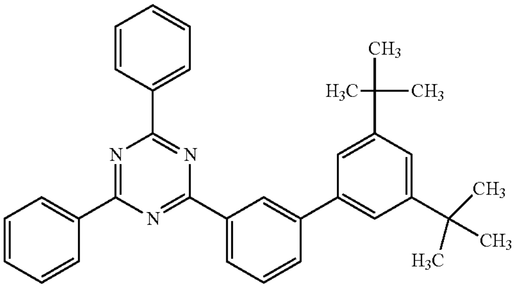

mmtBumBPTzn (vii)

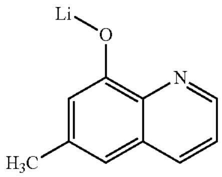

Li-6mg (viii)

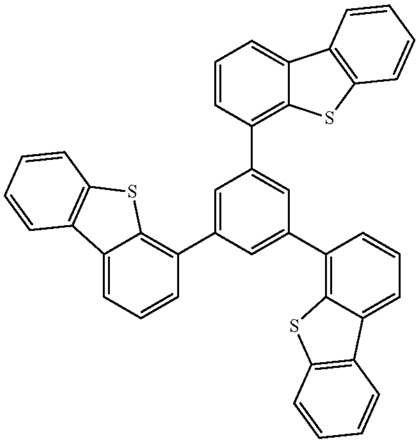

DBT3P-II (ix)

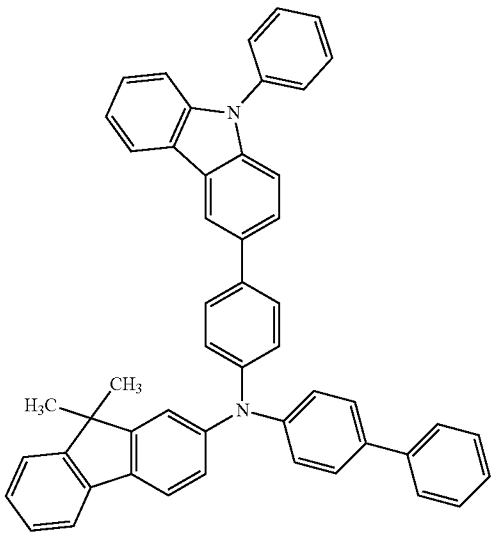

PCBBiF (x)

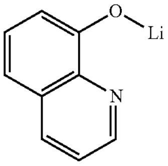

Liq (Fabrication Method of Light-Emitting Device 1)

First, as a reflective electrode, silver (Ag) was deposited over a glass substrate to a thickness of 100 nm by a sputtering method, and then, as a transparent electrode, indium tin oxide containing silicon oxide (ITSO) was deposited to a thickness of 10 nm by a sputtering method, whereby the anode 101 was formed. The electrode area was set to 4 $mm^2$ (2 mm×2 mm).

Next, in pretreatment for forming the light-emitting device over the substrate, a surface of the substrate was washed with water and baked at 200° C. for 1 hour, and then UV ozone treatment was performed for 370 seconds.

After that, the substrate was transferred into a vacuum evaporation apparatus where the pressure was reduced to approximately 10-4 Pa, vacuum baking was performed at 170° C. for 30 minutes in a heating chamber of the vacuum evaporation apparatus, and then the substrate was cooled down for approximately 30 minutes.

Next, the substrate provided with the anode 101 was fixed to a substrate holder provided in the vacuum evaporation apparatus such that the surface on which the anode 101 was formed faced downward. Then, by an evaporation method, N-(1,1'-biphenyl-2-yl)-N-(3,3",5',5"-tetra-t-butyl-1,1':3',1"-terphenyl-5-yl)-9,9-dimethyl-9H-fluoren-2-amine (abbreviation: mmtBumTPoFBi-02) represented by Structural Formula (i) shown above and an electron acceptor material containing fluorine with a molecular weight of 672 (OCHD-003) were deposited on the anode 101 to a thickness of 10 nm by co-evaporation such that the weight ratio was 1:0.1 (=mmtBumTPoFBi-02:OCHD-003), whereby the hole-injection layer 111 was formed.

Over the hole-injection layer 111, mmtBumTPoFBi-02 was deposited to a thickness of 130 nm by evaporation, whereby the hole-transport layer 112 was formed.

Subsequently, over the hole-transport layer 112, 4-(dibenzothiophene-4-yl)-4'-phenyl-4"-(9-phenyl-9H-carbazol-2-yl)triphenylamine (abbreviation: PCBBiPDBt-02) represented by Structural Formula (ii) shown above was deposited to a thickness of 10 nm by evaporation, whereby an electron-blocking layer was formed.

Then, 2-(10-phenyl-9-anthracenyl)-benzo[b]naphtho[2,3-d]furan (abbreviation: Bnf(II)PhA) represented by Structural Formula (iii) shown above and 3,10-bis[N-(9-phenyl-9H-carbazol-2-yl)-N-phenylamino]naphtho[2,3-b;6,7-b'] bisbenzofuran (abbreviation: 3,10PCA2Nbf(IV)-02) represented by Structural Formula (iv) shown above were deposited to a thickness of 25 nm by co-evaporation such that the weight ratio was 1:0.015 (=Bnf(II)PhA:3,10PCA2Nbf(IV)-02), whereby the light-emitting layer 113 was formed.

After that, 2-[3'-(9,9-dimethyl-9H-fluoren-2-yl)-1,1'-biphenyl-3-yl]-4,6-diphenyl-1,3,5-triazine (abbreviation: mFBPTzn) represented by Structural Formula (v) shown above was deposited to a thickness of 10 nm by evaporation, whereby a hole-blocking layer was formed. Then, 2-{(3',5'-di-tert-butyl)-1,1'-biphenyl-3-yl}-4,6-diphenyl-1,3,5-triazine (abbreviation: mmtBumBPTzn) represented by Structural Formula (vi) shown above and 6-methyl-8-quinolinolato-lithium (abbreviation: Li-6mq) represented by Structural Formula (vii) shown above were deposited to a thickness of 20 nm by co-evaporation such that the weight ratio was 1:1 (=mmtBumBPTzn:Li-6mq), whereby the electron-transport layer 114 was formed.

After the electron-transport layer 114 was formed, lithium fluoride (LiF) was deposited to 1 nm to form the electron-injection layer 115, and lastly silver (Ag) and magnesium (Mg) were deposited to a thickness of 15 nm by co-evaporation such that the volume ratio was 1:0.1 to form the cathode 102, whereby Light-emitting device 1 was fabricated. Note that the cathode 102 is a transflective electrode having a function of reflecting light and a function of transmitting light; thus, the light-emitting device of this example is a top-emission device in which light is extracted through the cathode 102. Furthermore, over the cathode 102, 1,3,5-tri(dibenzothiophen-4-yl)-benzene (abbreviation: DBT3P-II) represented by Structural Formula (x) shown above was deposited to a thickness of 70 nm by evaporation to improve outcoupling efficiency.

(Fabrication Method of Light-Emitting Device 2)

Light-emitting device 2 was fabricated in a manner similar to that of the light-emitting device 1 except that mmtBumTPoFBi-02 in the hole-transport layer of Light-emitting device 1 was replaced with N-(1,1'-biphenyl-4-yl)-N-[4-(9-phenyl-9H-carbazol-3-yl)phenyl]-9,9-dimethyl-9H-fluoren-2-amine (abbreviation: PCBBiF) represented by Structural Formula (ix) shown above and the thickness was set to 115 nm.

(Fabrication Method of Light-Emitting Device 3)

Light-emitting device 3 was fabricated in a manner similar to that of the light-emitting device 1 except that mmtBumBPTzn and Li-6mq in the electron-transport layer of Light-emitting device 1 were replaced with 2-[3-(2,6-dimethyl-3-pyridinyl)-5-(9-phenanthrenyl)phenyl]-4,6-diphenyl-1,3,5-triazine (abbreviation: mPn-mDMePyPTzn) and 8-quinolinolato-lithium (abbreviation: Liq) represented by Structural Formula (x) shown above, respectively.

(Fabrication Method of Comparative Light-Emitting Device 1)

Comparative light-emitting device 1 was fabricated in a manner similar to that of the light-emitting device 1 except that mmtBumTPoFBi-02 in the hole-transport layer of Light-emitting device 1 was replaced with PCBBiF, the thickness was set to 115 nm, and mmtBumBPTzn and Li-6mq in the electron-transport layer were replaced with mPn-mDMePyPTzn and Liq, respectively.

The element structures of Light-emitting device 1 to Light-emitting device 3 and Comparative light-emitting device 1 are listed in the following table.

TABLE 2

| | | Light-emitting device 1 | Light-emitting device 2 | Light-emitting device 3 | Comparative light-emitting device 1 |
|---|---|---|---|---|---|
| Electron-injection layer | 1 nm | LIF | | | |
| Electron-transport layer | 20 nm | mmtBumBPTzn:Li-6mq (1:1) | | mPn-mDMePyPTzn:Liq (1:1) | |
| Hole-blocking layer | 10 nm | mFBPTzn | | | |
| Light-emitting layer | 25 nm | Bnf(II)PhA:3,10PCA2Nbf(IV)-02 (1:0.015) | | | |
| Electron-blocking layer | 10 nm | PCBBiPDBt-02 | | | |
| Hole-transport layer | *1 | *2 | | | |
| Hole-injection layer | 10 nm | *2:OCHD-003 (1:0.1) | | | |

Figure 17:
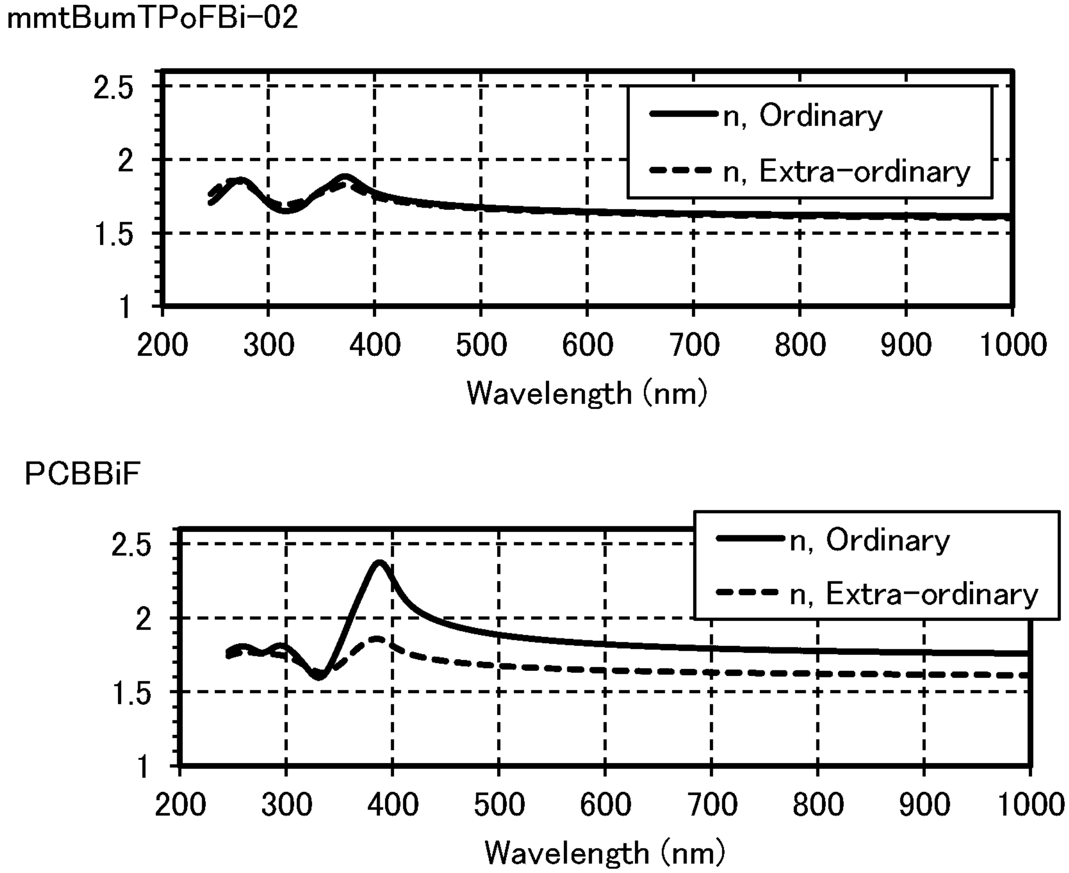
FIG. 17 shows the measurement data of the refractive indices of mmtBumTPoFBi-02 and PCBBiF.
Figure 18:
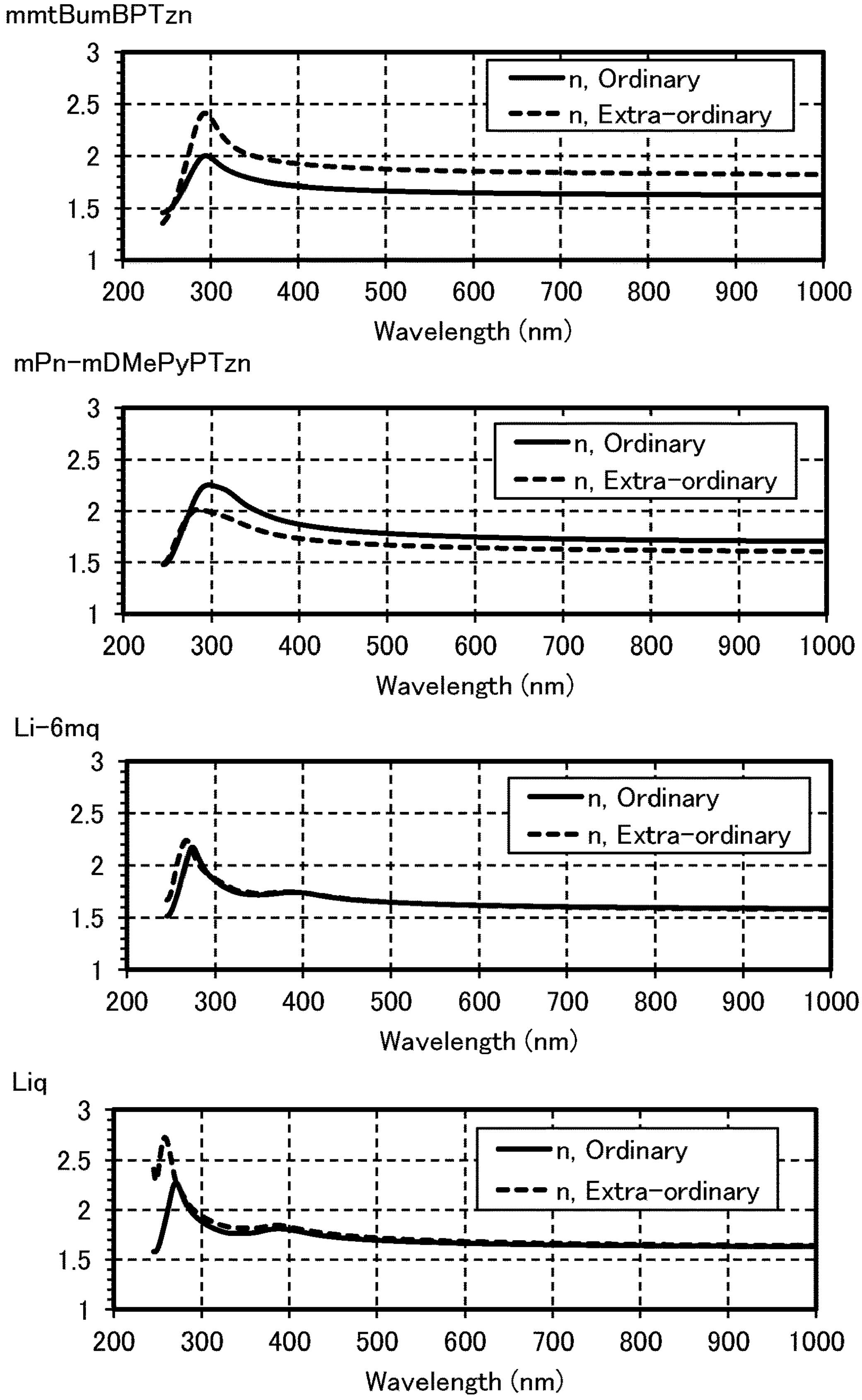
FIG. 18 shows the measurement data of the refractive indices of mmtBumBPTzn, mPn-mDMePyPTzn, Li-6mq, and Liq.

Light-emitting device 1 *1 130 nm *2 mmtBumTPoFBi-02
Light-emitting device 2 115 nm PCBBiF
Light-emitting device 3 130 nm mmtBumTPoFBi-02
Comparative light-emitting device 1 115 nm PCBBiF The refractive indexes of mmtBumTPoFBi-02 and PCBBiF are shown in FIG. 17, the refractive indexes of mmtBumBPTzn, mPn-mDMePyPTzn, Li-6mq, and Liq are shown in FIG. 18, and the refractive indexes at 456 nm are shown in the following table. The measurement was performed with a spectroscopic ellipsometer (M-2000U manufactured by J.A. Woollam Japan Corp.). As measurement samples, films obtained by depositing the materials of the respective layers to approximately 50 nm over a quartz substrate by a vacuum evaporation method were used. Note that a refractive index for an ordinary ray, n Ordinary, and a refractive index for an extraordinary ray, n Extra-ordinary, are shown in the graphs.

According to the graphs, mmtBumTPoFBi-02 is a material with a low refractive index: the ordinary refractive index is 1.69 to 1.70, which is within the range higher than or equal to 1.50 and lower than or equal to 1.75, in the entire blue light emission region (greater than or equal to 455 nm and less than or equal to 465 nm) and the ordinary refractive index at 633 nm is 1.64, which is within the range higher than or equal to 1.45 and lower than or equal to 1.70. The ordinary refractive index of mmtBumBPTzn in the entire blue light emission region (greater than or equal to 455 nm and less than or equal to 465 nm) is 1.68, which is within the range higher than or equal to 1.50 and lower than or equal to 1.75. In addition, the ordinary refractive index at 633 nm is 1.64, which is within the range higher than or equal to 1.45 and lower than or equal to 1.70, showing that mmtBumBPTzn is a material with a low refractive index. The ordinary refractive index of Li-6mq in the entire blue light emission region (greater than or equal to 455 nm and less than or equal to 465 nm) is lower than or equal to 1.67, which is within the range higher than or equal to 1.45 and lower than or equal to 1.70. In addition, the ordinary refractive index of Li-6mq at 633 nm is 1.61, which is within the range higher than or equal to 1.40 and lower than or equal to 1.65, showing that Li-6mq is a material with a low refractive index.

The above indicates that the ordinary refractive indexes of both the hole-transport layer 112 and the electron-transport layer 114 in Light-emitting device 1, the ordinary refractive index of the electron-transport layer 114 in Light-emitting device 2, and the ordinary refractive index of the hole-transport layer 112 in Light-emitting device 3 are in the range higher than or equal to 1.50 and lower than 1.75 in the entire blue light emission region (greater than or equal to 455 nm and less than or equal to 465 nm) and being in the range higher than or equal to 1.45 and lower than 1.70 at 633 nm.

TABLE 3

| | Ordinary refractive index (n, Ordinary) @456 nm |
|---|---|
| mmtBumTPoFBi-02 | 1.70 |
| PCBBiF | 1.83 |
| mmtBumBPTzn | 1.68 |
| mPn-mDMePyPTzn | 1.81 |
| Li-6mq | 1.67 |
| Liq | 1.72 |

The light-emitting devices and Comparative light-emitting device 1 were sealed using a glass substrate in a glove box containing a nitrogen atmosphere so as not to be exposed to the air. Specifically, a UV curable sealing material was applied to surround the devices, only the sealing material was irradiated with UV while the light-emitting devices were not irradiated with the UV, and heat treatment was performed at 80° C. under an atmospheric pressure for one hour. Then, the initial characteristics of the light-emitting devices were measured.

Figure 19:
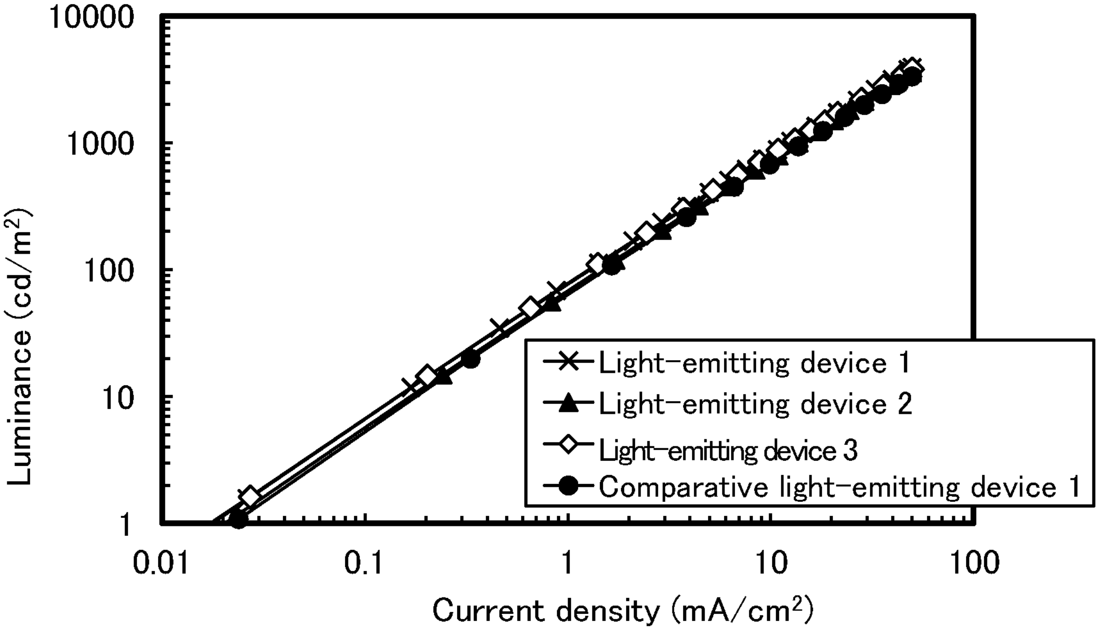
FIG. 19 shows the luminance-current density characteristics of Light-emitting device 1 to Light-emitting device 3 and Comparative light-emitting device 1.
Figure 20:
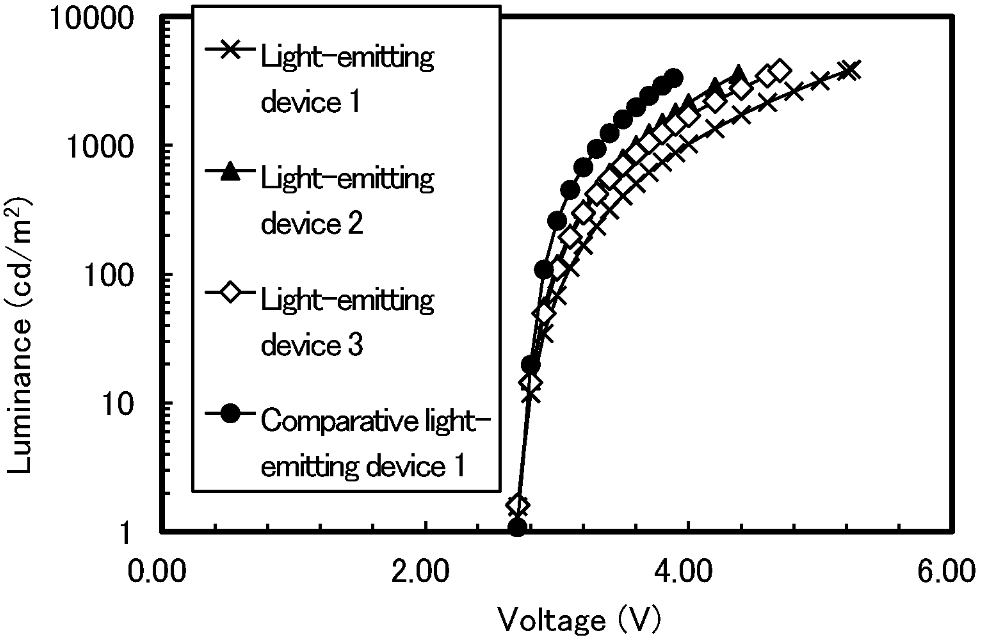
FIG. 20 shows the luminance-voltage characteristics of Light-emitting device 1 to Light-emitting device 3 and Comparative light-emitting device 1.
Figure 21:
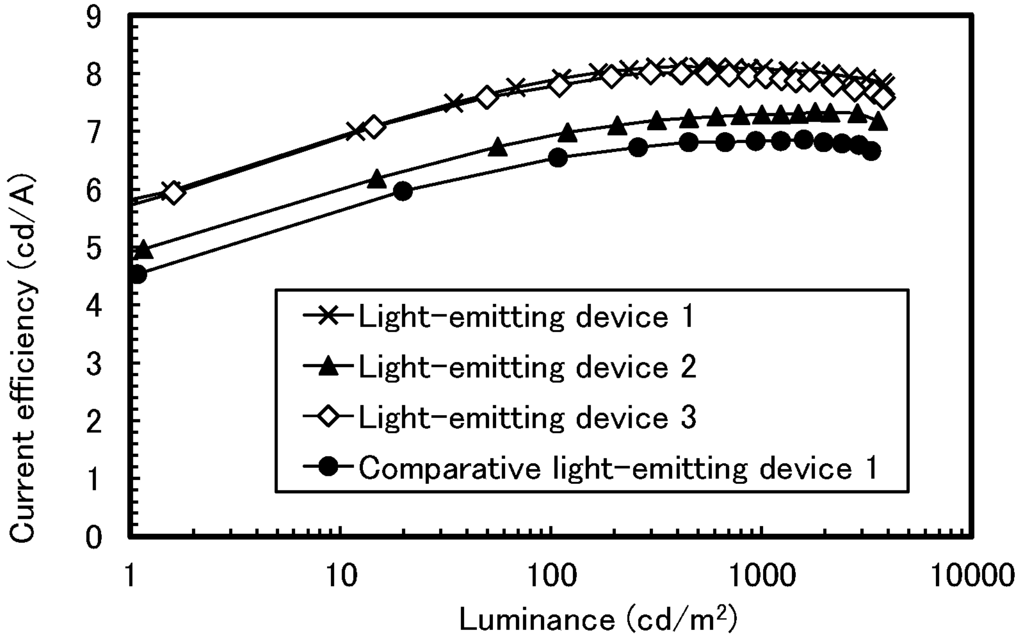
FIG. 21 shows the current efficiency-luminance characteristics of Light-emitting device 1 to Light-emitting device 3 and Comparative light-emitting device 1.
Figure 22:
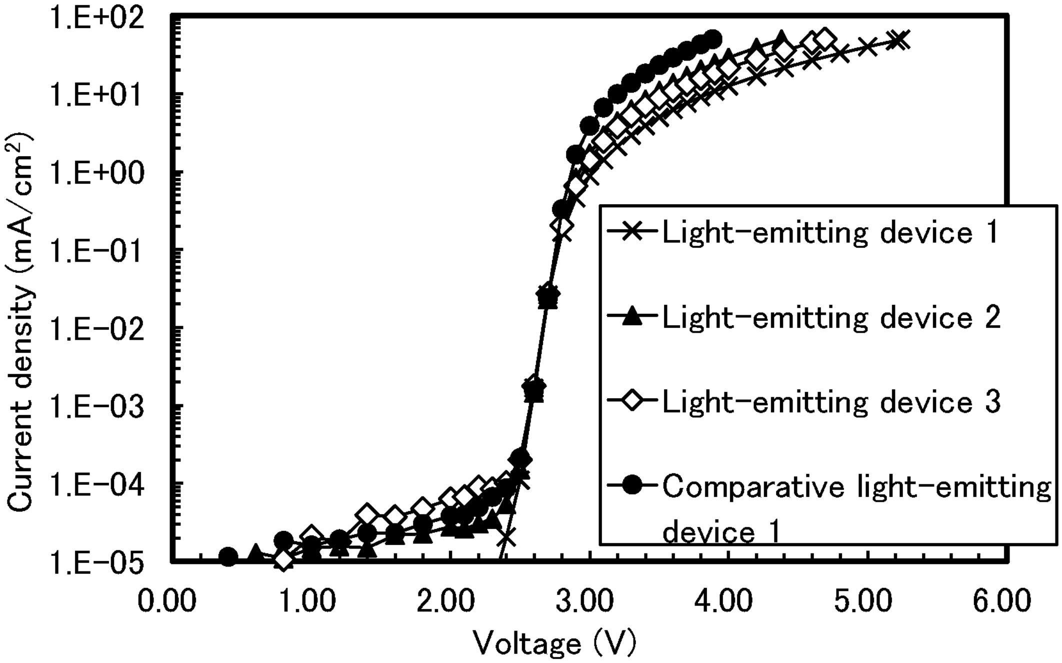
FIG. 22 shows current density-voltage characteristics of Light-emitting device 1 to Light-emitting device 3 and Comparative light-emitting device 1.
Figure 23:
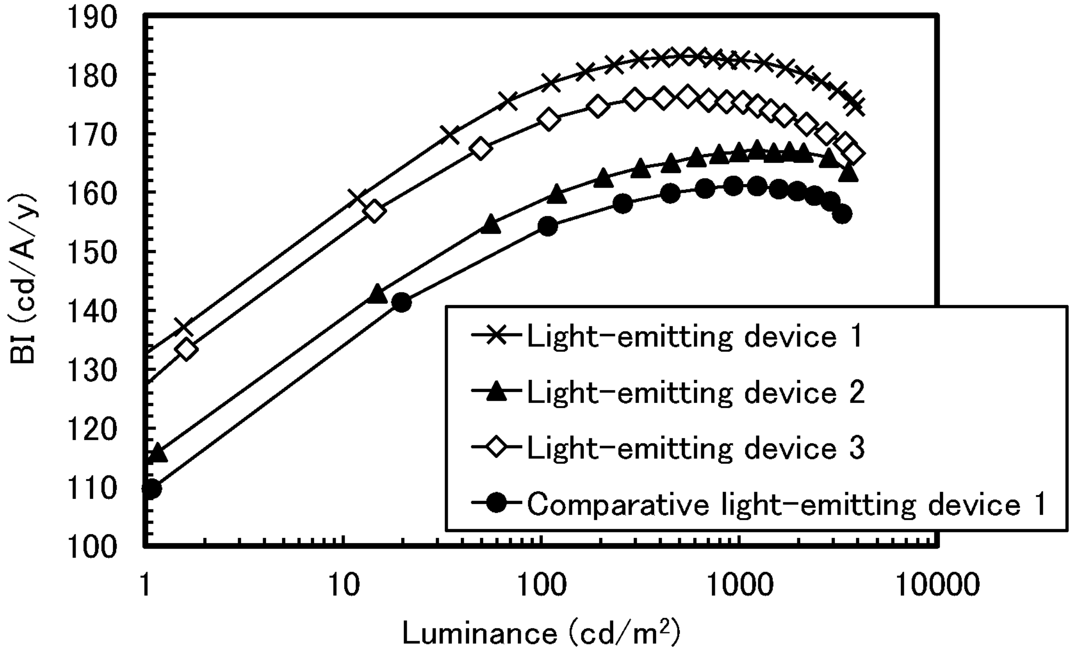
FIG. 23 shows the blue index (BI)-luminance characteristics of Light-emitting device 1 to Light-emitting device 3 and Comparative light-emitting device 1.
Figure 24:
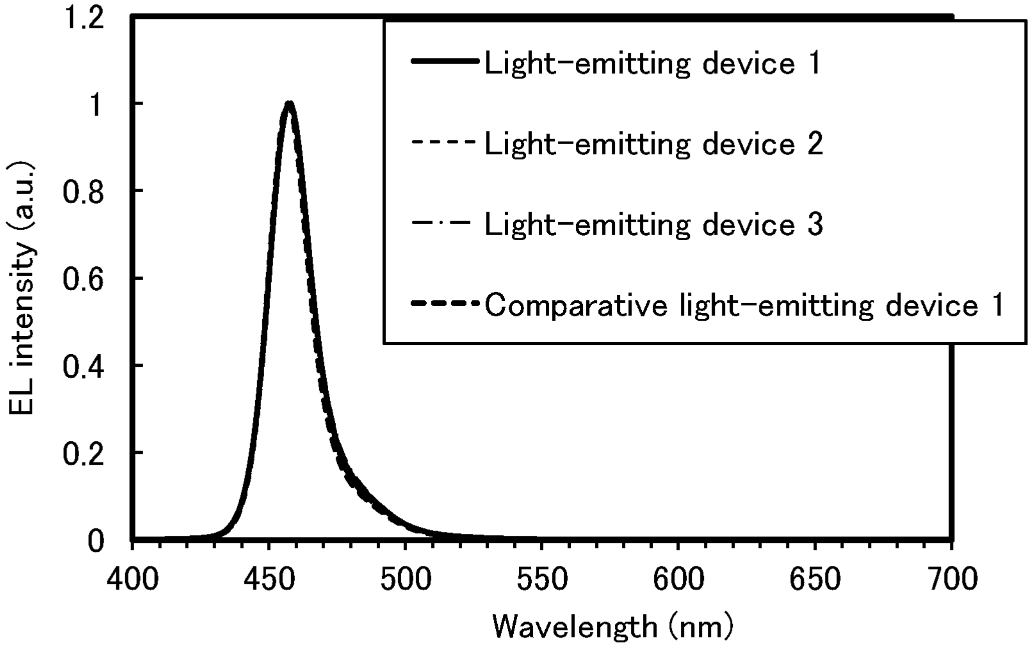
FIG. 24 shows emission spectra of Light-emitting device 1 to Light-emitting device 3 and Comparative light-emitting device 1.

FIG. 19 shows the luminance-current density characteristics of Light-emitting device 1 to Light-emitting device 3 and Comparative light-emitting device 1, FIG. 20 shows the luminance-voltage characteristics thereof, FIG. 21 shows the current efficiency-luminance characteristics thereof, FIG. 22 shows the current density-voltage characteristics thereof, FIG. 23 shows the blue index-luminance characteristics thereof, and FIG. 24 shows the emission spectra thereof. Table 4 shows the main characteristics of Light-emitting device 1 to Light-emitting device 3 and Comparative light-emitting device 1 at approximately 1000 cd/$m^2$. The luminance, CIE chromaticity, and emission spectra were measured at normal temperature with a spectroradiometer (SR-UL1R manufactured by TOPCON TECHNOHOUSE CORPORATION).

Note that the blue index (BI) is a value obtained by further dividing current efficiency (cd/A) by chromaticity y, and is one of the indicators representing characteristics of blue light emission. As the chromaticity y is smaller, the color purity of blue light emission tends to be higher. With high color purity for blue light emission, a wide range of blue can be expressed even with a small number of luminance components; thus, using blue light emission with high color purity reduces the luminance needed for expressing blue, leading to lower power consumption. Thus, BI that is based on chromaticity y, which is one of the indicators of color purity of blue, is suitably used as a means for showing efficiency of blue light emission. The light-emitting device with higher BI can be regarded as a blue light-emitting device having more favorable efficiency for a display.

TABLE 4

| | Voltage (V) | Current (mA) | Current density (mA/$cm^2$) | Chromaticity (x, y) | Current efficiency (cd/A) | BI (cd/A/y) |
|---|---|---|---|---|---|---|
| Light-emitting device 1 | 4.0 | 0.51 | 12.6 | (0.143, 0.044) | 8.1 | 182 |
| Light-emitting device 2 | 3.6 | 0.55 | 13.8 | (0.142, 0.044) | 7.3 | 167 |
| Light-emitting device 3 | 3.7 | 0.53 | 13.2 | (0.142, 0.045) | 7.9 | 175 |
| Comparative light-emitting device 1 | 3.3 | 0.55 | 13.7 | (0.143, 0.042) | 6.8 | 161 |

According to FIG. 18 to FIG. 24 and Table 4, Light-emitting device 1 to Light-emitting device 3, which use the low refractive index layer of one embodiment of the present invention in both the hole-transport region 120 and the electron-transport region 121, have turned out to be EL devices with favorable current efficiency and BI while exhibiting substantially the same emission spectrum as that of Comparative light-emitting device 1, which is not provided with any low refractive index region.

As described above, the light-emitting device including the low refractive index layer in the EL layer can be a light-emitting device having more favorable emission efficiency than a light-emitting device including no low refractive index layer. The light-emitting device can have further favorable emission efficiency when applied to the light-emitting apparatus with the structure of one embodiment of the present invention using a layer in which QDs are dispersed in a resin with a refractive index higher than or equal to 1.8 and lower than or equal to 2.0 as the color conversion layer.

Reference Example 2

Reference Synthesis Example 1

In this synthesis example, a synthesis method of the hole-transport material with a low refractive index described in Embodiment 2 is described.

First, a synthesis method of N,N-bis(4-cyclohexylphenyl)-N-(9,9-dimethyl-9H-fluoren-2yl)amine (abbreviation: dchPAF) is described in detail. The structure of dchPAF is shown below.

[Chemical Formula 16]

(100)

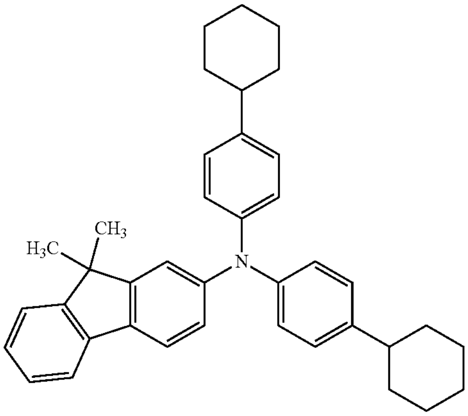

Step 1: Synthesis of N,N-bis(4-cyclohexylphenyl)-9,9-dimethyl-9H-fluoren-2-amine (Abbreviation: dchPAF)

In a three-neck flask were put 10.6 g (51 mmol) of 9,9-dimethyl-9H-fluoren-2-amine, 18.2 g (76 mmol) of 4-cyclohexyl-1-bromobenzene, 21.9 g (228 mmol) of sodium-tert-butoxide, and 255 mL of xylene. This mixture was degassed under reduced pressure, and then the air in the flask was replaced with nitrogen. The mixture was stirred while being heated to approximately 50° C. Then, 370 mg (1.0 mmol) of allylpalladium(II) chloride dimer (abbreviation: $(Allyl)PdCl_2$) and 1660 mg (4.0 mmol) of di-tert-butyl (1-methyl-2,2-diphenylcyclopropyl)phosphine (abbreviation: cBRIDP (registered trademark)) were added, and the mixture was heated at 120° C. for approximately 5 hours. After that, the temperature of the flask was lowered to approximately 60° C., and approximately 4 mL of water was added to the mixture, so that a solid was precipitated. The precipitated solid was separated by filtration. The filtrate was concentrated, and the obtained solution was purified by silica gel column chromatography. The obtained solution was concentrated to give a concentrated toluene solution. The toluene solution was dropped into ethanol for reprecipitation. The precipitate was collected by filtration at approximately 10° C. and the obtained solid was dried at approximately 80° C. under reduced pressure, whereby 10.1 g of a target white solid was obtained in a yield of 40%. The synthesis scheme of dchPAF in Step 1 is shown below.

[Chemical Formula 17]

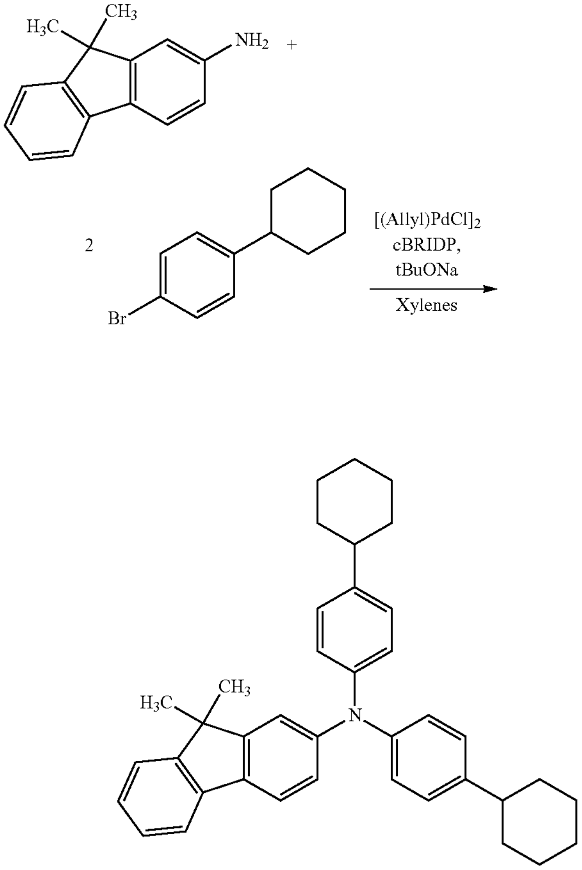

(100)

Analysis results by nuclear magnetic resonance spectroscopy ($^1$H-NMR) of the white solid obtained in Step 1 are shown below. The results show that dchPAF was synthesized in this synthesis example.

$^1$H-NMR. δ ($CDCl_3$): 7.60 (d, 1H, J=7.5 Hz), 7.53 (d, 1H, J=8.0 Hz), 7.37 (d, 2H, J=7.5 Hz), 7.29 (td, 1H, J=7.5 Hz, 1.0 Hz), 7.23 (td, 1H, J=7.5 Hz, 1.0 Hz), 7.19 (d, 1H, J=1.5 Hz), 7.06 (m, 8H), 6.97 (dd, 1H, J=8.0 Hz, 1.5 Hz), 2.41-2.51 (brm, 2H), 1.79-1.95 (m, 8H), 1.70-1.77 (m, 2H), 1.33-1.45 (brm, 14H), 1.19-1.30 (brm, 2H).

Similarly, the organic compounds represented by Structural Formulae (101) to (109) were synthesized.

[Chemical Formula 18]
(101)
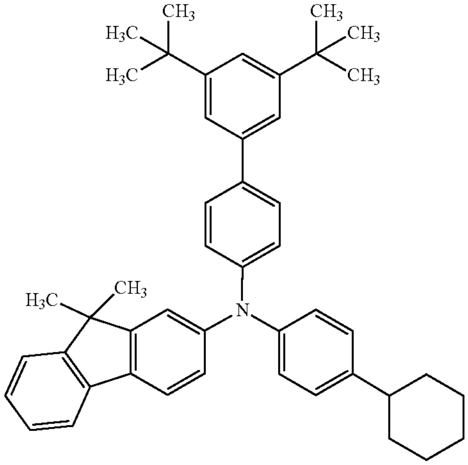
(102)
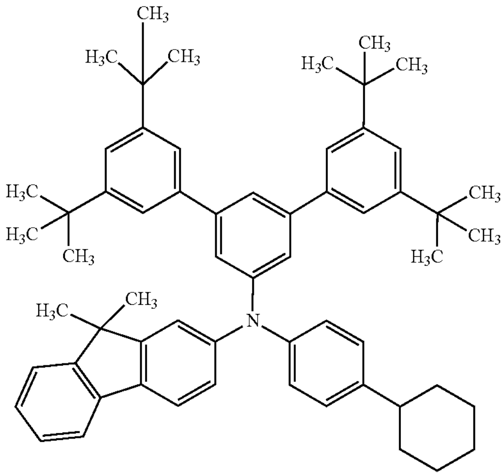
(103)
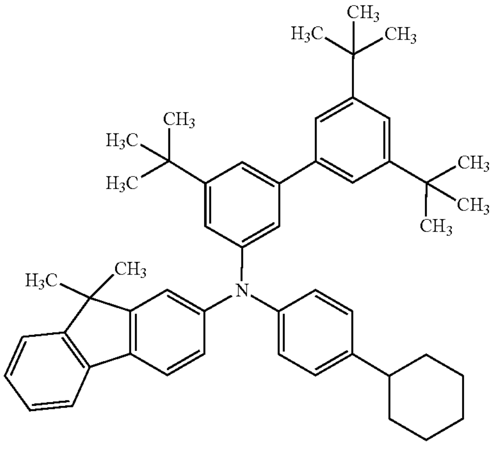
-continued
(104)
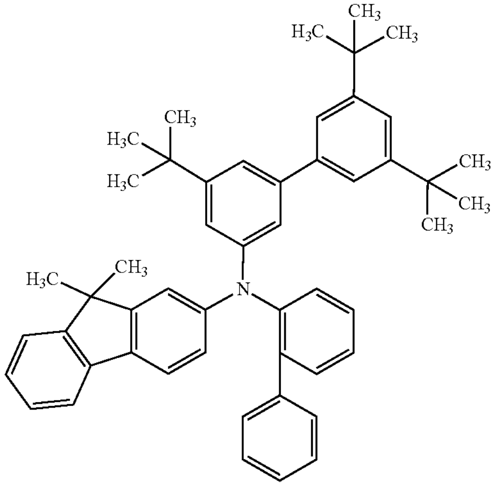
(105)
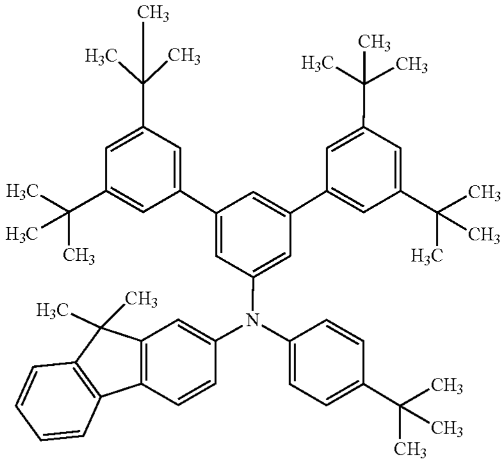
[Chemical Formula 19]
(106)
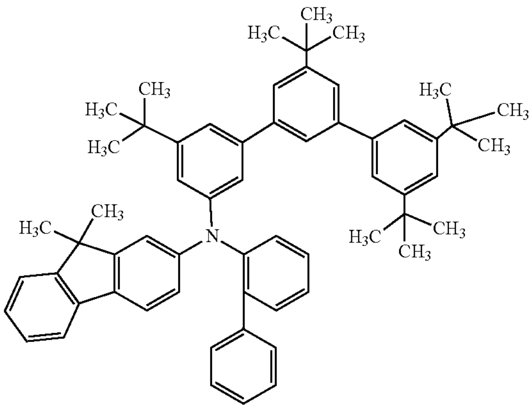

-continued (107)

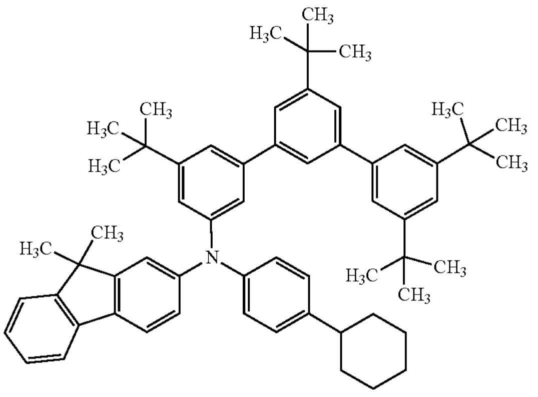

(108)

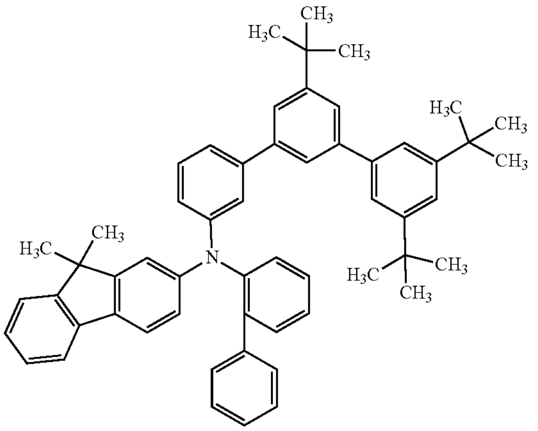

(109)

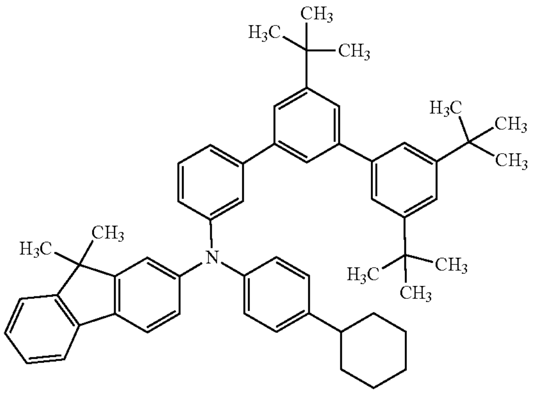

Analysis results by nuclear magnetic resonance spectroscopy ($^{1}$H-NMR) of the above organic compound are shown below.

Structural Formula (101): N-(4-cyclohexylphenyl)-N-(3",5"-ditertiarybutyl-1,1"-biphenyl-4-yl)-N-(9,9-dimethyl-9H-fluoren-2yl)amine (Abbreviation: mmtBuBichPAF)

$^{1}$H-NMR. δ ($CDCl_3$): 7.63 (d, 1H, J=7.5 Hz), 7.57 (d, 1H, J=8.0 Hz), 7.44-7.49 (m, 2H), 7.37-7.42 (m, 4H), 7.31 (td, 1H, J=7.5 Hz, 2.0 Hz), 7.23-7.27 (m, 2H), 7.15-7.19 (m, 2H), 7.08-7.14 (m, 4H), 7.05 (dd, 1H, J=8.0 Hz, 2.0 Hz), 2.43-2.53 (brm, 1H), 1.81-1.96 (m, 4H), 1.75 (d, 1H, J=12.5 Hz), 1.32-1.48 (m, 28H), 1.20-1.31 (brm, 1H).

Structural Formula (102): N-(3,3",5,5"-tetra-t-butyl-1,1': 3',1"-terphenyl-5'-yl)-N-(4-cyclohexylphenyl)-9,9-dimethyl-9H-fluoren-2-amine (Abbreviation: mmtBumTPchPAF)

$^{1}$H-NMR (300 MHz, $CDCl_3$): δ=7.63 (d, J=6.6 Hz, 1H), 7.58 (d, J=8.1 Hz, 1H), 7.42-7.37 (m, 4H), 7.36-7.09 (m, 14H), 2.55-2.39 (m, 1H), 1.98-1.20 (m, 51H).

Structural Formula (103): N-[(3,3',5'-t-butyl)-1,1'-biphenyl-5-yl]-N-(4-cyclohexylphenyl)-9,9-dimethyl-9H-fluoren-2-amine (Abbreviation: mmtBumBichPAF)

$^{1}$H-NMR. δ ($CDCl_3$): 7.63 (d, 1H, J=7.5 Hz), 7.56 (d, 1H, J=8.5 Hz), 7.37-40 (m, 2H), 7.27-7.32 (m, 4H), 7.22-7.25 (m, 1H), 7.16-7.19 (brm, 2H), 7.08-7.15 (m, 4H), 7.02-7.06 (m, 2H), 2.43-2.51 (brm, 1H), 1.80-1.93 (brm, 4H), 1.71-1.77 (brm, 1H), 1.36-1.46 (brm, 10H), 1.33 (s, 18H), 1.22-1.30 (brm, 10H).

Structural Formula (104): N-(1,1'-biphenyl-2-yl)-N-[(3,3',5'-tri-t-butyl)-1,1'-biphenyl-5-yl]-9,9-dimethyl-9H-fluoren-2-amine (Abbreviation: mmtBumBioFBi)

$^{1}$H-NMR. δ ($CDCl_3$): 7.57 (d, 1H, J=7.5 Hz), 7.40-7.47 (m, 2H), 7.32-7.39 (m, 4H), 7.27-7.31 (m, 2H), 7.27-7.24 (m, 5H), 6.94-7.09 (m, 6H), 6.83 (brs, 2H), 1.33 (s, 18H), 1.32 (s, 6H), 1.20 (s, 9H).

Structural Formula (105): N-(4-tert-butylphenyl)-N-(3,3",5,5"-tetra-t-butyl-1,1':3',1"-terphenyl-5'-yl)-9,9-dimethyl-9H-fluoren-2-amine (Abbreviation: mmtBumTPtBuPAF)

$^{1}$H-NMR. δ ($CDCl_3$): 7.64 (d, 1H, J=7.5 Hz), 7.59 (d, 1H, J=8.0 Hz), 7.38-7.43 (m, 4H), 7.29-7.36 (m, 8H), 7.24-7.28 (m, 3H), 7.19 (d, 2H, J=8.5 Hz), 7.13 (dd, 1H, J=1.5 Hz, 8.0 Hz), 1.47 (s, 6H), 1.32 (s, 45H).

Structural Formula (106): N-(1,1'-biphenyl-2-yl)-N-(3,3",5',5"-tetra-t-butyl-1,1':3',1"-terphenyl-5-yl)-9,9-dimethyl-9H-fluoren-2-amine (Abbreviation: mmtBumTPoFBi-02)

$^{1}$H-NMR. δ ($CDCl_3$): 7.56 (d, 1H, J=7.4 Hz), 7.50 (dd, 1H, J=1.7 Hz), 7.33-7.46 (m, 11H), 7.27-7.29 (m, 2H), 7.22 (dd, 1H, J=2.3 Hz), 7.15 (d, 1H, J=6.9 Hz), 6.98-7.07 (m, 7H), 6.93 (s, 1H), 6.84 (d, 1H, J=6.3 Hz), 1.38 (s, 9H), 1.37 (s, 18H), 1.31 (s, 6H), 1.20 (s, 9H).

Structural Formula (107): N-(4-cyclohexylphenyl)-N-(3,3",5',5"-tetra-t-butyl-1,1':3',1"-terphenyl-5-yl)-9,9-dimethyl-9H-fluoren-2-amine (Abbreviation: mmtBumTPchPAF-02)

$^{1}$H-NMR. δ ($CDCl_3$): 7.62 (d, 1H, J=7.5 Hz), 7.56 (d, 1H, J=8.0 Hz), 7.50 (dd, 1H, J=1.7 Hz), 7.46=7.47 (m, 2H), 7.43 (dd, 1H, J=1.7 Hz), 7.37=7.39 (m, 3H), 7.29=7.32 (m, 2H), 7.23=7.25 (m, 2H), 7.20 (dd, 1H, J=1.7 Hz), 7.09-7.14 (m, 5H), 7.05 (dd, 1H, J=2.3 Hz), 2.46 (brm, 1H), 1.83=1.88 (m, 4H), 1.73=1.75 (brm, 1H), 1.42 (s, 6H), 1.38 (s, 9H), 1.36 (s, 18H), 1.29 (s, 9H).

Structural Formula (108): N-(1,1'-biphenyl-2-yl)-N-(3",5',5"-tri-t-butyl-1,1':3',1"-terphenyl-5-yl)-9,9-dimethyl-9H-fluoren-2-amine (Abbreviation: mmtBumTPoFBi-03)

$^1$H-NMR. δ ($CDCl_3$): 7.55 (d, 1H, J=7.4 Hz), 7.50 (dd, 1H, J=1.7 Hz), 7.42-7.43 (m, 3H), 7.27-7.39 (m, 10H), 7.18-7.25 (m, 4H), 7.00-7.12 (m, 4H), 6.97 (dd, 1H, J=6.3 Hz, 1.7 Hz), 6.93 (d, 1H, J=1.7 Hz), 6.82 (dd, 1H, J=7.3 Hz, 2.3 Hz), 1.37 (s, 9H), 1.36 (s, 18H), 1.29 (s, 6H).

Structural Formula (109): N-(4-cyclohexylphenyl)-N-(3",5',5"-tri-t-butyl-1,1':3',1"-terphenyl-5-yl)-9,9-dimethyl-9H-fluoren-2-amine (Abbreviation: mmtBumTPchPAF-03)

$^1$H-NMR. δ ($CDCl_3$): 7.62 (d, 1H, J=7.5 Hz), 7.56 (d, 1H, J=8.6 Hz), 7.51 (dd, 1H, J=1.7 Hz), 7.48 (dd, 1H, J=1.7 Hz), 7.46 (dd, 1H, J=1.7 Hz), 7.42 (dd, 1H, J=1.7 Hz), 7.37-7.39 (m, 4H), 7.27-7.33 (m, 2H), 7.23-7.25 (m, 2H), 7.05-7.13 (m, 7H), 2.46 (brm, 1H), 1.83-1.90 (m, 4H), 1.73-1.75 (brm, 1H), 1.41 (s, 6H), 1.37 (s, 9H), 1.35 (s, 18H).

The substances described above each have an ordinary refractive index higher than or equal to 1.50 and lower than or equal to 1.75 in a blue light emission range (455 nm to 465 nm) or an ordinary refractive index higher than or equal to 1.45 and lower than or equal to 1.70 with respect to 633-nm light, which is usually used for measurement of refractive indices.

Reference Example 3

Reference Synthesis Example 2

An example of a synthesis method of the material with a low refractive index and an electron-transport property described in Embodiment 2 is described below.

First, a synthesis method of 2-{(3',5'-di-tert-butyl)-1,1'-biphenyl-3-yl}-4,6-bis(3,5-di-tert-butylphenyl)-1,3,5-triazine (abbreviation: mmtBumBP-dmmtBuPTzn), which is an organic compound represented by Structural Formula (200), is described. The structure of mmtBumBP-dmmtBuPTzn is shown below.

[Chemical Formula 20]

(200)

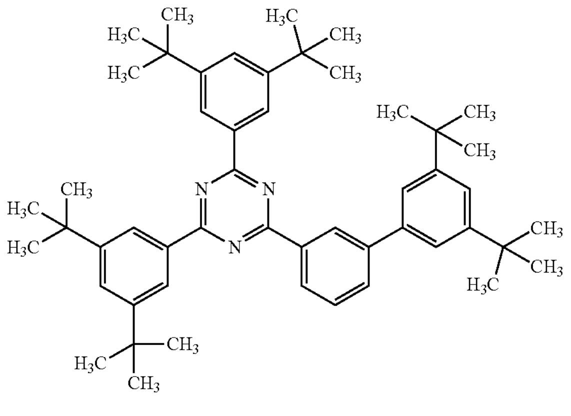

Step 1: Synthesis of 3-bromo-3',5'-di-tert-butylbiphenyl

First, 1.0 g (4.3 mmol) of 3,5-di-t-butylphenylboronic acid, 1.5 g (5.2 mmol) of 1-bromo-3-iodobenzene, 4.5 mL of 2 mol/L aqueous solution of potassium carbonate, 20 mL of toluene, and 3 mL of ethanol were put into a three-neck flask and stirred under reduced pressure to be degassed. Furthermore, 52 mg (0.17 mmol) of tris(2-methylphenyl)phosphine and 10 mg (0.043 mmol) of palladium(II) acetate were added to this mixture, and reacted under a nitrogen atmosphere at 80° C. for 14 hours. After the reaction, extraction with toluene was performed and the resulting organic layer was dried with magnesium sulfate. This mixture was subjected to gravity filtration and the obtained filtrate was purified by silica gel column chromatography (the developing solvent: hexane) to give 1.0 g of a target white solid (yield: 68%). The synthesis scheme of Step 1 is shown below.

[Chemical Formula 2]

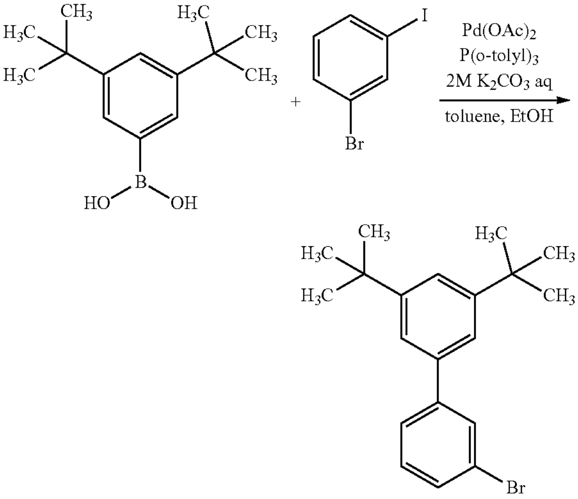

Step 2: Synthesis of 2-(3',5'-di-tert-butylbiphenyl-3-yl)-4,4,5,5-tetramethyl-1,3,2-dioxaborolane First, 1.0 g (2.9 mmol) of 3-bromo-3',5'-di-tert-butylbiphenyl, 0.96 g (3.8 mmol) of bis(pinacolato)diboron, 0.94 g (9.6 mmol) of potassium acetate, and 30 mL of 1,4-dioxane were put into a three-neck flask and stirred under reduced pressure to be degassed. Furthermore, 0.12 g (0.30 mmol) of 2-dicyclohexylphosphino-2',6'-dimethoxybiphenyl and 0.12 g (0.15 mmol) of [1,1'-bis(diphenylphosphino)ferrocene] palladium(II) dichloride dichloromethane adduct were added to this mixture, and reacted under a nitrogen atmosphere at 110° C. for 24 hours. After the reaction, extraction with toluene was performed and the resulting organic layer was dried with magnesium sulfate. This mixture was subjected to gravity filtration and the obtained filtrate was purified by silica gel column chromatography (the developing solvent: toluene) to give 0.89 g of a target yellow oil (yield: 78%). The synthesis scheme of Step 2 is shown below.

[Chemical Formula 22]

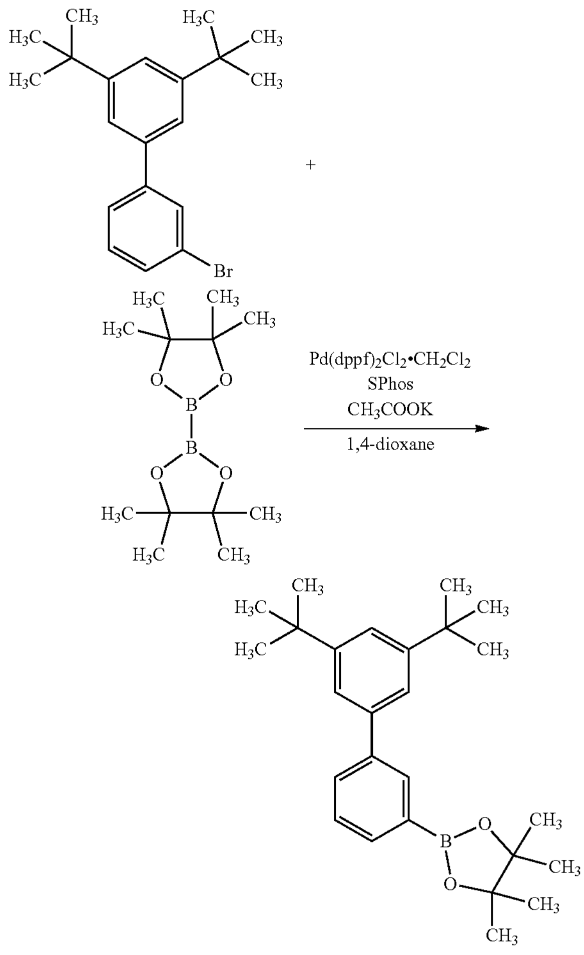

Step 3: Synthesis of mmtBumBP-dmmtBuPTzn

Into a three-neck flask were put 0.8 g (1.6 mmol) of 4,6-bis(3,5-di-tert-butyl-phenyl)-2-chloro-1,3,5-triazine, 0.89 g (2.3 mmol) of 2-(3',5'-di-tert-butylbiphenyl-3-yl)-4,4,5,5-tetramethyl-1,3,2-dioxaborolane, 0.68 g (3.2 mmol) of tripotassium phosphate, 3 mL of water, 8 mL of toluene, and 3 mL of 1,4-dioxane, and the mixture was degassed by being stirred under reduced pressure. To this mixture were added 3.5 mg (0.016 mmol) of palladium(II) acetate and 10 mg (0.032 mmol) of tris(2-methylphenyl)phosphine, and the mixture was heated and refluxed under a nitrogen atmosphere for 12 hours. After the reaction, extraction was performed with ethyl acetate and the obtained organic layer was dried with magnesium sulfate. This mixture was subjected to gravity filtration. The resulting filtrate was concentrated, followed by purification by silica gel column chromatography (the developing solvent, ethyl acetate: hexane=1:20) to give a solid. The solid was purified by silica gel column chromatography (the developing solvent, chloroform:hexane=5:1 changed to 1:0). The obtained solid was recrystallized with hexane to give 0.88 g of a target white solid in a yield of 76%. The synthesis scheme of Step 3 is shown below.

[Chemical Formula 23]

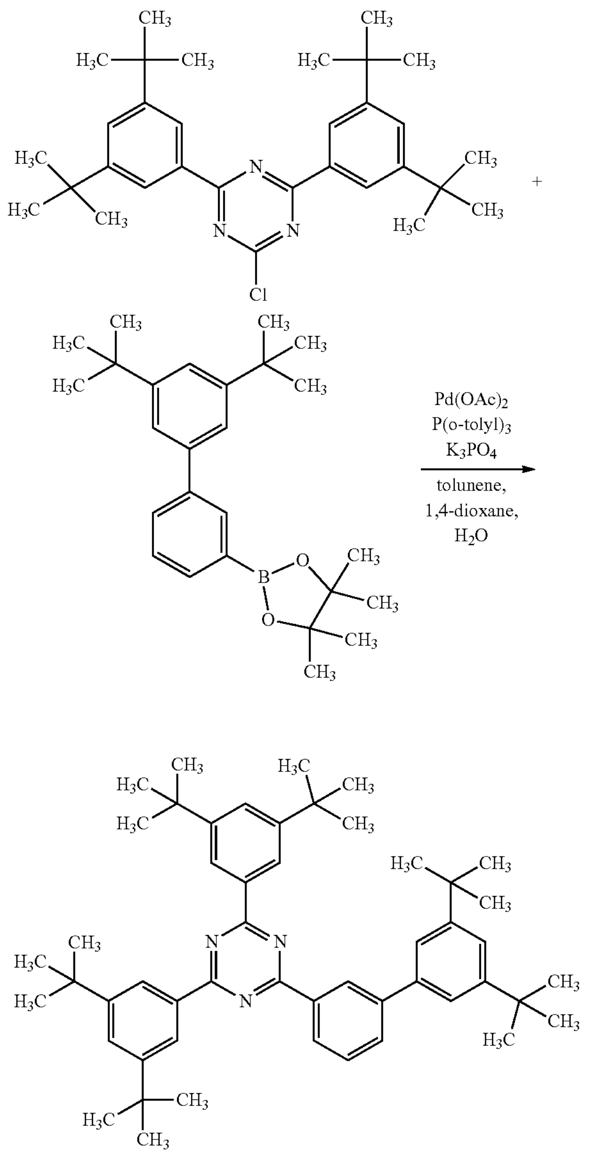

(200)

By a train sublimation method, 0.87 g of the obtained white solid was purified by sublimation at 230° C. under a pressure of 5.8 Pa while an argon gas was made to flow. After the sublimation purification, 0.82 g of a target white solid was obtained at a collection rate of 95%.

Analysis results by nuclear magnetic resonance spectroscopy ($^1$H-NMR) of the white solid obtained in Step 3 described above are shown below. The results show that mmtBumBP-dmmtBuPTzn represented by Structural Formula (200) shown above was obtained by the above synthesis method.

$H^1$ NMR ($CDCl_3$, 300 MHz): δ=1.42-1.49 (m, 54H), 7.50 (s, 1H), 7.61-7.70 (m, 5H), 7.87 (d, 1H), 8.68-8.69 (m, 4H), 8.78 (d, 1H), 9.06 (s, 1H).

Similarly, the organic compounds represented by Structural Formulae (201) to (204) below were synthesized.

[Chemical Formula 24]

(201)

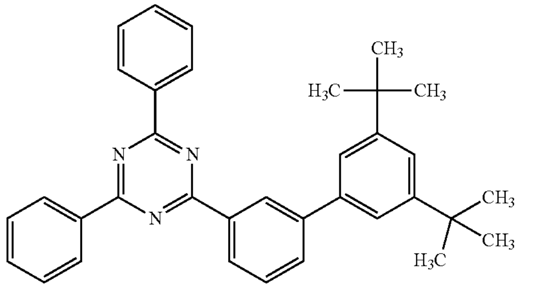

(202)

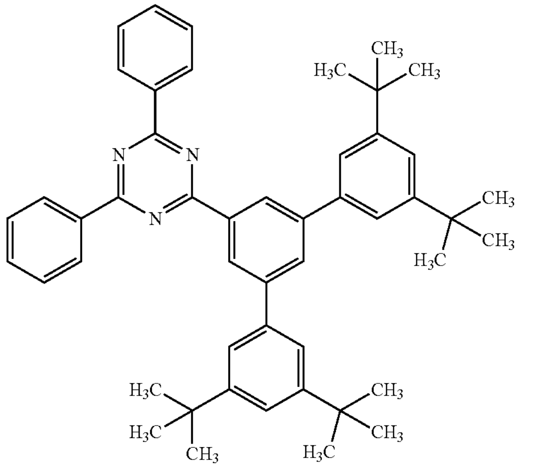

(203)

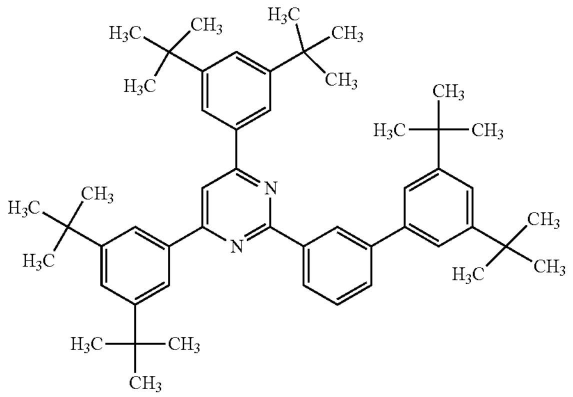

(204)

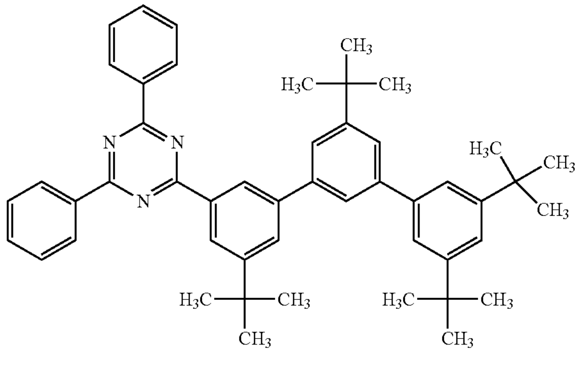

The results of analysis by nuclear magnetic resonance spectroscopy ($^{1}$H-NMR) of each organic compound are shown below.

Structural Formula (201): 2-{(3',5'-di-tert-butyl)-1,1'-biphenyl-3-yl}-4,6-diphenyl-1,3,5-triazine (Abbreviation: mmtBumBPTzn)

$H^1$ NMR (CDCl3, 300 MHz): δ=1.44 (s, 18H), 7.51-7.68 (m, 10H), 7.83 (d, 1H), 8.73-8.81 (m, 5H), 9.01 (s, 1H).

Structural Formula (202) 2-(3,3",5,5"-tetra-tert-butyl-1,1':3',1"-phenyl-5'-yl)-4,6-diphenyl-1,3,5-triazine (Abbreviation: mmtBumTPTzn)

$H^1$ NMR (CDCl3, 300 MHz): δ=1.44 (s, 36H), 7.54-7.62 (m, 12H), 7.99 (t, 1H), 8.79 (d, 4H), 8.92 (d, 2H).

Structural Formula (203): 2-{(3',5'-di-tert-butyl)-1,1'-biphenyl-3-yl}-4,6-bis(3,5-di-tert-butylphenyl)-1,3-pyrimidine (Abbreviation: mmtBumBP-dmmtBuPPm)

$^{1}$H NMR (CDCl3, 300 MHz): δ=1.39-1.45 (m, 54H), 7.47 (t, 1H), 7.59-7.65 (m, 5H), 7.76 (d, 1H), 7.95 (s, 1H), 8.06 (d, 4H), 8.73 (d, 1H, 8.99 (s, 1H)).

Structural Formula (204) 2-(3,3",5',5"-tetra-tert-butyl-1,1':3',1"-terphenyl-5-yl)-4,6-diphenyl-1,3,5-triazine (Abbreviation: mmtBumTPTzn-02)

$H^1$ NMR (CDCl3, 300 MHz): δ=1.41 (s, 18H), 1.49 (s, 9H), 1.52 (s, 9H), 7.49 (s, 3H), 7.58-7.63 (m, 7H), 7.69-7.70 (m, 2H), 7.88 (t, 1H), 8.77-8.83 (m, 6H).

The organic compounds described above each have an ordinary refractive index higher than or equal to 1.50 and lower than or equal to 1.75 in a blue light emission region (greater than or equal to 455 nm and less than or equal to 465 nm) or an ordinary refractive index higher than or equal to 1.45 and lower than or equal to 1.70 with respect to light of 633 nm, which is usually used for measurement of refractive indices.

REFERENCE NUMERALS

100: substrate, 101: anode, 102: cathode, 103: EL layer, 111: hole-injection layer, 112: hole-transport layer, 113: light-emitting layer, 113-1: light-emitting layer, 113-2: light-emitting layer, 114: electron-transport layer, 115: electron-injection layer, 116: charge-generation layer, 117: p-type layer, 118: electron-relay layer, 119: electron-injection buffer layer, 200: insulator, 201: anode, 201B: anode, 201G: anode, 201R: anode, 201W: anode, 202: EL layer, 203: cathode, 204: protective layer, 205B: structure having function of scattering light, 205G: color conversion layer, 205R: color conversion layer, 205W: color conversion layer, 205: color conversion layer, 206: black matrix, 207: light-emitting device, 207B: light-emitting device, 207G: light-emitting device, 207R: light-emitting device, 207W: light-emitting device, 208: pixel, 208B: pixel, 208G: pixel, 208R: pixel, 208W: pixel, 209: optical distance, 210G: means imparting directivity, 210R: means imparting directivity, 215B: color filter, 225R: color filter, 225G: color filter, 225B: color filter, 501: anode, 502: cathode, 511: first light-emitting unit, 512: second light-emitting unit, 513: charge-generation layer, 601: driver circuit portion (source line driver circuit), 602: pixel portion, 603: driver circuit portion (gate line driver circuit), 604: sealing substrate, 605: sealing material, 607: space, 608: wiring, 609: FPC (flexible printed circuit), 610: element substrate, 611: switching FET, 612: current controlling FET, 613: anode, 614: insulator, 616: EL layer, 617: cathode, 618: light-emitting device, 623: FET, 1001: substrate, 1002: base insulating film, 1003: gate insulating film, 1006: gate electrode, 1007: gate electrode, 1008: gate electrode, 1020: first interlayer insulating film, 1021: second interlayer insulating film, 1022: electrode, 1024R: anode, 1024G: anode, 1024B: anode, 1025: partition, 1028: EL layer, 1029: cathode, 1030: space, 1031: sealing substrate, 1032: sealing material, 1033: transparent base material, 1034R: red color conversion layer, 1034G: green color conversion layer, 1035: black matrix, 1036: overcoat layer, 1037: third interlayer insulating film, 1040: pixel portion, 1041: driver circuit portion, 1042: peripheral portion, 2100: robot, 2110: arithmetic device, 2101: illuminance sensor, 2102: microphone, 2103: upper camera, 2104: speaker, 2105: display, 2106: lower camera, 2107: obstacle sensor, 2108: moving mechanism, 5000: housing, 5001: display portion, 5002: display portion, 5003: speaker, 5004: LED lamp, 5006: connection terminal, 5007: sensor, 5008: microphone, 5012: support, 5013: earphone, 5100: cleaning robot, 5101: display, 5102: camera, 5103: brush, 5104: operation button, 5150: portable information terminal, 5151: housing, 5152: display region, 5153: bend portion, 5120: dust, 5200: display region, 5201: display region, 5202: display region, 5203: display region, 7101: housing, 7103: display portion, 7105: stand, 7107: display portion, 7109: operation key, 7110: remote controller, 7201: main body, 7202: housing, 7203: display portion, 7204: keyboard, 7205: external connection port, 7206: pointing device, 7210: second display portion, 7401: housing, 7402: display portion, 7403: operation button, 7404: external connection port, 7405: speaker, 7406: microphone, 9310: portable information terminal, 9311: display panel, 9313: hinge, 9315: housing

The invention claimed is:

1. A light-emitting apparatus comprising:

a first light-emitting device; and a first color conversion layer, wherein the first light-emitting device comprises an anode, a cathode, and an EL layer positioned between the anode and the cathode, wherein the EL layer comprises a layer comprising a material with an ordinary refractive index higher than or equal to 1.50 and lower than 1.75 with respect to light with a wavelength longer than or equal to 455 nm and shorter than or equal to 465 nm, wherein the first color conversion layer comprises a first substance that absorbs light and emits light, wherein an ordinary refractive index of the first color conversion layer with respect to light with a wavelength longer than or equal to 455 nm and shorter than or equal to 465 nm is higher than or equal to 1.40 and lower than or equal to 2.10, and wherein the first color conversion layer is positioned on an optical path of the light emitted from the first light-emitting device to an outside of the light-emitting apparatus.

2. A light-emitting apparatus comprising:

a first light-emitting device; and a first color conversion layer, wherein the first light-emitting device comprises an anode, a cathode, and an EL layer positioned between the anode and the cathode, wherein the EL layer comprises a light-emitting layer and a hole-transport region, wherein the hole-transport region is positioned between the light-emitting layer and the anode, wherein the hole-transport region comprises a layer comprising a hole-transport organic compound with an ordinary refractive index higher than or equal to 1.50 and lower than or equal to 1.75 with respect to light with a wavelength longer than or equal to 455 nm and shorter than or equal to 465 nm, wherein the first color conversion layer comprises a first substance that absorbs light and emits light, wherein an ordinary refractive index of the first color conversion layer with respect to light with a wavelength longer than or equal to 455 nm and shorter than or equal to 465 nm is higher than or equal to 1.40 and lower than or equal to 2.10, and wherein the first color conversion layer is positioned on an optical path of the light emitted from the first light-emitting device to an outside of the light-emitting apparatus.

3. A light-emitting apparatus comprising:

a first light-emitting device; and a first color conversion layer, wherein the first light-emitting device comprises an anode, a cathode, and an EL layer positioned between the anode and the cathode, wherein the EL layer comprises a light-emitting layer and an electron-transport region, wherein the electron-transport region is positioned between the light-emitting layer and the cathode, wherein the electron-transport region comprises a layer comprising an electron-transport organic compound with an ordinary refractive index higher than or equal to 1.50 and lower than or equal to 1.75 with respect to light with a wavelength longer than or equal to 455 nm and shorter than or equal to 465 nm, wherein the first color conversion layer comprises a first substance that absorbs light and emits light, wherein an ordinary refractive index of the first color conversion layer with respect to light with a wavelength longer than or equal to 455 nm and shorter than or equal to 465 nm is higher than or equal to 1.40 and lower than or equal to 2.10, and wherein the first color conversion layer is positioned on an optical path of the light emitted from the first light-emitting device to an outside of the light-emitting apparatus.

4. The light-emitting apparatus according to claim 3, wherein the EL layer further comprises a hole-transport region, wherein the hole-transport region is positioned between the anode and the light-emitting layer, and wherein the hole-transport region comprises a layer comprising a hole-transport organic compound with an ordinary refractive index higher than or equal to 1.50 and lower than or equal to 1.75 with respect to light with a wavelength longer than or equal to 455 nm and shorter than or equal to 465 nm.

5. The light-emitting apparatus according to claim 1, wherein the ordinary refractive index of the first color conversion layer with respect to light with a wavelength longer than or equal to 455 nm and shorter than or equal to 465 nm is higher than or equal to 1.80 and lower than or equal to 2.00.

6. The light-emitting apparatus according to claim 1, wherein the first color conversion layer further comprises a resin, and wherein an ordinary refractive index of the resin with respect to light with a wavelength longer than or equal to 455 nm and shorter than or equal to 465 nm is higher than or equal to 1.40 and lower than or equal to 2.10.

7. The light-emitting apparatus according to claim 2, wherein the first color conversion layer further comprises a resin, and wherein an ordinary refractive index of the resin with respect to light with a wavelength longer than or equal to 455 nm and shorter than or equal to 465 nm is higher than or equal to 1.40 and lower than or equal to 2.10.

8. The light-emitting apparatus according to claim 3, wherein the first color conversion layer further comprises a resin, and wherein an ordinary refractive index of the resin with respect to light with a wavelength longer than or equal to 455 nm and shorter than or equal to 465 nm is higher than or equal to 1.40 and lower than or equal to 2.10.

9. The light-emitting apparatus according to claim 4, wherein the first color conversion layer further comprises a resin, and wherein an ordinary refractive index of the resin with respect to light with a wavelength longer than or equal to 455 nm and shorter than or equal to 465 nm is higher than or equal to 1.40 and lower than or equal to 2.10.

10. The light-emitting apparatus according to claim 6, wherein the ordinary refractive index of the resin with respect to light with a wavelength longer than or equal to 455 nm and shorter than or equal to 465 nm is higher than or equal to 1.80 and lower than or equal to 2.00.

11. The light-emitting apparatus according to claim 1, wherein a first layer comprising an organic compound is included between the first light-emitting device and the first color conversion layer, wherein an ordinary refractive index of the first layer with respect to light with a wavelength longer than or equal to 455 nm and shorter than or equal to 465 nm is higher than or equal to 1.40 and lower than or equal to 2.10, and wherein the first layer and the first color conversion layer are positioned on an optical path of the light emitted from the first light-emitting device to an outside of the light-emitting apparatus.

12. The light-emitting apparatus according to claim 2, wherein a first layer comprising an organic compound is included between the first light-emitting device and the first color conversion layer, wherein an ordinary refractive index of the first layer with respect to light with a wavelength longer than or equal to 455 nm and shorter than or equal to 465 nm is higher than or equal to 1.40 and lower than or equal to 2.10, and wherein the first layer and the first color conversion layer are positioned on an optical path of the light emitted from the first light-emitting device to an outside of the light-emitting apparatus.

13. The light-emitting apparatus according to claim 3, wherein a first layer comprising an organic compound is included between the first light-emitting device and the first color conversion layer, wherein an ordinary refractive index of the first layer with respect to light with a wavelength longer than or equal to 455 nm and shorter than or equal to 465 nm is higher than or equal to 1.40 and lower than or equal to 2.10, and wherein the first layer and the first color conversion layer are positioned on an optical path of the light emitted from the first light-emitting device to an outside of the light-emitting apparatus.

14. The light-emitting apparatus according to claim 4, wherein a first layer comprising an organic compound is included between the first light-emitting device and the first color conversion layer, wherein an ordinary refractive index of the first layer with respect to light with a wavelength longer than or equal to 455 nm and shorter than or equal to 465 nm is higher than or equal to 1.40 and lower than or equal to 2.10, and wherein the first layer and the first color conversion layer are positioned on an optical path of the light emitted from the first light-emitting device to an outside of the light-emitting apparatus.

15. The light-emitting apparatus according to claim 11, wherein the ordinary refractive index of the first layer with respect to light with a wavelength longer than or equal to 455 nm and shorter than or equal to 465 nm is higher than or equal to 1.80 and lower than or equal to 2.00.

16. The light-emitting apparatus according to claim 2, wherein the hole-transport organic compound with the ordinary refractive index higher than or equal to 1.50 and lower than or equal to 1.75 with respect to light with a wavelength longer than or equal to 455 nm and shorter than or equal to 465 nm is a monoamine compound comprising a first aromatic ring, a second aromatic ring, and a third aromatic ring, the first aromatic ring, the second aromatic ring, and the third aromatic ring are bonded to a nitrogen atom of the monoamine compound, and carbon atoms forming a bond by sp3 hybrid orbitals account for a proportion greater than or equal to 23% and less than or equal to 55% of total carbon atoms in a molecule.

17. The light-emitting apparatus according to claim 3, wherein the electron-transport organic compound comprises:
at least one six-membered heteroaromatic ring with 1 to 3 nitrogen atoms;
a plurality of aromatic hydrocarbon rings each of which has 6 to 14 carbon atoms forming a ring; and
a plurality of hydrocarbon groups forming a bond by sp3 hybrid orbitals, and
wherein at least two of the plurality of aromatic hydrocarbon rings are benzene rings.

18. The light-emitting apparatus according to claim 3, wherein, in the electron-transport region, the layer comprising the electron-transport organic compound with the ordinary refractive index higher than or equal to 1.50 and lower than or equal to 1.75 further comprises a fluoride of an alkali metal or a fluoride of an alkaline earth metal.

19. The light-emitting apparatus according to claim 4, wherein the hole-transport organic compound with the ordinary refractive index higher than or equal to 1.50 and lower than or equal to 1.75 with respect to light with a wavelength longer than or equal to 455 nm and shorter than or equal to 465 nm is a monoamine compound comprising a first aromatic ring, a second aromatic ring, and a third aromatic ring, the first aromatic ring, the second aromatic ring, and the third aromatic ring are bonded to a nitrogen atom of the monoamine compound, and carbon atoms forming a bond by sp3 hybrid orbitals account for a proportion greater than or equal to 23% and less than or equal to 55% of total carbon atoms in a molecule, wherein the electron-transport organic compound with the ordinary refractive index higher than or equal to 1.50 and lower than or equal to 1.75 with respect to light with a wavelength longer than or equal to 455 nm and shorter than or equal to 465 nm comprises:

at least one six-membered heteroaromatic ring with 1 to 3 nitrogen atoms;

a plurality of aromatic hydrocarbon rings each of which has 6 to 14 carbon atoms forming a ring; and a plurality of hydrocarbon groups forming a bond by sp3 hybrid orbitals, and wherein at least two of the plurality of aromatic hydrocarbon rings are benzene rings.

20. The light-emitting apparatus according to claim 17, wherein carbon atoms forming the bond by the sp3 hybrid orbitals account for a proportion greater than or equal to 10% and lower than or equal to 60% of carbon atoms in a molecule of the electron-transport organic compound.

21. The light-emitting apparatus according to claim 1, wherein the first substance is a quantum dot.

22. The light-emitting apparatus according to claim 1, wherein the first light-emitting device comprises a microcavity structure.

23. The light-emitting apparatus according to claim 1, further comprising a second light-emitting device, a third light-emitting device, and a second color conversion layer, wherein the second light-emitting device and the third light-emitting device each comprise a structure that is the same as a structure of the first light-emitting device, wherein the second color conversion layer comprises a second substance that absorbs light and emits light, wherein a peak wavelength of an emission spectrum of the first substance is different from a peak wavelength of an emission spectrum of the second substance, and wherein the second color conversion layer is positioned on an optical path of the light emitted from the second light-emitting device to the outside of the light-emitting apparatus.

24. The light-emitting apparatus according to claim 23, wherein the second substance is a quantum dot.

25. The light-emitting apparatus according to claim 24, wherein the peak wavelength of the emission spectrum of the first substance is higher than or equal to 500 nm and lower than or equal to 600 nm, and wherein the peak wavelength of the emission spectrum of the second substance is higher than or equal to 600 nm and lower than or equal to 750 nm.

26. The light-emitting apparatus according to claim 23, further comprising a fourth light-emitting device and a third color conversion layer, wherein the fourth light-emitting device comprises a structure that is the same as a structure of the first light-emitting device, wherein the third color conversion layer comprises a third substance that absorbs light and emits light, wherein a peak wavelength of an emission spectrum of the third substance is higher than or equal to 560 nm and lower than or equal to 610 nm, and wherein the third color conversion layer is positioned on an optical path of the light emitted from the fourth light-emitting device to the outside of the light-emitting apparatus.

27. The light-emitting apparatus according to claim 26, wherein the third substance comprises a rare earth element.

28. The light-emitting apparatus according to claim 27, wherein the rare earth element is at least one of europium, cerium, and yttrium.

29. The light-emitting apparatus according to claim 26, wherein the third substance is a quantum dot.

30. The light-emitting apparatus according to claim 26, wherein the emission spectrum obtained from the third color conversion layer comprises two peaks.

31. The light-emitting apparatus according to claim 26, wherein light emission obtained from the third color conversion layer is white light emission.

32. The light-emitting apparatus according to claim 1, wherein the EL layer comprises a plurality of light-emitting layers.

33. The light-emitting apparatus according to claim 32, further comprising a charge-generation layer between the plurality of light-emitting layers.

34. The light-emitting apparatus according to claim 1, wherein the first light-emitting device exhibits blue light emission.

35. The light-emitting apparatus according to claim 1, further comprising a color filter, wherein the first color conversion layer is positioned between the first light-emitting device and the color filter.

36. An electronic device comprising the light-emitting apparatus according to claim 1, and a sensor, an operation button, a speaker, or a microphone.

37. A light-emitting apparatus comprising the light-emitting apparatus according to claim 1, and a transistor or a substrate.

38. A lighting device comprising the light-emitting apparatus according to claim 1, and a housing.

* * * * *